United States Patent
Yang et al.

(10) Patent No.: US 12,218,691 B2
(45) Date of Patent: Feb. 4, 2025

(54) POLARIZATION ADJUSTED CHANNEL CODING DESIGN FOR COMPLEXITY REDUCTION

(71) Applicant: QUALCOMM Incorporated, San Diego, CA (US)

(72) Inventors: Wei Yang, San Diego, CA (US); Jing Jiang, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/736,675

(22) Filed: May 4, 2022

(65) Prior Publication Data
US 2023/0361788 A1 Nov. 9, 2023

(51) Int. Cl.
| | | |
|---|---|---|
| *H03M 13/35* | (2006.01) | |
| *H03M 13/13* | (2006.01) | |
| *H03M 13/15* | (2006.01) | |
| *H03M 13/37* | (2006.01) | |

(52) U.S. Cl.
CPC ....... *H03M 13/353* (2013.01); *H03M 13/136* (2013.01); *H03M 13/1515* (2013.01); *H03M 13/3761* (2013.01)

(58) Field of Classification Search
CPC ........... H03M 13/3761; H03M 13/136; H03M 13/1515; H03M 13/353
See application file for complete search history.

(56) References Cited

U.S. PATENT DOCUMENTS

| | | | |
|---|---|---|---|
| 9,246,510 B2* | 1/2016 | Mansour | H04L 27/364 |
| 11,057,053 B2* | 7/2021 | Gross | H03M 13/13 |
| 11,581,906 B1* | 2/2023 | Berman | G06F 11/1076 |

(Continued)

FOREIGN PATENT DOCUMENTS

WO    WO-2019024815 A1    2/2019

OTHER PUBLICATIONS

F. Peng, J. Xu, M. Chen and L. Tian, "Parallel Concatenation Codes with Polar Component Codes for Incremental Redundancy Hybrid Automatic Repeat reQuest Functionality," 2020 International Wireless Communications and Mobile Computing (IWCMC), Limassol, Cyprus, 2020, pp. 1065-1070.*

(Continued)

*Primary Examiner* — Steve N Nguyen
(74) *Attorney, Agent, or Firm* — Holland & Hart LLP

(57) ABSTRACT

Methods, systems, and devices for wireless communications are described. A transmitting device may allocate a set of information bits into multiple subsets of bits corresponding to channel instances of a channel. The transmitting device may encode a first subset of bits according to a first channel coding scheme for a first channel instance and a second subset of bits according to a second channel coding scheme for a second channel instance. The transmitting device may input encoded subsets of bits to a polarizing transform, which may output a set of encoded polarized bits that are transmitted to a receiving device. Upon reception of the encoded polarized bits, the receiving device may apply a depolarizing transform to obtain multiple subsets of bits corresponding to channel instances of the channel, and may decode each subset of bits according to a respective channel coding scheme.

60 Claims, 18 Drawing Sheets

(56) References Cited

U.S. PATENT DOCUMENTS

| | | | | |
|---|---|---|---|---|
| 2012/0084617 A1* | 4/2012 | Djordjevic | H03M 13/116 | 714/752 |
| 2013/0324143 A1* | 12/2013 | Yokomakura | H04L 1/1861 | 455/452.1 |
| 2014/0129896 A1* | 5/2014 | Parthasarathy | H03M 13/29 | 714/755 |
| 2014/0208183 A1* | 7/2014 | Mahdavifar | H03M 13/27 | 714/755 |
| 2015/0091742 A1* | 4/2015 | Ionita | H03M 5/18 | 341/57 |
| 2016/0013810 A1* | 1/2016 | Gross | H03M 13/09 | 714/776 |
| 2016/0204811 A1* | 7/2016 | Goela | H03M 13/1191 | 375/260 |
| 2017/0047947 A1* | 2/2017 | Hong | H03M 13/2906 | |
| 2017/0338996 A1* | 11/2017 | Sankar | H04L 1/0041 | |
| 2018/0048334 A1* | 2/2018 | Sarkis | H03M 13/611 | |
| 2018/0076923 A1* | 3/2018 | Wu | H04L 1/0013 | |
| 2018/0097580 A1* | 4/2018 | Zhang | H04L 1/0041 | |
| 2018/0145702 A1* | 5/2018 | Feygin | H03M 13/00 | |
| 2018/0198560 A1* | 7/2018 | Jiang | H04L 1/0064 | |
| 2018/0351581 A1* | 12/2018 | Presman | H03M 13/3746 | |
| 2019/0150125 A1* | 5/2019 | Bagheri | H04L 5/0044 | 370/336 |
| 2019/0181979 A1* | 6/2019 | Wang | H04L 1/0068 | |
| 2019/0190655 A1* | 6/2019 | Pan | H03M 13/356 | |
| 2019/0372599 A1* | 12/2019 | Chen | H03M 13/151 | |
| 2019/0372608 A1* | 12/2019 | Wei | H03M 13/6356 | |
| 2019/0379404 A1* | 12/2019 | Blankenship | H03M 13/2792 | |
| 2020/0067529 A1* | 2/2020 | Hui | H04L 1/1819 | |
| 2020/0358555 A1* | 11/2020 | Chen | H04L 1/0042 | |
| 2020/0366317 A1* | 11/2020 | Myung | H03M 13/1125 | |

OTHER PUBLICATIONS

M. Chiani and E. Paolini, "A Note on Channel Polarization and Mutual Information Transformation Charts of Polar Codes," 2019 AEIT International Annual Conference (AEIT), Florence, Italy, 2019.*

Q. Xie, Z. Wang and Z. Yang, "Polar Decomposition of Mutual Information Over Complex-Valued Channels," in IEEE Transactions on Information Theory, vol. 60, No. 6, pp. 3163-3171, Jun. 2014.*

International Search Report and Written Opinion—PCT/US2023/017363—ISA/EPO—Jul. 14, 2023.

Mahdavifar H., et al., "On the Construction and Decoding of Concatenated Polar Codes", IEEE International Symposium on Information Theory, Jul. 7, 2013, XP032497043, pp. 952-956, Sections II-IV.

Wang Y., et al., "Concatenations of Polar Codes With Outer BCH Codes and Convolutional Codes", 2014 52nd Annual Allerton Conference on Communication, Control, and Computing (Allerton), IEEE, Sep. 30, 2014, XP032731136, pp. 813-819, Sections II-V.

* cited by examiner

POLARIZATION ADJUSTED CHANNEL CODING DESIGN FOR COMPLEXITY REDUCTION

FIELD OF TECHNOLOGY

The following relates to wireless communications, including polarization adjusted channel coding design for complexity reduction.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

A transmitting device (e.g., a network entity, a UE) may encode a set of information bits using an encoding algorithm. Some coding techniques use reliability metrics during encoding and decoding such that information bits may be loaded on channel instances (of the encoder or decoder) that are associated with favorable (e.g., high) reliability metrics. Such techniques, however, may require a large amount of storage and/or may be computationally complex or resource heavy. For example, as throughput increases, computational complexity, and associated computational capability requirements, of some decoding techniques may also increase.

SUMMARY

The described techniques relate to improved methods, systems, devices, and apparatuses that support polarization adjusted channel coding design for complexity reduction. For example, the described techniques provide for a transmitting device to allocate a set of information bits into multiple subsets of bits corresponding to channel instances (e.g., polarization levels) of a channel. Each subset of bits may be encoded according to a respective channel coding scheme, and the encoded subsets of bits may be input to a polarizing transform. The encoded polarized bits (e.g., the bits output from the polarizing transform) may be concatenated, modulated, and transmitted to a receiving device. Upon reception of the encoded polarized bits, after demodulation, the receiving device may apply a depolarizing transform to obtain multiple subsets of bits corresponding to channel instances of the channel. The receiving device may decode each subset of bits according to a respective channel decoding scheme, and may concatenate and process the decoded subsets of bits to obtain a set of bits corresponding to the set of information bits.

A method for wireless communications at a first wireless device is described. The method may include partitioning a set of information bits into a set of multiple subsets of bits corresponding to a set of multiple polarization levels, encoding a first subset of bits of the set of multiple subsets for a first polarization level of the set of multiple polarization levels according to a first channel coding scheme, encoding a second subset of bits of the set of multiple subsets for a second polarization level of the set of multiple polarization levels according to a second channel coding scheme, performing a polarizing transform using the encoded first subset of bits for the first polarization level and the encoded second subset of bits for the second polarization level to obtain a set of output bits corresponding to the set of information bits, and transmitting the set of output bits to a second wireless device.

An apparatus for wireless communications at a first wireless device is described. The apparatus may include memory, a transmitter, and a communications manager, communicatively coupled to the memory and the transmitter. The communications manager may configured to partition a set of information bits into a set of multiple subsets of bits corresponding to a set of multiple polarization levels, encode a first subset of bits of the set of multiple subsets for a first polarization level of the set of multiple polarization levels according to a first channel coding scheme, encode a second subset of bits of the set of multiple subsets for a second polarization level of the set of multiple polarization levels according to a second channel coding scheme, perform a polarizing transform using the encoded first subset of bits for the first polarization level and the encoded second subset of bits for the second polarization level to obtain a set of output bits corresponding to the set of information bits, and transmit the set of output bits to a second wireless device.

Another apparatus for wireless communications at a first wireless device is described. The apparatus may include means for partitioning a set of information bits into a set of multiple subsets of bits corresponding to a set of multiple polarization levels, means for encoding a first subset of bits of the set of multiple subsets for a first polarization level of the set of multiple polarization levels according to a first channel coding scheme, means for encoding a second subset of bits of the set of multiple subsets for a second polarization level of the set of multiple polarization levels according to a second channel coding scheme, means for performing a polarizing transform using the encoded first subset of bits for the first polarization level and the encoded second subset of bits for the second polarization level to obtain a set of output bits corresponding to the set of information bits, and means for transmitting the set of output bits to a second wireless device.

A non-transitory computer-readable medium storing code for wireless communications at a first wireless device is described. The code may include instructions executable by a processor to partition a set of information bits into a set of multiple subsets of bits corresponding to a set of multiple polarization levels, encode a first subset of bits of the set of multiple subsets for a first polarization level of the set of multiple polarization levels according to a first channel coding scheme, encode a second subset of bits of the set of multiple subsets for a second polarization level of the set of multiple polarization levels according to a second channel coding scheme, perform a polarizing transform using the encoded first subset of bits for the first polarization level and the encoded second subset of bits for the second polarization level to obtain a set of output bits corresponding to the set of information bits, and transmit the set of output bits to a second wireless device.

In some examples of the method, apparatuses, and non-transitory computer-readable medium described herein, jointly encoding a third subset of bits of the set of multiple subsets with the second subset of bits for a third polarization level of the set of multiple polarization levels according to the second channel coding scheme, where the polarizing transform may be performed using the encoded first subset of bits for the first polarization level, the encoded second subset of bits for the second polarization level, and the encoded third subset of bits for the third polarization level.

In some examples of the method, apparatuses, and non-transitory computer-readable medium described herein, partitioning the set of information bits may include operations, features, means, or instructions for partitioning the set of information bits into the set of multiple subsets of bits based on a quantity of coding levels associated with one or more encoding procedures for the set of information bits, where a quantity of the set of multiple subsets of bits may be equal to the quantity of coding levels.

In some examples of the method, apparatuses, and non-transitory computer-readable medium described herein, performing the polarizing transform may include operations, features, means, or instructions for performing the polarizing transform for a set of multiple encoded subsets of bits corresponding to a set of multiple channels based on a quantity of polarization levels for the polarizing transform, where a quantity of the set of multiple encoded subsets of bits may be equal to the quantity of polarization levels for the polarizing transform.

Some examples of the method, apparatuses, and non-transitory computer-readable medium described herein may further include operations, features, means, or instructions for determining a first subset of coding levels associated with the first channel coding scheme and determining a second subset of coding levels associated with the second channel coding scheme, where the first subset of bits and the second subset of bits may be encoded based on the first subset of coding levels and the second subset of coding levels.

In some examples of the method, apparatuses, and non-transitory computer-readable medium described herein, the first subset of coding levels may be associated with the first channel coding scheme based on a channel reliability of the first polarization level and the second subset of coding levels may be associated with the second channel coding scheme based on a channel reliability of the second polarization level.

In some examples of the method, apparatuses, and non-transitory computer-readable medium described herein, the first channel coding scheme may be different from the second channel coding scheme.

In some examples of the method, apparatuses, and non-transitory computer-readable medium described herein, the first channel coding scheme includes a low-density parity check (LDPC) coding scheme.

Some examples of the method, apparatuses, and non-transitory computer-readable medium described herein may further include operations, features, means, or instructions for performing a first cyclic redundancy check (CRC) procedure using the first subset of bits and performing a second CRC procedure using the second subset of bits.

Some examples of the method, apparatuses, and non-transitory computer-readable medium described herein may further include operations, features, means, or instructions for selecting a first coding rate for the first channel coding scheme based on an effective coding rate associated with one or more encoding procedures for the set of information bits and a mutual information polarization function and selecting a second coding rate for the second channel coding scheme based on the effective coding rate and the mutual information polarization function, where the first coding rate may be different from the second coding rate.

Some examples of the method, apparatuses, and non-transitory computer-readable medium described herein may further include operations, features, means, or instructions for selecting the first channel coding scheme based on the first coding rate satisfying a threshold and selecting the second channel coding scheme based on the second coding rate failing to satisfy the threshold.

Some examples of the method, apparatuses, and non-transitory computer-readable medium described herein may further include operations, features, means, or instructions for concatenating one or more sets of polarized bits output after performing the polarizing transform, where the set of output bits includes the concatenated one or more sets of polarized bits.

In some examples of the method, apparatuses, and non-transitory computer-readable medium described herein, partitioning the set of information bits may include operations, features, means, or instructions for determining a first quantity of information bits included in the first subset of bits of the set of multiple subsets based on a total quantity of information bits of the set of information bits and an effective coding rate associated with one or more encoding procedures for the set of information bits and determining a second quantity of information bits included in the second subset of bits of the set of multiple subsets based on the total quantity of information bits of the set of information bits and the effective coding rate.

Some examples of the method, apparatuses, and non-transitory computer-readable medium described herein may further include operations, features, means, or instructions for determining a first mutual information polarization function for the first polarization level of the set of multiple polarization levels based on the effective coding rate and a capacity of the first polarization level, where the first quantity of information bits may be determined based on the first mutual information polarization function and determining a second mutual information polarization function for the second polarization level of the set of multiple polarization levels based on the effective coding rate and a capacity of the second polarization level, where the second quantity of information bits may be determined based on the second mutual information polarization function.

In some examples of the method, apparatuses, and non-transitory computer-readable medium described herein, the polarizing transform may be based on a polar code and the method, apparatuses, and non-transitory computer-readable medium may include further operations, features, means, or instructions for determining the second quantity of information bits based on the first quantity of information bits and determining a third quantity of information bits included in a third subset of the set of multiple subsets based on the total quantity of information bits of the set of information bits, the effective coding rate, and the second quantity of information bits.

Some examples of the method, apparatuses, and non-transitory computer-readable medium described herein may further include operations, features, means, or instructions for receiving, from the second wireless device, a signal indicating the total quantity of information bits of the set of information bits and the effective coding rate.

In some examples of the method, apparatuses, and non-transitory computer-readable medium described herein, the first channel coding scheme and the second channel coding scheme include at least one of an LDPC coding scheme, a Reed-Solomon coding scheme, a forward error correction (FEC) coding scheme, a polar coding scheme, a Reed Muller coding scheme, a staircase coding scheme, a product coding scheme, a convolutional coding scheme, a turbo coding scheme, or a combination thereof.

In some examples of the method, apparatuses, and non-transitory computer-readable medium described herein, performing the polarizing transform may include operations, features, means, or instructions for encoding the first subset of bits and the second subset of bits using an inner error correction code.

In some examples of the method, apparatuses, and non-transitory computer-readable medium described herein, encoding the first subset of bits and the second subset of bits using the inner error correction code may include operations, features, means, or instructions for jointly encoding a first bit from the first subset of bits and a second bit from the second subset of bits using a first inner error correction code and jointly encoding a third bit from the first subset of bits and a fourth bit from the second subset of bits using a second inner error correction code.

In some examples of the method, apparatuses, and non-transitory computer-readable medium described herein, the inner error correction code includes a simplex code.

A method for wireless communications at a first wireless device is described. The method may include receiving an encoded set of bits corresponding to a set of information bits, performing a depolarizing transform using the encoded set of bits to obtain a set of multiple subsets of bits corresponding to a set of multiple polarization levels, the set of multiple subsets of bits including at least a first subset of bits and a second subset of bits, decoding the first subset of bits of the set of multiple subsets for a first polarization level of the set of multiple polarization levels according to a first channel decoding scheme, decoding the second subset of bits of the set of multiple subsets for a second polarization level of the set of multiple polarization levels according to a second channel decoding scheme, and processing the decoded first subset of bits and the decoded second subset of bits to obtain a set of decoded bits corresponding to the set of information bits.

An apparatus for wireless communications at a first wireless device is described. The apparatus may include memory, a receiver, and a communications manager, communicatively coupled to the memory and the receiver. The communications manager may configured to receive an encoded set of bits corresponding to a set of information bits, perform a depolarizing transform using the encoded set of bits to obtain a set of multiple subsets of bits corresponding to a set of multiple polarization levels, the set of multiple subsets of bits including at least a first subset of bits and a second subset of bits, decode the first subset of bits of the set of multiple subsets for a first polarization level of the set of multiple polarization levels according to a first channel decoding scheme, decode the second subset of bits of the set of multiple subsets for a second polarization level of the set of multiple polarization levels according to a second channel decoding scheme, and process the decoded first subset of bits and the decoded second subset of bits to obtain a set of decoded bits corresponding to the set of information bits.

Another apparatus for wireless communications at a first wireless device is described. The apparatus may include means for receiving an encoded set of bits corresponding to a set of information bits, means for performing a depolarizing transform using the encoded set of bits to obtain a set of multiple subsets of bits corresponding to a set of multiple polarization levels, the set of multiple subsets of bits including at least a first subset of bits and a second subset of bits, means for decoding the first subset of bits of the set of multiple subsets for a first polarization level of the set of multiple polarization levels according to a first channel decoding scheme, means for decoding the second subset of bits of the set of multiple subsets for a second polarization level of the set of multiple polarization levels according to a second channel decoding scheme, and means for processing the decoded first subset of bits and the decoded second subset of bits to obtain a set of decoded bits corresponding to the set of information bits.

A non-transitory computer-readable medium storing code for wireless communications at a first wireless device is described. The code may include instructions executable by a processor to receive an encoded set of bits corresponding to a set of information bits, perform a depolarizing transform using the encoded set of bits to obtain a set of multiple subsets of bits corresponding to a set of multiple polarization levels, the set of multiple subsets of bits including at least a first subset of bits and a second subset of bits, decode the first subset of bits of the set of multiple subsets for a first polarization level of the set of multiple polarization levels according to a first channel decoding scheme, decode the second subset of bits of the set of multiple subsets for a second polarization level of the set of multiple polarization levels according to a second channel decoding scheme, and process the decoded first subset of bits and the decoded second subset of bits to obtain a set of decoded bits corresponding to the set of information bits.

In some examples of the method, apparatuses, and non-transitory computer-readable medium described herein, jointly decoding a third subset of bits of the set of multiple subsets with the second subset of bits for a third polarization level of the set of multiple polarization levels according to the second channel decoding scheme.

In some examples of the method, apparatuses, and non-transitory computer-readable medium described herein, the set of multiple subsets of bits may be based on a quantity of coding levels associated with one or more decoding procedures for the set of information bits and a quantity of the set of multiple subsets of bits may be equal to the quantity of coding levels.

In some examples of the method, apparatuses, and non-transitory computer-readable medium described herein, performing the depolarizing transform may include operations, features, means, or instructions for performing the depolarizing transform for a set of multiple encoded subsets of bits corresponding to a set of multiple channels based on a quantity of polarization levels for the depolarizing transform, where a quantity of the set of multiple encoded subsets of bits may be equal to the quantity of polarization levels for the depolarizing transform.

Some examples of the method, apparatuses, and non-transitory computer-readable medium described herein may further include operations, features, means, or instructions for determining a first subset of coding levels associated with the first channel decoding scheme and determining a second subset of coding levels associated with the second channel decoding scheme, where the first subset of bits and the second subset of bits may be decoded based on the first subset of coding levels and the second subset of coding levels.

In some examples of the method, apparatuses, and non-transitory computer-readable medium described herein, the first subset of coding levels may be associated with the first channel decoding scheme based on a channel reliability of the first polarization level and the second subset of coding levels may be associated with the second channel decoding scheme based on a channel reliability of the second polarization level.

In some examples of the method, apparatuses, and non-transitory computer-readable medium described herein, the first channel decoding scheme may be different from the second channel decoding scheme. In some examples of the method, apparatuses, and non-transitory computer-readable medium described herein, the first channel decoding scheme includes an LDPC coding scheme.

Some examples of the method, apparatuses, and non-transitory computer-readable medium described herein may further include operations, features, means, or instructions for performing a first CRC procedure using the first subset of bits and performing a second CRC procedure using the second subset of bits.

Some examples of the method, apparatuses, and non-transitory computer-readable medium described herein may further include operations, features, means, or instructions for selecting a first coding rate for the first channel decoding scheme based on an effective coding rate associated with one or more encoding procedures for the set of information bits and a mutual information polarization function and selecting a second coding rate for the second channel decoding scheme based on the effective coding rate and the mutual information polarization function, where the first coding rate may be different from the second coding rate.

Some examples of the method, apparatuses, and non-transitory computer-readable medium described herein may further include operations, features, means, or instructions for selecting the first channel decoding scheme based on the first coding rate satisfying a threshold and selecting the second channel decoding scheme based on the second coding rate failing to satisfy the threshold.

In some examples of the method, apparatuses, and non-transitory computer-readable medium described herein, processing the decoded first subset of bits and the decoded second subset of bits may include operations, features, means, or instructions for concatenating one or more subsets of decoded bits including at least the decoded first subset of bits and the decoded second subset of bits, where the set of decoded bits includes the concatenated one or more subsets of decoded bits.

In some examples of the method, apparatuses, and non-transitory computer-readable medium described herein, performing the depolarizing transform may include operations, features, means, or instructions for determining a first quantity of information bits included in the first subset of bits of the set of multiple subsets based on a total quantity of information bits of the set of information bits and an effective coding rate associated with one or more decoding procedures for the set of information bits and determining a second quantity of information bits included in the second subset of bits of the set of multiple subsets based on the total quantity of information bits of the set of information bits and the effective coding rate.

Some examples of the method, apparatuses, and non-transitory computer-readable medium described herein may further include operations, features, means, or instructions for determining a first mutual information polarization function for the first polarization level of the set of multiple polarization levels based on the effective coding rate and a capacity of the first polarization level, where the first quantity of information bits may be determined based on the first mutual information polarization function and determining a second mutual information polarization function for the second polarization level of the set of multiple polarization levels based on the effective coding rate and a capacity of the second polarization level, where the second quantity of information bits may be determined based on the second mutual information polarization function.

In some examples of the method, apparatuses, and non-transitory computer-readable medium described herein, the depolarizing transform may be based on a polar code and the method, apparatuses, and non-transitory computer-readable medium may include further operations, features, means, or instructions for determining the second quantity of information bits based on the first quantity of information bits and determining a third quantity of information bits included in a third subset of the set of multiple subsets based on the total quantity of information bits of the set of information bits, the effective coding rate, and the second quantity of information bits.

Some examples of the method, apparatuses, and non-transitory computer-readable medium described herein may further include operations, features, means, or instructions for receiving a signal indicating the total quantity of information bits of the set of information bits and the effective coding rate.

In some examples of the method, apparatuses, and non-transitory computer-readable medium described herein, the first channel decoding scheme and the second channel decoding scheme include at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof.

In some examples of the method, apparatuses, and non-transitory computer-readable medium described herein, performing the depolarizing transform may include operations, features, means, or instructions for decoding the first subset of bits and the second subset of bits using an inner error correction code.

In some examples of the method, apparatuses, and non-transitory computer-readable medium described herein, decoding the first subset of bits and the second subset of bits using the inner error correction code may include operations, features, means, or instructions for jointly decoding a first bit from the first subset of bits and a second bit from the second subset of bits using a first inner error correction code and jointly decoding a third bit from the first subset of bits and a fourth bit from the second subset of bits using a second inner error correction code.

In some examples of the method, apparatuses, and non-transitory computer-readable medium described herein, the inner error correction code includes a simplex code.

DETAILED DESCRIPTION

Figure 1:
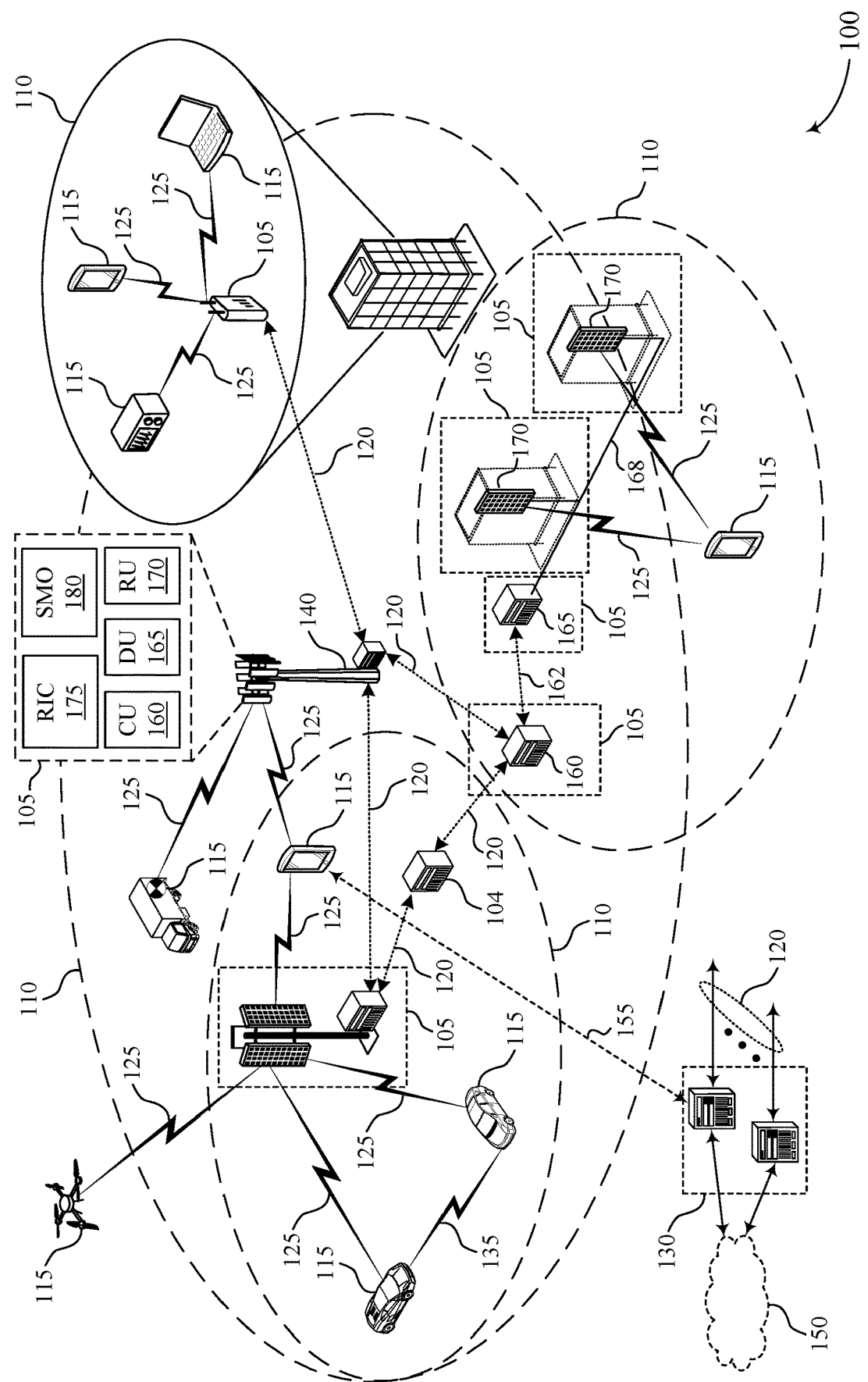
FIGS. 1 and 2 illustrate examples of wireless communication systems that support polarization adjusted channel coding design for complexity reduction in accordance with one or more aspects of the present disclosure.

A transmitting device (e.g., a network entity, a UE) may encode a set of information bits using a channel coding scheme (e.g., an encoding algorithm). For example, error correcting codes may introduce redundant or frozen bits (i.e., non-information bits) into the set of information bits in accordance with a coding rate. A low coding rate may correspond to increased redundancy (e.g., more redundant bits are added), which may improve the likelihood that transmission errors may be detected and corrected (e.g., by a receiving device). A high coding rate may correspond to fewer added redundant bits and a greater overall proportion of information bits.

In some examples, the transmitting device may additionally apply channel polarization to a channel to obtain multiple channel instances (i.e., encoding branches, polarization levels); the transmitting device may allocate one or more of the information bits (e.g., and one or more non-information bits) to each channel instance to be encoded. Each channel instance may be associated with a reliability metric that may relate to, for example, a capacity, a reliability, an information rate, etc. of the channel instance. The reliability metric of a channel instance may indicate the likelihood that a bit allocated to the channel instance (e.g., for transmission) will be successfully received and decoded at a receiver. Thus, to improve the probability of successful decoding, the transmitting device (e.g., an encoder of the transmitting device) may allocate some portions (i.e., subsets) of bits into channel instances associated with favorable (e.g., high) reliability metrics and other portions of bits into channel instances associated with lower reliability metrics.

The transmitting device may modulate and transmit the encoded information bits (and non-information bits) to a receiving device, which may process the received encoded information bits. For instance, after demodulation, a decoder of the receiving device may decode the encoded information bits according to a channel decoding scheme to obtain a decoded set of output bits that includes (i.e., corresponds to) the information bits. However, some examples of decoding schemes and techniques may be associated with relatively high computational complexity. Some receiving devices may be unable to support such decoding schemes, for example, due to a lack of computational power. Additionally, as throughput over a channel increases, some complex decoding schemes may be associated with reduced communications efficiency.

The techniques described herein support a framework for channel coding with reduced complexity without decreasing throughput or performance. For example, a transmitting device (e.g., an encoder of a transmitting device) may partition a set of information bits into multiple subsets of bits corresponding to a set of channel instances of a channel. In some examples, the subsets of bits may include different quantities of bits (e.g., may have unequal payload sizes). The transmitting device may encode each subset of bits separately (e.g., according to a respective channel coding scheme). In some cases, the transmitting device may encode each subset of bits according to a different channel coding scheme, using a different coding rate, or a combination thereof. For example, the transmitting device may apply a first channel coding scheme to a first subset of bits based on a reliability metric of a channel instance associated with the first subset of bits. Alternatively, the transmitting device may apply a second, different channel coding scheme to a second subset of bits based on a reliability metric of a channel instance associated with the second subset of bits.

After encoding, the subsets of bits may be input to a polarizing transform such that the transmitting device applies the polarizing transform across the subsets of bits. The transmitting device may concatenate the subsets of bits output from the polarizing transform to obtain a set of encoded, polarized bits, perform modulation, and transmit the set of encoded polarized bits to a receiving device. Upon reception, the receiving device may demodulate and perform a depolarizing transform on the set of encoded polarized bits to obtain multiple sets of encoded (and depolarized) bits. The receiving device may decode each set of encoded bits separately. That is, the receiving device may decode a first set of encoded bits according to the first channel coding scheme and may decode a second set of encoded bits according to the second channel coding scheme. After decoding, the transmitting device may concatenate the decoded bits to obtain a set of bits corresponding to the set of information bits.

Particular implementations of the subject matter described in this disclosure can be implemented to realize one or more of the following potential advantages. For example, by partitioning the set of information bits into subsets of bits before encoding, a transmitting device may be able to adaptively select the coding schemes and coding rates to use for each subset, which may improve communications reliability and robustness. Additionally, by performing a polarizing transform, the transmitting device may reduce complexity for decoding operations at the receiving device, thereby avoiding increased processing, overhead, and delays associated with high-complexity decoding, particularly in high throughput scenarios. The described techniques thus provide for increased reliability, enhanced performance, and improved efficiency for wireless communications while reducing power consumption, reducing system latency, and decreasing computational complexity, among other benefits, across various and diverse deployment scenarios.

Aspects of the disclosure are initially described in the context of wireless communications systems. Aspects of the disclosure are then discussed with reference to an information bit allocation, encoding and decoding schemes, and a process flow. Aspects of the disclosure are further illustrated by and described with reference to apparatus diagrams, system diagrams, and flowcharts that relate to polarization adjusted channel coding design for complexity reduction.

FIG. 1 illustrates an example of a wireless communications system 100 that supports polarization adjusted channel coding design for complexity reduction in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 175 is flexible and may support different functionalities depending upon which functions (e.g., network layer functions, protocol layer functions, baseband functions, RF functions, and any combinations thereof) are performed at a CU 160, a DU 165, or an RU 175. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

For instance, an access network (AN) or RAN may include communications between access nodes (e.g., an IAB donor), IAB nodes 104, and one or more UEs 115. The IAB donor may facilitate connection between the core network 130 and the AN (e.g., via a wired or wireless connection to the core network 130). That is, an IAB donor may refer to a RAN node with a wired or wireless connection to core network 130. The IAB donor may include a CU 160 and at least one DU 165 (e.g., and RU 170), in which case the CU 160 may communicate with the core network 130 over an interface (e.g., a backhaul link). IAB donor and IAB nodes 104 may communicate over an F1 interface according to a protocol that defines signaling messages (e.g., an F1 AP protocol). Additionally, or alternatively, the CU 160 may communicate with the core network over an interface, which may be an example of a portion of backhaul link, and may communicate with other CUs 160 (e.g., a CU 160 associated with an alternative IAB donor) over an Xn-C interface, which may be an example of a portion of a backhaul link.

An IAB node 104 may refer to a RAN node that provides IAB functionality (e.g., access for UEs 115, wireless self-backhauling capabilities). A DU 165 may act as a distributed scheduling node towards child nodes associated with the IAB node 104, and the IAB-MT may act as a scheduled node towards parent nodes associated with the IAB node 104. That is, an IAB donor may be referred to as a parent node in communication with one or more child nodes (e.g., an IAB donor may relay transmissions for UEs through one or more other IAB nodes 104). Additionally, or alternatively, an IAB node 104 may also be referred to as a parent node or a child node to other IAB nodes 104, depending on the relay chain or configuration of the AN. Therefore, the IAB-MT entity of IAB nodes 104 may provide a Uu interface for a child IAB node 104 to receive signaling from a parent IAB node 104, and the DU interface (e.g., DUs 165) may provide a Uu interface for a parent IAB node 104 to signal to a child IAB node 104 or UE 115.

For example, IAB node 104 may be referred to as a parent node that supports communications for a child IAB node, and referred to as a child IAB node associated with an IAB donor. The IAB donor may include a CU 160 with a wired or wireless connection (e.g., a backhaul communication link 120) to the core network 130 and may act as parent node to IAB nodes 104. For example, the DU 165 of IAB donor may relay transmissions to UEs 115 through IAB nodes 104, and may directly signal transmissions to a UE 115. The CU 160 of IAB donor may signal communication link establishment via an F1 interface to IAB nodes 104, and the IAB nodes 104 may schedule transmissions (e.g., transmissions to the UEs 115 relayed from the IAB donor) through the DUs 165. That is, data may be relayed to and from IAB nodes 104 via signaling over an NR Uu interface to MT of the IAB node 104. Communications with IAB node 104 may be scheduled by a DU 165 of IAB donor and communications with IAB node 104 may be scheduled by DU 165 of IAB node 104.

In the case of the techniques described herein applied in the context of a disaggregated RAN architecture, one or more components of the disaggregated RAN architecture may be configured to support polarization adjusted channel coding design for complexity reduction as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be positioned according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115, uplink transmissions (e.g., return link transmissions) from a UE 115 to a network entity 105, or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications over a particular carrier bandwidth or may be configurable to support communications over one of a set of carrier bandwidths. In some examples, the wireless communications system 100 may include network entities 105 or UEs 115 that support concurrent communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more sub-bands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a receiving device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or PDCP layer may be IP-based. An RLC layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a network entity 105 or a core network 130 supporting radio bearers for user plane data. At the PHY layer, transport channels may be mapped to physical channels.

Components of the wireless communications system 100 including network entities 105 or UEs 115 may implement encoding techniques that allocate information bits and output codeword bits for transmission. For example, an encoder of a transmitting device may receive an input vector of bits, which may include information bits, check bits, frozen bits, redundant bits, or the like, among other examples. The input vector may be, for example, a physical channel message (e.g., a physical control channel message, a physical shared channel message) or a data packet. Bits that are not allocated as information bits may be assigned as parity bits or frozen bits. Parity bits may be used in parity check polar coding techniques and frozen bits may be bits of a given value (0, 1, etc.) known to the both the encoder and decoder (e.g., the encoder encoding information bits at the transmitting device and a decoder decoding the codeword received at a receiving device). Encoding the input vector according to a channel coding scheme (e.g., a channel coding algorithm) may provide redundancy and improve reliability for transmissions over a communication channel.

The encoder may use a channel coding scheme in accordance with a channel coding rate, which may indicate a ratio of "useful" (e.g., non-redundant) bits to total transmitted bits. For example, a coding rate of ½ (0.5) may indicate that the encoder inserts one redundant bit for each information bit, such that half of the encoded bits output from the encoder may be useful bits and half of the encoded bits may be redundant bits. Put another way, a coding rate may represent a level of redundancy included in encoded bits. A relatively low coding rate (e.g., 0.3, etc.) may correspond to increased redundancy (e.g., more redundant bits added per information bit) as compared to a relatively high coding rate (e.g., 0.7, etc.), where a relatively high coding rate may include a greater proportion of useful bits than redundant bits.

Examples of channel coding schemes used by encoders and decoders may include, but are not limited to, an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or the like. In some examples, an encoder (e.g., or decoder) may implement more than one channel coding scheme. For example, an encoder may concatenate multiple coding schemes such that an output from one channel coding scheme is an input to a second channel coding scheme. Additionally, or alternatively, an encoder may jointly encode one or more sets of information bits using multiple channel coding schemes.

Additionally, in some cases, a transmitting device may obtain (e.g., via channel polarization) multiple channel instances (which may also be referred to as polarization levels, encoding branches, etc.) of the communication channel, and may allocate one or more bits of the input vector to one or more channel instances. For example, a polar code encoder uses multiple recursive concatenation of a short kernel code in order to encode information bits. In polar coding, when the number of recursions becomes large, the resulting channel instances tend to either have high reliability or low reliability (an example of polarization). In some cases, different input vectors containing the same information bits (e.g., input vectors with a different allocation of information bits) but associated with different channel instances may be received with different success rates. For example, an input vector with information bits distributed such that the information bits are loaded to channel instances associated with high reliability metrics may be decoded at an increased success rate. Accordingly, information bits may be distributed across channel instances of the encoder based on respective reliability metrics of the channel instances. For example, additional information bits may be loaded into channel instances having favorable (e.g., high) reliability metrics, while additional frozen information bits may be loaded into channel instances having less favorable (e.g., low) reliability metrics.

After performing encoding, the transmitting device may modulate and transmit the encoded bits (e.g., output from a modulation component) to a receiving device, such as a network entity 105 or UE 115. The receiving device may implement decoding techniques for use in a decoding operation. For example, the receiving device may include a decoder having multiple channel instances (e.g., decoding branches). The receiving device may decode received bits in accordance with a channel coding scheme and using a coding rate. However, in some examples, some channel coding schemes and coding rates may be associated with relatively high computational complexity for decoding, which may increase power consumption and reduce communications efficiency, especially in high traffic (e.g., high throughput) scenarios. For instance, a channel coding scheme implemented at a first coding rate may have a relatively higher complexity than the same channel coding scheme implemented at a second coding rate.

Accordingly, various embodiments described in this disclosure support a framework for channel coding with reduced complexity without decreasing throughput or performance. For example, a transmitting device (e.g., an encoder of a transmitting device), such as a network entity 105 or a UE 115, may partition a set of information bits into multiple subsets of bits corresponding to a set of polarization levels (e.g., channel instances of a channel). In some examples, the subsets of bits may include different quantities of bits (e.g., may have unequal payload sizes). The transmitting device may encode each subset of bits separately, for example, according to a respective channel coding scheme and coding rate. In some cases, the transmitting device may encode each subset of bits according to a different channel coding scheme, using a different coding rate, or a combination thereof. For example, the transmitting device may apply a first channel coding scheme using a first coding rate to a first subset of bits for a first polarization level, and may apply second channel coding scheme using a second coding rate to a second subset of bits for a second polarization level. The transmitting device may select channel coding schemes and corresponding coding rates (e.g., or vice versa) based on an effective coding rate (e.g., an overall coding rate) for the channel, a reliability metric of an associated polarization level, a total quantity of information bits in the set of information bits, etc. Additionally, the transmitting device may concatenate a respective set of cyclic redundancy check (CRC) bits to each subset of bits (e.g., prior to applying a channel coding scheme).

After encoding, the subsets of bits (e.g., encoded bits) may be input to a polarizing transform such that the transmitting device applies the polarizing transform across the subsets of encoded bits. The transmitting device may concatenate the subsets of bits output from the polarizing transform to obtain a set of encoded, polarized bits, and may perform modulation and transmit the set of encoded polarized bits to a receiving device, such as a network entity 105 or a UE 115. Upon reception, the receiving device may demodulate and perform a depolarizing transform on the set of encoded polarized bits to obtain multiple sets of encoded (and depolarized) bits. The receiving device may decode each set of encoded bits separately. That is, the receiving device may decode a first set of encoded bits according to the first channel coding scheme and first channel coding rate and may decode a second set of encoded bits according to the second channel coding scheme and second channel coding rate. After decoding, the transmitting device may concatenate and process the decoded bits to obtain a set of bits corresponding to the set of information bits.

Figure 2:
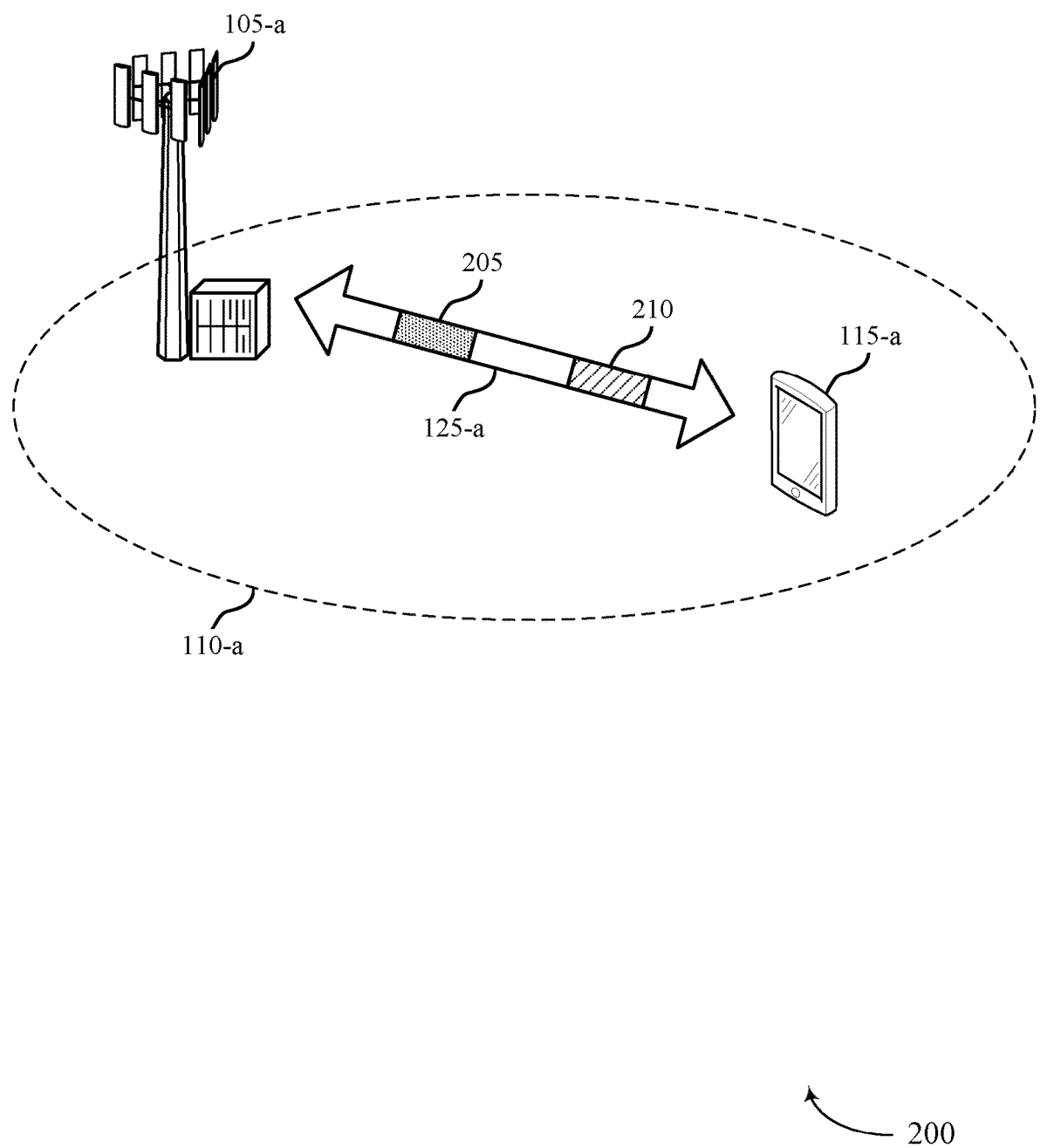

FIG. 2 illustrates an example of a wireless communications system 200 that supports polarization adjusted channel coding design for complexity reduction in accordance with one or more aspects of the present disclosure. In some examples, wireless communications system 200 may implement aspects of wireless communications system 100 and may include a UE 115-a and a network entity 105-a, which may be examples of UEs 115 and a network entity 105 as described with reference to FIG. 1. Wireless communications system 200 may support reduced complexity for channel decoding and encoding operations. For example, the described techniques may be implemented by an encoder of the network entity 105-a, a decoder of the network entity 105-a, an encoder of the UE 115-a, or a decoder of the UE 115-a.

While FIG. 2 illustrates the network entity 105-a as an example of a transmitting device and the UE 115-a as an example of a receiving device, any type, quantity, or combination of devices may implement the techniques described herein. For example, the UE 115-a may implement the described techniques as an example of a transmitting device and the network entity 105-a may implement the described techniques as a receiving device. Alternatively, the methods discussed herein may be applied by a transmitting device and a receiving device of a same type, e.g., by the transmitting network entity 105-a and a receiving network entity, a transmitting UE and the receiving UE 115-a, etc. Further, the techniques described herein may be implemented by any type, quantity, or combination of devices of any wireless communications system.

The network entity 105-a may communicate with the UE 115-a via a communication link 125-a. The UE 115-a may be positioned within a coverage area 110-a of the network entity 105-a. The network entity 105-a may be an example of a transmitting device and may transmit downlink messages to the UE 115-a. For example, the communication link 125-a may include or be an example of a downlink channel, such as a physical downlink control channel (PDCCH), a physical downlink shared channel (PDSCH), or the like, among other examples, and the network entity 105-a may transmit, to the UE 115-a, control signaling (e.g., RRC signaling, DCI, MAC-CE), data signaling, reference signals (e.g., demodulation reference signals (DMRSs), channel state information reference signals (CSI-RSs)), etc. Additionally or alternatively, the communication link 125-a may include or be an example of an uplink channel, such as a physical uplink control channel (PUCCH), a physical uplink shared channel (PUSCH), or the like, and the UE 115-a may transmit uplink messages to the network entity 105-a.

The network entity 105-a may have data stored in memory to be transmitted to another device, such as the UE 115-a. To initiate the transmission process, the network entity 105-a may retrieve, from the memory, the data for transmission. The data may include a set of information bits, where a quantity of information bits of the set of information bits may be represented as a value k. An encoder/decoder of the network entity 105-a may encode the set of information bits and output a codeword having a length N. The encoder/decoder may implement a number of encoding techniques (i.e., channel coding schemes), such as linear block encoding, LDPC encoding, polar encoding, Reed-Muller encoding, polar Reed-Muller encoding, and the like, which may introduce redundancy into the encoded output. This redundancy may increase the overall probability that the set of information bits will be successfully decoded by the UE 115-a upon reception. Depending on a coding rate used in the encoding technique to encode the set of information bits, N may be different than or the same as k. For example, in some cases, the codeword may have a quantity of bits that are not allocated as information bits (i.e., parity bits, redundancy bits, frozen bits, etc.) equal to N–k bits, such that N is greater than k. The coding rate R may be represented by R=k/N.

In some examples, the method for encoding data transmissions by the encoder of the network entity 105-a may involve generating a polar code of length N and dimension k, e.g., corresponding to the set of information bits. A polar code is an example of a linear block error correcting code and may be used to increase the probability of a successful transmission. During encoding, the network entity 105-a may obtain multiple channel instances (also referred to as encoding branches, polarization levels, or the like) based on a polarization kernel. Some channel instances may be associated with relatively poor channel quality, such that a capacity of a channel instance is near 0, while other channel instances may be associated with relatively good channel quality, such that a capacity of a channel instance is near 1. Additionally, reliability metrics may be calculated based on bit locations of the encoder that correspond to respective channel instances. For example, the probability that a bit (or group of bits) at a given bit location will be successfully decoded at a receiving device may be referred to as a "reliability", and may be associated with the given bit location or channel instance.

In some cases, the network entity 105-a may sort (e.g., in order of decreasing or increasing reliability) or otherwise organize the channel instances on corresponding reliability metrics. For example, the network entity 105-a may order the channel instances based on corresponding reliability metrics in accordance with a sequence of reliability vector. Additionally, the network entity 105-a may assign a given bit type (e.g., parity bit, information bit, frozen bit) to all or a portion of the channel instances. For example, the network entity 105-a may select a set of one or more "most reliable" bit locations that correspond to channel instances associated with a highest reliability metric. Here, the network entity 105-a may assign information bits to the set of one or more most reliable bit locations. The network entity 105-a may additionally assign non-information bits, such as frozen bits, to the remaining bit locations (e.g., corresponding to channel instances associated with relatively lower reliability metrics). In some cases, parity bits may be assigned to the one or more most reliable bit locations (e.g., along with the information bits), while in other cases, parity bits may be assigned to the remaining bit locations (e.g., along with non-information bits).

The network entity 105-a may load each channel instance with a bit to be encoded. Bits to be encoded may include information bits and non-information bits. In other examples, bits to be encoded may include non-frozen bits but not frozen bits. The network entity 105-a (e.g., the encoder of the network entity 105-a) may encode the bits and may input encoded bits (e.g., the codeword) to a modulator. After modulation, the network entity 105-a may transmit the encoded, modulated bits to the UE 115-a, for example, as part of a message 205 transmitted via the communication link 125-a. The UE 115-a may receive encoded data (e.g., the codeword) and may decode the encoded data using a decoder to obtain the transmitted data (e.g., corresponding to the information bits).

However, such implementations may be complex, and may introduce latency into the encoding or decoding process. That is, increasing redundancy and/or reliability via encoding and polarization techniques may improve the likelihood that a transmission is successfully received and decoded at a receiving device (e.g., the UE 115-a), but may also increase complexity. Likewise, reducing complexity by decreasing redundancy or reliability may reduce the likelihood that the UE 115-a successfully receives the transmission. Additionally, as an amount of traffic (i.e., throughput) increases for the decoder, computational complexity, processing power, processing time, and resource consumption may increase, which may further increase system latency and adversely affect system efficiency.

For example, a given channel coding scheme at a given coding rate may be associated with a relatively high complexity, which may be characterized by a complexity per encoded bit per iteration metric. The same channel coding scheme at a different coding rate (e.g., a relatively higher coding rate) may be associated with a lower complexity. However, a higher coding rate results in less redundancy, which may reduce the likelihood that bits encoded with the higher coding rate are successfully received and decoded at a receiving device. Accordingly, the techniques described herein may combine polarization techniques (e.g., polarizing transforms) with channel coding schemes and coding rates associated with reduced complexity, such that a transmitting device may transmit encoded bits without reducing the likelihood that a receiving device successfully receives the encoded bits, and such that the receiving device may avoid increased computational costs. The wireless communications system 200 may support such techniques for encoding and decoding algorithms having reduced computational complexity, which may provide efficient communications even in high-throughput scenarios and may reduce storage or processing and calculation demands at a decoder of a receiving device.

For example, a transmitting device, such as the network entity 105-a, may partition or otherwise allocate a set of information bits to be transmitted to a receiving device, such as the UE 115-a, into multiple subsets of bits. The multiple subsets of bits may correspond to multiple polarization levels (e.g., channel instances of a polarizing transform). After allocating the set of information bits into the subsets of bits, the network entity 105-a may generate a respective set of CRC bits for each subset of bits; the network entity 105-a may concatenate each set of CRC bits with the corresponding unencoded subset of bits. The network entity 105-a may separately encode each subset of bits (e.g., including the CRC bits) using a respective channel coding scheme and a coding rate. Additionally, the network entity 105-a may apply a polarizing transform (e.g., based on the polarization levels) across the encoded subsets of bits (e.g., corresponding to multiple channels), which may improve reliability for the encoded subsets of bits without increasing complexity. In some examples, the polarizing transform may be understood to be based on a polar kernel (e.g., may be a polar code). Put another way, in such examples, after separately encoding the subsets of bits, the network entity 105-a may jointly encode all encoded subsets of bits according to a polar coding scheme.

The network entity 105-a may concatenate encoded subsets of bits output from the polarizing transform to obtain a set of output bits that corresponds to the set of information bits. The network entity 105-a may transmit a message 205, including the set of output bits, to the UE 115-a via the communication link 125-a. The UE 115-a may receive and decode the message 205 using the described methods to obtain a decoded set of bits corresponding to the set of information bits.

By partitioning the set of information bits based on the polarization levels, the network entity 105-a may adaptively select channel coding schemes and coding rates for each subset of bits to reduce decoding complexity at the UE 115-a. For example, the network entity 105-a may identify or otherwise determine a quantity of information bits k of the set of information bits and an effective coding rate R (e.g., associated with one or more encoding procedures for the set of information bits). In some examples, the network entity 105-a may receive signaling indicating k and R, or determine k and R based on a quantity of resources allocated for transmission of the message 205, an MCS for the message 205, or the like. The network entity 105-a may encode a first subset of bits, corresponding to a first polarization level, according to a first channel coding scheme and using a first coding rate. The network entity 105-a may encode a second subset of bits, corresponding to a second polarization level, according to a second channel coding scheme and using a second coding rate. Here, the network entity 105-a may select the first coding rate and the second coding rate based on a mutual information polarization function, the quantity of information bits k, and the effective coding rate R. That is, the first coding rate and the second coding rate may be selected such that the overall channel coding complexity is reduced, while the effective coding rate for the set of information bits remains the same.

As a specific example, an effective coding rate $$R = \frac{k}{N}$$

for the set of information bits encoded using an LDPC code may be equal to 0.5, which may correspond to an average complexity per coded bit per iteration of 4.3. The effective coding rate R may represent a coding rate to be used for encoding the set of information bits k for an unpolarized channel. Additionally, the effective coding rate R may be equivalent to a total capacity of the unpolarized channel.

The network entity 105-a may apply the polarizing transform to the unpolarized channel to obtain the first polarization level and the second polarization level. The first polarization level may correspond to a polarized channel instance having a relatively low capacity, which may be represented by $I^-$, and the second polarization level may correspond to a polarized channel instance having a relatively high capacity, which may be represented by $I^+$. A total capacity of the first polarization level and the second polarization level may be equal to twice that of the unpolarized channel, which may be represented by Equation 1 below.

$$I^-(R)+I^+(R)=2R \tag{1}$$

Equation 1 may be implemented (e.g., by the network entity 105-a or any transmitting device) to determine channel capacity for other types of channels. That is, a transmitting device, such as the network entity 105-a, may calculate channel capacity and coding rate for each polarization level based on an appropriate mutual information polarization function. For a binary erasure channel (BEC), the capacity of the first polarization level may be equal to the mutual information polarization function for a BEC channel, which may be given by $I^-(R)=R^2$. Using Equation 1, the capacity of the second polarization level may be equivalent to $I^+(R)= 2R-R^2$. For an additive white Gaussian noise (AWGN) channel, the capacity of the first polarization level may be equal to $I^-(R)=C_{AWGN}^-=C^2+\delta$, and the capacity of the second polarization level may be equal to $I^+(R)=C_{AWGN}^+= 2C-C^2-\delta$. In this example, $\delta$ may be a numerical term used to approximate the mutual information polarization function for an AWGN channel based on the mutual information polarization function for the BEC. Here, $$\delta = \frac{|C-0.5|}{32} + \frac{1}{64}.$$

Additionally, because the capacity of a channel may be equivalent to a coding rate, a total coding rate for the first subset of bits and the second subset of bits may be equal to twice the effective coding rate. The first coding rate may be represented by $R_1=I^-(R)$ and the second coding rate may be represented by $R_2=I^+(R)$. Accordingly, the network entity 105-a may select coding rates for the first subset of bits corresponding to the first polarization level and the second subset of bits corresponding to the second polarization level such that Equation 1 is satisfied. A higher capacity polarization level may support a higher coding rate than a lower capacity polarization level. The network entity 105-a may select a coding rate for a subset of bits based on the capacity of the corresponding polarization level, e.g., may select a coding rate that matches a channel quality or reliability of the polarization level.

In some cases, a transmitting device, such as the network entity 105-a may communicate the effective coding rate R to a receiving device, such as the UE 115-a, so that the receiving device may determine (e.g., calculate) corresponding coding rates $R_i$ for each subset of bits received at the receiving device. For example, the networking entity 105-a may transmit a signal 210 to the UE 115-a that includes an indication of the effective coding rate R for the message 205. In some cases, the signal 210 may additionally indicate the quantity of information bits k. After receiving the message 205 including the encoded set of information bits, the UE 115-a may partition the set of information bits into multiple subsets of bits (e.g., based on k). The UE 115-a may calculate, using Equation 1, a respective coding rate $R_i$ for each subset of bits. In this manner, a transmitting device and a receiving device may avoid extraneous signaling used to indicate coding rates $R_i$ for each of the subsets of bits, which may, in turn, reduce signaling overhead.

Continuing the present example, the network entity 105-a may apply an LDPC code to the first subset of bits associated with the first polarization level using a coding rate of 0.36, which may correspond to a complexity per encoded bit per iteration of approximately 4.2. The network entity 105-a may apply an LDPC code to the second subset of bits associated with the second polarization level using a coding rate of 0.64, which may correspond to a complexity per encoded bit per iteration of approximately 4.1. The total coding rate across the first subset of bits and the second subset of bits may be equal to 2R=1. Thus, the effective coding rate R across the first subset of bits and the second subset of bits remains 0.5, while the complexity of each polarization level is less than the complexity of the unpolarized channel.

Additionally, the network entity 105-a may select or otherwise determine a quantity $k_i$ of information bits (e.g., of the set of information bits) to be included in each subset based on the mutual information polarization function, the total quantity of information bits k, and the effective coding rate R. For example, the network entity 105-a may calculate $k_i$ according to Equation 2 below, where $R_i$ represents a coding rate for the corresponding subset of bits.

$$k_i = \frac{kR_i}{2R} \quad (2)$$

The network entity 105-a may allocate a first quantity of bits $k_1$ to the first subset of bits and a second quantity of bits $k_2$ to the second subset of bits. In some cases, the polarizing transform may be based on a polar kernel, and the network entity 105-a may allocate respective quantities of bits $k_i$ to each subset by applying the above procedure (e.g., Equation 2) recursively. For example, the network entity 105-a may determine $k_2$ based on $k_1$, may determine $k_3$ based on $k_2$, and so on. In some examples, the network entity 105-a may arbitrarily round $k_1$ and $k_2$ to integers, provided that $k_1+k_2=k$. The network entity 105-a may apply a rounding scheme to determine the integer values for $k_1$ and $k_2$, which may be the same as a rounding scheme applied by the UE 115-a during decoding. As a non-limiting example, the network entity 105-a and the UE 115-a may each round $k_1$ up to the nearest integer and may round $k_2$ down to the nearest integer. By applying the same rounding scheme, the network entity 105-a and the UE 115-a may both determine a same integer value for each of $k_1$ and $k_2$.

In general, for each subset of bits, the network entity 105-a may determine a respective coding rate $R_i$, capacity of a corresponding polarization level $l_i$, and quantity of information bits $k_i$ based on a conditional mutual information function (e.g., a mutual information polarization function), given by Equation 3, where $U_i$ may represent input and Y may represent output.

$$I(U_i; Y|U_1^{i-1}) \quad (3)$$

In some examples, the network entity 105-a may partition the set of information bits into the subsets of bits and may allocate $k_i$ information bits to each subset of bits based on an information allocation algorithm. The subsets of bits may have unequal payload sizes. For example, $k_1 \neq k_2$. In such examples, the network entity 105-a may allocate the $k_i$ information bits to respective subsets of bits based on a channel quality (e.g., a reliability or capacity) of the corresponding polarization levels. For example, the network entity 105-a may allocate fewer bits to a subset of bits corresponding to a higher coding rate, a lower capacity polarization level, or the like, and may allocate more bits to a subset of bits corresponding to a lower coding rate, a higher capacity polarization level, or the like.

Additionally, or alternatively, the network entity 105-a may partition the set of information bits into the subsets of bits based on one or more coding levels associated with one or more encoding procedures for the set of information bits. The one or more coding levels may correspond to channel coding schemes selected by the network entity 105-a. That is, the network entity 105-a may select a channel coding scheme to use for each subset of bits based on the one or more coding levels. In some cases, the quantity of coding levels may be equal to a quantity of the subsets of bits.

The network entity 105-a may encode each subset of bits based on the partitioning, the respective coding rate, and a respective channel coding scheme. For example, the network entity 105-a may encode the first subset of bits according to a first channel coding scheme and using a first coding rate and may encode the second subset of bits according to a second channel coding scheme and using a second coding rate. In some examples, the network entity 105-a may select or otherwise determine a respective channel coding scheme and a coding rate to use to encode each subset of bits, while in other examples, the channel coding scheme(s) and, in some cases, the coding rates, may be predetermined or preconfigured.

In some cases, the network entity 105-a may select different channel coding schemes for each subset of bits, e.g., the first channel coding scheme may be different than the second channel coding scheme. In other cases, the network entity 105-a may select a same channel coding scheme for more than one subset of bits, but may implement different coding rates.

In some examples, the network entity 105-a may jointly encode some subsets of bits according to a same channel coding scheme and coding rate. For example, the network entity 105-a may jointly encode the second subset of bits and a third subset of bits (e.g., corresponding to the third polarization level) according to the second channel coding scheme.

Additionally, or alternatively, the network entity 105-a may select channel coding schemes based on one or more subsets of coding levels. As an illustrative example, the network entity 105-a may partition the set of information bits into seven subsets of bits. In a first scenario, the network entity 105-a may encode all seven subsets of bits according to an LDPC coding scheme, but may use a different coding rate for each subset of bits. In a second scenario, the network entity 105-a may determine that a first subset of coding levels includes or otherwise corresponds to three of the seven subsets of bits and a second coding level includes or otherwise corresponds to four of the seven subsets of bits. Here, the network entity 105-a may encode the three subsets of bits included in the first subset of coding levels according to a first channel coding scheme, such as an LDPC channel coding scheme, and a first coding rate. The network entity 105-a may encode the four subsets of bits included in the second subset of coding levels according to a second channel coding scheme, such as a Reed-Solomon coding scheme, and a second coding rate. In some cases, the first coding rate may be different from the second coding rate. Alternatively, the network entity 105-a may refrain from encoding the four subsets of bits included in the second subset of levels, e.g., may transmit the four subsets of bits as unencoded bits. For example, the network entity 105-a may refrain from encoding one or more subsets of bits, such as the four subsets of bits included in the second subset of coding levels, when a channel capacity of the polarization levels corresponding to the one or more subsets of bits is relatively high (e.g., C is close to 1).

In some cases, the network entity 105-a may determine a relationship between a subset of coding levels and a channel coding scheme based on a channel reliability of an associated polarization level, a coding rate, or the like, among other examples. For example, the subsets of bits included in the first coding level may correspond to a first polarization level and the subsets of bits included in the second coding level may correspond to a second polarization level. Additionally, or alternatively, the first coding level may correspond to a first coding rate and the second coding level may correspond to a second coding rate. The network entity 105-a may determine that the first subset of coding levels is associated with the LDPC coding scheme based on a channel reliability of the first polarization level, the first coding rate, or a combination thereof, among other examples. The network entity 105-a may also determine that the second subset of coding levels is associated with the Reed-Solomon coding scheme based on a channel reliability of the second polarization level, the second coding rate, or a combination thereof, among other examples.

In such cases, the network entity 105-a may additionally or alternatively select a quantity of coding levels $M_i$ included in each subset of coding levels associated with a given channel coding scheme. For example, for a total quantity of coding levels M, the network entity 105-a may determine that a first quantity of coding levels $M_1$ may be included in a first subset of coding levels, where the first subset of coding levels is associated with an LDPC coding scheme. In some examples, the network entity 105-a may determine that any remaining coding levels (e.g., $M-M_1$ coding levels) may be associated with a different channel coding scheme (e.g., other than LDPC), or may be associated with no channel coding scheme (e.g., subsets of bits included in the remaining coding levels may be unencoded for transmission). In other examples, the network entity 105-a may determine that a second quantity of coding levels $M_2$ may be associated with a second channel coding scheme (e.g., a Reed-Solomon coding scheme), a third quantity of coding levels $M_3$ may be associated with a third channel coding scheme, and so on.

Figure 3:
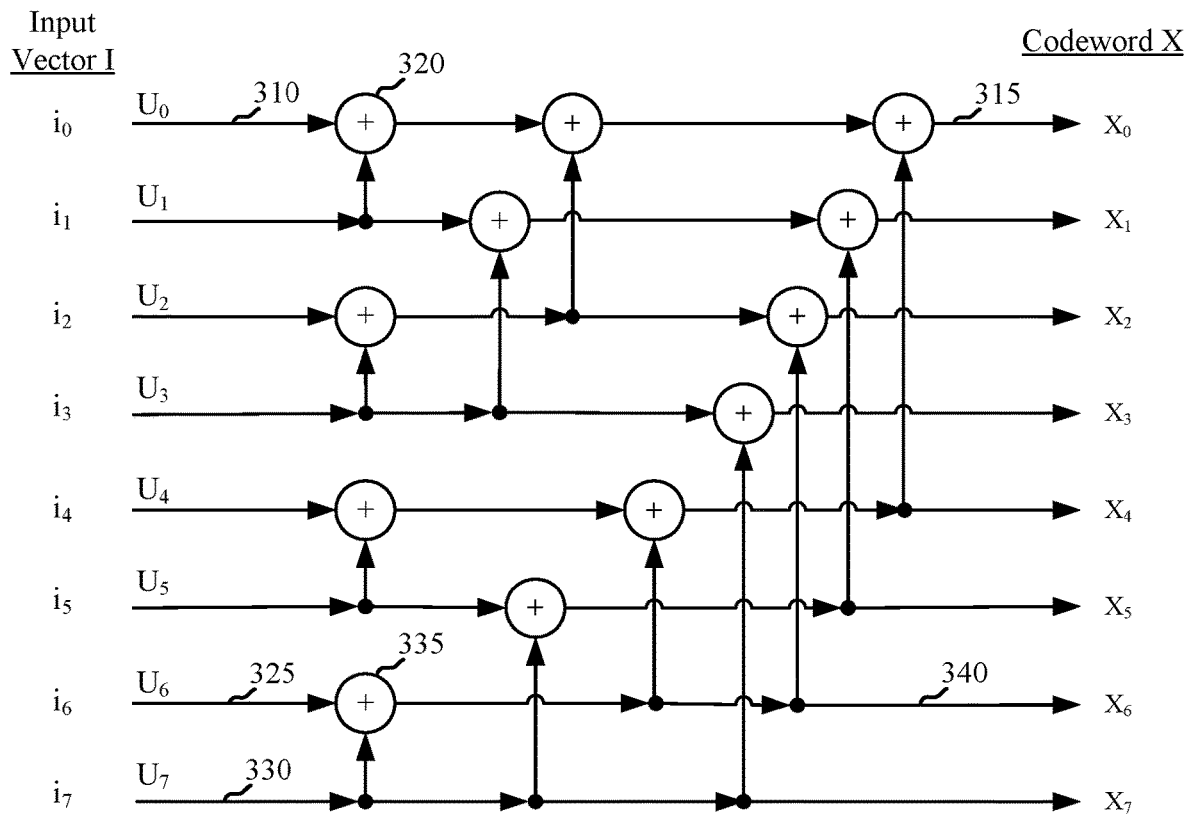
FIG. 3 illustrates an example of an encoder that supports polarization adjusted channel coding design for complexity reduction in accordance with one or more aspects of the present disclosure.

After partitioning the set of information bits and encoding each subset of bits, the network entity 105-a may apply the polarizing transform across the encoded subsets of bits, e.g., using the encoded subsets of bits. In some cases, the encoded subsets of bits may correspond to a set of channels based on the multiple polarization levels. During the polarizing transform, the network entity 105-a may apply one or more operations (e.g., encoding operations) to the encoded subsets of bits. For instance, the polarizing transform may be based on a polar code such that outputs of the polarizing transform are polarized. The polarizing transform may use the multiple polarization levels corresponding to the multiple subsets of encoded bits. A quantity of the multiple polarization levels may be equal to a quantity of the encoded subsets of bits, e.g., output from the respective channel coding schemes. As illustrated by FIG. 3, for example, a polarizing transform based on a polar code may have eight polarization levels, such that the network entity 105-a may input eight encoded subsets of bits to the polarizing transform and may output eight subsets of polarized bits corresponding to the encoded subsets of bits.

In some cases, and as described in more detail with reference to FIG. 3, the network entity 105-a may strategically apply the polarizing transform based on a reliability associated with each polarization level of the polarizing transform. For example, the network entity 105-a may input, to the polarizing transform, the first encoded subset of bits associated with the first polarization level based on a channel reliability of the first polarization level. The network entity 105-a may additionally input the second encoded subset of bits associated with the second polarization level based on a channel reliability of the second polarization level.

The polarizing transform may be an example of an error correction code, a polar code, an (M,K) code (e.g., an inner error correction code), a simplex code, or the like, among other examples. In some cases, the polarizing transform may be a one-to-one transform (e.g., a quantity of inputs is equal to a quantity of outputs), while in other cases, the polarizing transform may be injective (e.g., the polarizing transform may add redundancy to the input(s)).

After applying the polarizing transform across the encoded subsets of bits, the network entity 105-a may concatenate the encoded subsets of bits output from the polarizing transform to obtain a set of output bits corresponding to the set of information bits. The network entity 105-a may modulate the set of output bits and may transmit the message 205 to the UE 115-a including the set of output bits. The UE 115-a may receive the message 205. The set of output bits in the message 205 may be received at the UE 115-a as an encoded set of bits corresponding to the set of information bits. The UE 115-a may apply the above procedures in reverse. That is, the UE 115-a may demodulate the encoded set of bits and apply a depolarizing transform using the encoded subset of bits. The UE 115-a (e.g., a decoder of the UE 115-a) may output, from the depolarizing transform, multiple subsets of bits corresponding to multiple polarization levels. Additionally, the UE 115-a may perform interference cancellation, e.g., as part of the depolarizing transform. The UE 115-a may decode the multiple subsets of bits in accordance with one or more channel decoding schemes and based on the depolarizing transform. The UE 115-a may process the decoded subsets of bits to obtain a set of output bits corresponding to the set of information bits.

The multiple subsets of bits may include at least a first subset of bits and a second subset of bits. In some cases, a quantity of the multiple subsets of bits output from the depolarizing transform at the UE 115-a may be equal to a quantity of the multiple subsets of bits of the set of information bits partitioned by the network entity 105-a. Additionally, or alternatively, the multiple subsets of bits may be based on a quantity of coding levels $M_i$ associated with one or more decoding procedures for the set of information bits. For example, a quantity of the multiple subsets of bits may be equal to a quantity of coding levels $M_i$. The quantity of coding levels $M_i$ may include one or more subsets of coding levels, which may correspond to one or more channel decoding schemes implemented by the UE 115-a.

During the depolarizing transform, the UE 115-a may determine or otherwise identify a respective quantity of information bits $k_i$ included in each subset of bits (e.g., based on an information allocation algorithm). That is, the UE 115-a may partition the encoded set of bits (e.g., the set of information bits) by allocating the quantity of information bits $k_i$ into the multiple subsets of bits. For example, the UE 115-a may determine a first quantity of information bits $k_1$ included in the first subset of bits, a second quantity of information bits $k_2$ included in the second subset of bits, and so on. The UE 115-a may determine $k_i$ based on a total quantity of information bits k included in the set of information bits and an effective coding rate R associated with one or more decoding procedures for the set of information bits, e.g., using Equation 2.

Generally, the UE 115-a may determine a respective coding rate $R_i$, capacity of a corresponding polarization level $l_i$, and quantity of information bits $k_i$ for each subset of bits (e.g., corresponding to the polarization levels) based on the conditional mutual information function (e.g., a mutual information polarization function) given by Equation 3 For example, the UE 115-a may determine the respective coding rate $R_i$ for each subset of bits such that the UE 115-a may decode each subset of bits in accordance with the corresponding channel decoding scheme and coding rate $R_i$. In some cases, the depolarizing transform may be based on a polar code (e.g., a polarization kernel) such that the UE 115-a may recursively determine $R_i$, $l_i$, and $k_i$, e.g., may recursively calculate Equation 2 for each subset of bits.

In some examples, the UE 115-a may determine k and R based on a quantity of resources allocated for transmission of the message 205, the MCS for the message 205, or the like. Additionally, or alternatively, the UE 115-a may determine k and R (e.g., the quantity of information bits in the set of information bits and the effective coding rate, respectively) based on receiving signaling, e.g., from the network entity 105-a. As illustrated in FIG. 2, the UE 115-a may receive the signal 210 from the network entity 105-a via the communication link 125-a. The signal 210 may indicate the quantity of information bits in the set of information bits and the effective coding rate for the message 205. For example, the signal 210 may indicate a value of k and a value of R. The UE 115-a may determine $R_i$, $l_i$, $k_i$, or a combination thereof, among other examples, using the indication(s) of R and k included in the signal 210. That is, the UE 115-a may allocate information bits to the subsets of bits and may determine a corresponding coding rate for each subset of bits based on the values of R and k indicated by the network entity 105-a, such that the network entity 105-a and the UE 115-a may both obtain the same values for $R_i$, $l_i$, and $k_i$ (e.g., without transmitting signaling to indicate each value).

The UE 115-a may apply the depolarizing transform to the multiple subsets of bits using multiple polarization levels corresponding to the multiple subsets of bits. In some examples, the quantity of the multiple polarization levels may be equal to a quantity of the multiple subsets of bits, and each polarization level may correspond to a respective subset of bits. The UE 115-a may output, from the depolarizing transform, multiple depolarized subsets of bits.

To decode the multiple depolarized subsets of bits, the UE 115-a may select or otherwise determine respective channel decoding schemes and corresponding coding rates for each subset of bits. For example, the UE 115-a may select a first channel decoding scheme for the first subset of bits based on $R_1$, a second channel decoding scheme for the second subset of bits based on $R_2$, and so on. In some cases, the UE 115-a may select a channel decoding scheme for a subset of bits based on whether the corresponding coding rate R satisfies a threshold. For example, the threshold may be a maximum value of R represented by $R_{max}$, and the UE 115-a may compare each $R_i$ to $R_{max}$. If a value of $R_i$ is less than $R_{max}$ (e.g., $R_i$ satisfies the threshold), the UE 115-a may select a first channel decoding scheme for the subset of bits corresponding to $R_i$, such as an LDPC channel decoding scheme. If, instead, the value of $R_i$ is greater than $R_{max}$ (e.g., $R_i$ fails to satisfy the threshold), the UE 115-a may select a second channel decoding scheme for the subset of bits corresponding to $R_i$, such as a Reed-Solomon channel decoding scheme.

Additionally, or alternatively, the UE 115-a may select a channel decoding scheme for a subset of bits based on a coding level (or subset of coding levels) associated with the subset of bits. For example, the first subset of bits may be included in a first subset of coding levels that is associated with a first channel decoding scheme (e.g., LDPC), such that the UE 115-a decodes the first subset of bits using the first channel decoding scheme. In some cases, a subset of coding levels may be associated with a channel decoding scheme based on a channel reliability of a corresponding polarization level. For example, some polarization levels may be associated with relatively low channel reliability; as such, a subset of coding levels corresponding to these polarization levels may be associated with an LDPC channel decoding scheme. Polarization levels associated with relatively high channel reliabilities may correspond to subsets of coding levels that use a relatively low-complexity channel decoding scheme, such as a Reed-Solomon channel decoding scheme.

Using the selected channel decoding schemes, the UE 115-a may sequentially decode the multiple subsets of bits, e.g., based on the depolarizing transform. For instance, the UE 115-a may use multi-stage decoding. Here, the UE 115-a may initially decode the first subset of bits (e.g., output from the depolarizing transform and associated with a first polarization level) based on the first channel decoding scheme and using a first coding rate. The UE 115-a may then re-apply the depolarizing transform to the multiple subsets of bits using the decoded first subset of bits. The UE 115-a may decode the second subset of bits output from the reapplied depolarizing transform (e.g., and associated with a second polarization level) using a second channel decoding scheme and a second coding rate, and based on the decoded first subset of bits.

After decoding, the UE 115-a may process the decoded subsets of bits to obtain a set of decoded bits corresponding to the set of information bits. For example, the UE 115-a may concatenate one or more subsets of decoded bits, e.g., including at least the decoded first subset of bits and the decoded second subset of bits, and the set of decoded bits may include the concatenated subsets of decoded bits.

It is to be understood that the techniques discussed herein are not limited to the described examples, and may be scalable to any number and combination of channel coding schemes, coding rates, coding levels, polarization levels, and the like. Additionally, although the techniques described herein are illustrated with reference to specific devices, it should be understood that any device or combination of devices may be used.

FIG. 3 illustrates an example of an encoder 300 that supports polarization adjusted channel coding design for complexity reduction in accordance with one or more aspects of the present disclosure. The encoder 300 may implement an information bit allocation for a channel coding scheme in accordance with the techniques described herein. For example, the encoder 300 may be implemented by a wireless device, such as a network entity 105 or a UE 115 as described with reference to FIGS. 1 and 2, to encode and decode information bits. The following describes encoder 300 as being a polar encoder with 8 channel instances (e.g., encoding branches), and the principles described herein may be extended to other types of encoders and having any number of channel instances.

A channel (e.g., W) may be a binary-input discrete memoryless channel (e.g., W: U→X, where (/represents input and X represents output). The capacity of the channel may be represented by C=I(U; X) and for the example of binary-input, 1≤C≤1, where C=I(U; X) denotes mutual information and may be referred to as a mutual information polarization function.

In some wireless communications systems, channel polarization may be used to create an auxiliary channel to achieve coding gain beyond repetition. A device, such as a network entity or UE, may apply channel polarization (e.g., a polarizing transform) to obtain multiple instances of the channel, where each channel instance is associated with a capacity. A channel instance may also be referred to as a polarization level, such that a polarizing transform may be associated with a quantity of polarization levels M.

Generally, a polarizing transform may be any arbitrary M×M matrix, and M may be any integer, provided that the matrix is a binary transform and is invertible. In some examples, such as the example illustrated in FIG. 3, a polarizing transform may be an example of a polar code and may be based on a polar kernel. For example, a polarizing transform based on a polar kernel may have M polarization levels, and may be represented by a tensor power of a 2×2 matrix $$\begin{pmatrix} 1 & 0 \\ 1 & 1 \end{pmatrix}$$

with dimensions $2^M \times 2^M$.

In some examples, the capacity of each channel instance of a polarizing transform may not be the same as another channel instance. For example, for binary input channels, channels of punctured bits may have C=0, channels of shortened bits may have C=1, and channels transmitted over a given AWGN channel may have a C of the corresponding channel. A higher value of C may correspond to a higher capacity, where a higher capacity indicates that the channel instance supports a relatively higher rate in terms of bits per channel use (e.g., for a single transmission over a wireless medium) at which information can be sent with an arbitrarily low probability of error. Put another way, a relatively high capacity may correspond to a relatively high channel quality and a relatively higher reliability metric.

For example, for the channel W, a device may apply a polarizing transform to obtain a channel instance $W_1$ and a channel instance $W_2$. $W_2$ may have a higher capacity than $W_1$ and may thus be considered to have a better channel quality and reliability than $W_1$ (e.g., $W_2$ may be decoded with a higher success rate). The capacity of the unpolarized channel W may be represented by R, the capacity of the channel $W_2$ may be represented by $W^+$, and the capacity of the channel $W_1$ may be represented by $W^-$. The polarizing transform may be based on the mutual information polarization function C=I(U; X). That is, outputs of the mutual information polarization function (e.g., X) may polarize based on functions associated with the transform. A mutual information transfer chart or the like may be used to establish a relationship between W and $W^+/W^-$, and thus establish the polarization of the channel.

The above operation may be performed recursively, yielding more polarization across N channel instances, where each channel instance has a corresponding capacity and reliability. The device may load (i.e., assign) bits to be transmitted to the channel instances. In some cases, the device may load bits to channel instances based on the reliability of each channel instance. For example, the device may load information bits to $W_2$ and may load frozen or parity bits to $W_1$.

In the example of FIG. 3, the device may obtain eight channel instances (i.e., polarization levels, encoding branches) such that N=8. The encoder 300 of the device may encode a set of bits in (including at least a portion of information bits) using a polar code, e.g., based on the polarizing transform. In this example, the encoder 300 is an 8-bit encoder, and therefore receives an input vector I including a set of bits [$i_0$, $i_1$, ..., $i_7$]. A quantity of bits of the set of bits may be represented by k. The input vector/ including the quantity of bits k has a length k=8. The encoder 300 may encode the set of bits and may output an 8-bit output vector X ([$X_0$, $X_1$, ..., $X_7$]), which may also be referred to as a codeword. Because the output vector has an equal quantity of bits as the input vector, the polar code example of FIG. 3 may be referred to as a one-to-one coding scheme. Coding schemes of other bit sizes may also be used and in some cases, the output vector may have a different length than that of the input vector, e.g., coding schemes other than one-to-one coding schemes may be applied.

The multiple channel instances may each correspond to a bit location $U_N$, to which the encoder 300 may assign corresponding bits i of the input vector I. As illustrated in FIG. 3, the encoder 300 may load a bit $i_0$ to a bit location $U_0$ corresponding to a first channel instance, a bit $i_1$ to a bit location $U_1$ corresponding to a second channel instance, and so on, up to a bit $i_7$ and a bit location $U_7$. A bit loaded to a bit location may undergo one or more operations (e.g., encoding operations) for the channel instance. For example, at the bit location $U_0$, the bit $i_0$ is received at input 310, three Boolean exclusive or (XOR) operations are performed (represented by a "+" symbol at element 320), and a bit $X_0$ of output vector X is output at 315.

Each channel instance of encoder 300 may perform zero or more encoding operations on bits i input to the channel instance via the corresponding bit location U. Encoding a bit in one channel instance may depend on bits input to one or more other channel instances. For example, in the channel instance corresponding to the bit location $U_6$, the encoder 300 encodes bit $i_6$ by performing XOR operations on bits $i_6$ and $i_7$. Bit $i_6$ is received at input 325 of bit location $U_6$ and bit $i_7$ is received at input 330 of bit location $U_7$. At 335, the encoder performs an XOR operation on bits $i_6$ and $i_7$ in the channel instance corresponding to the bit location $U_6$ and provides X6 at output 340. Put another way, $X_6 = i_6$ XOR $i_7$. The encoder 300 performs similar operations in remaining channel instances corresponding to bit locations $U_0$ to $U_5$ and $U_7$ to encode corresponding bits of the input vector I. After performing the encoding operations on the bits of the input vector I, the encoder 300 outputs the output vector X such that X includes a set of encoded bits [$X_0$, $X_1$, ..., $X_7$].

Because the encoder 300 is an example of a polar encoder (e.g., the encoder 300 applies a polarizing transform based on a polar kernel), the channel instances corresponding to the bit locations $U_0$ to $U_7$ (e.g., and the output vector X) are polarized, such that each channel instance may be associated with a capacity and a reliability. The device may distribute information bits (e.g., included in the input vector I) across the channel instances based on associated reliabilities (e.g., based on a channel quality associated with each channel instance). That is, the bits assigned to bit locations $U_0$ to $U_7$ may have varying probabilities of successful decoding, e.g., based on the corresponding reliability of each bit location $U_0$ to $U_7$, once output X is transmitted and received at a receiver.

A transmitting device (e.g., a network entity, a UE, etc.) may include an encoder such as the encoder 300 to implement the techniques described herein. For example, as described with reference to FIG. 2, the network entity 105-a may rely on an encoder 300 to apply a polarizing transform to multiple encoded subsets of bits of a set of information bits. Similarly, the UE 115-a may utilize an encoder 300 to decode a set of encoded bits received from the network entity 105-b. Additionally, as described with reference to FIGS. 4 and 5, the encoder 300 may be implemented in combination with one or more other channel coding schemes and/or polarizing transforms.

Figure 4:
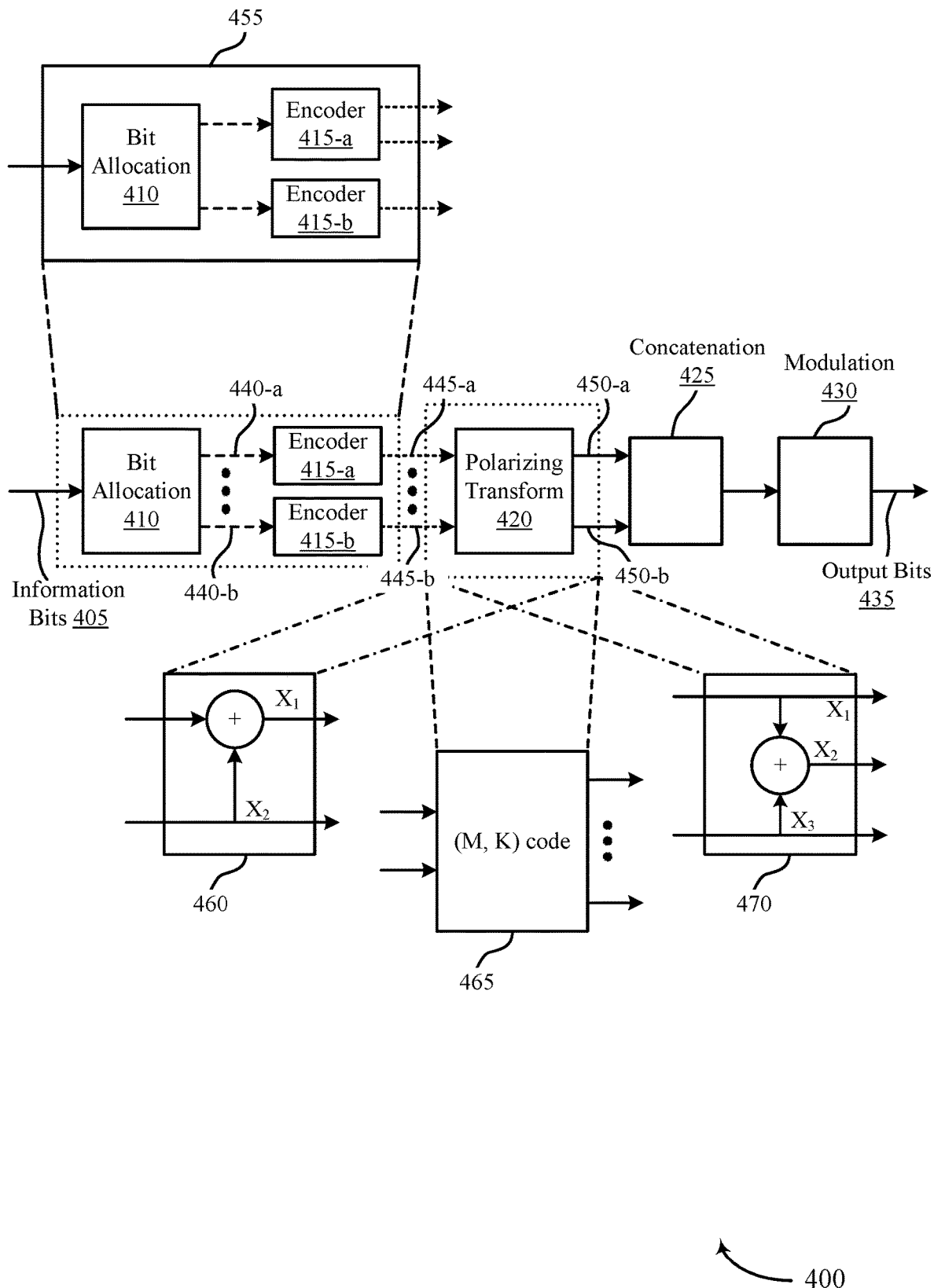
FIG. 4 illustrates an example of an encoding scheme that supports polarization adjusted channel coding design for complexity reduction in accordance with one or more aspects of the present disclosure.

FIG. 4 illustrates an example of an encoding scheme 400 that supports polarization adjusted channel coding design for complexity reduction in accordance with one or more aspects of the present disclosure. The encoding scheme 400 may implement an information bit allocation scheme in accordance with the techniques described herein. For example, the encoding scheme 400 may be implemented by a transmitting device, such as a network entity 105 or a UE 115 as described with reference to FIGS. 1 and 2, to encode information bits before transmission over a communication channel. It should be noted that the principles described herein may be extended to any quantity and combination of encoders and components and are not limited to those illustrated by FIG. 4.

The encoding scheme 400 may include a series of components with which a transmitting device may encode a set of information bits 405 in accordance with the techniques described herein. As illustrated, the encoding scheme 400 includes bit allocation 410, encoders 415, a polarizing transform 420, concatenation 425, and modulation 430. As described with reference to FIG. 2, the transmitting device may identify a set of information bits 405 to be transmitted to a receiving device, e.g., via a channel. Additionally, the transmitting device may determine a quantity of information bits k of the set of information bits 405, an effective coding rate R for the channel, and a mutual information polarization function, such as Equation 3. The transmitting device may also identify or otherwise determine a quantity of polarization levels for the polarizing transform 420, where each polarization level may be associated with a respective channel reliability (e.g., channel quality).

At bit allocation 410, the transmitting device may partition (e.g., split) the set of information bits 405 into two or more subsets of bits 440 based on k, R, and Equation 3, and the subsets of bits 440 may correspond to a set of polarization levels. For example, the transmitting device may calculate a quantity of subsets of bits 440 into which the set of information bits 405 is split, which may be equal to a quantity of coding levels $M_i$. As illustrated in FIG. 4, the transmitting device may split the set of information bits 405 into at least a first subset of bits 440-a and a second subset of bits 440-b, such that M=2. Here, the first subset of bits 440-a may correspond to a first polarization level and the second subset of bits 440-b may correspond to a second polarization level.

Additionally, the transmitting device may determine a respective quantity of information bits $k_i$ to be allocated to each subset of bits 440 (e.g., based on k, R, and Equation 3). For instance, the transmitting device may allocate a first quantity of information bits $k_1$ to the first subset of bits 440-a based on k, R, and a first mutual information polarization function (e.g., using Equation 3). The transmitting device may allocate a second quantity of information bits $k_2$ to the second subset of bits 440-b based on k, R, and a second mutual information polarization function (e.g., using Equation 3). In some examples, the transmitting device may unequally allocate information bits to each subset of bits 440, e.g., based on an information allocation algorithm. In any case, a subset of bits 440 may be understood as a vector of information bits having a length $k_i$.

In some examples, the transmitting device may allocate the set of information bits 405 based on the polarizing transform 420. For example, when the polarizing transform 420 is a polar code (e.g., based on a polar kernel), as described with reference to FIG. 3, the transmitting device may apply Equation 3 recursively to determine the quantity of information bits $k_i$ to be allocated to each subset of bits 440. That is, the transmitting device may determine a quantity of information bits $k_i$ to include in a subset of bits 440 based on a quantity of information bits $k_{i-1}$ included in a previously-allocated subset of bits 440. For instance, the transmitting device may allocate the first quantity of information bits $k_1$ to the first subset of bits 440-a based on k and R. The transmitting device may allocate the second quantity of information bits $k_2$ to the second subset of bits 440-b based on $k_1$. The transmitting device may allocate a third quantity of bits $k_3$ to a third subset of bits 440 based on $k_2$, and so on, for each subset of bits 440.

As a specific, non-limiting example, when M=4, the transmitting device may first split the set of information bits 405 into the first subset of bits 440-a having a quantity of information bits $k_1$ and the second subset of bits 440-b having a quantity of information bits $k_2$. Using Equation 4 below, the transmitting device may split the first subset of bits 440-a into a third subset of bits and a fourth subset of bits having quantities of information bits $k_{11}$ and $k_{12}$, respectively, where $k_{11}+k_{12}=k_1$. The transmitting device may also split the second subset of bits 440-b into a fifth subset of bits and a sixth subset of bits having quantities of information bits $k_{21}$ and $k_{22}$, respectively, where $k_{21}+k_{22}=k_2$.

$$k_{11} = \frac{k_1 I^-(R_1)}{2R_1}, k_{12} = \frac{k_1 I^+(R_1)}{2R_1}, k_{21} = \frac{k_2 I^-(R_2)}{2R_2}, k_{11} = \frac{k_2 I^+(R_2)}{2R_2} \quad (4)$$

Based on the bit allocation 410, the encoders 415 may separately encode each subset of bits 440 according to a respective channel coding scheme (i.e., encoding technique) and using a corresponding coding rate. That is, a vector of information bits corresponding to a subset of bits 440 may be input to an encoder 415. As illustrated in FIG. 4, the encoder 415-a may encode the first subset of bits 440-a according to a first channel coding scheme and using a first coding rate, the encoder 415-b may encode the second subset of bits 440-b according to a second channel coding scheme and using a second coding rate, and so on, for each subset of bits 440.

The first channel coding scheme and the second channel coding scheme may each be an example of at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof, among other examples.

In some cases, the encoder 415-*a* may have a different channel coding scheme, a different coding rate, or both, than the encoder 415-*b*. For instance, the encoder 415-*a* and the encoder 415-*b* may both use a same channel coding scheme, but the encoder 415-*a* may use a first coding rate different than a second coding rate used by the encoder 415-*b*. Alternatively, each encoder 415 may have a channel coding scheme different than other encoders 415.

The transmitting device may select a channel coding scheme and a coding rate for each encoder 415. For instance, the transmitting device may calculate or otherwise select a coding rate $R_i$ for a given coding level based on k, R, and the mutual information polarization function (e.g., Equation 3). Additionally, in some examples, the transmitting device may select a channel coding scheme based on comparing $R_i$ to a threshold coding rate value. Here, if $R_i < R_{max}$, the transmitting device may select a channel coding scheme associated with relatively lower coding rates (e.g., values of $R_i$), while if $R_i > R_{max}$, the transmitting device may select a channel coding scheme associated with relatively higher coding rates (e.g., values of $R_i$).

In some examples, the transmitting device may select an encoder 415 into which a subset of bits 440 may be input based on the channel coding scheme, the coding rate, a corresponding subset of coding levels, a channel reliability of an associated polarization level, or a combination thereof, among other examples. For example, the transmitting device may determine that a first subset of coding levels may correspond to one or more polarization levels having a relatively low channel reliability and a second subset of coding levels may correspond to one or more polarization levels having a relatively high channel reliability. Accordingly, the transmitting device may determine that the first subset of coding levels is associated with a first channel coding scheme and the second subset of coding levels is associated with a second channel coding scheme.

The first channel coding scheme may be different than the second channel coding scheme. For example, the transmitting device may select an LDPC channel coding scheme to be used as the first channel coding scheme based on the relatively low channel reliability associated with the first subset of coding levels, and may select a Reed-Solomon channel coding scheme as the second channel coding scheme based on the relatively high channel reliably associated with the second subset of coding levels.

The transmitting device may assign the first subset of bits 440-*a* to the first subset of coding levels and the second subset of bits 440-*b* to the second subset of coding levels (e.g., based on respective polarization levels). Additionally, the transmitting device may determine that the encoder 415-*a* is associated with the first subset of coding levels, while the encoder 415-*b* is associated with the second subset of coding levels. Accordingly, the transmitting device may input the first subset of bits 440-*a* to the encoder 415-*a* such that the encoder 415-*a* encodes the first subset of bits 440-*a* in accordance with the first channel coding scheme. The transmitting device may input the second subset of bits 440-*b* to the encoder 415-*b*, which may encode the second subset of bits 440-*b* according to the second channel coding scheme.

Alternatively, in some examples, the transmitting device may refrain from encoding the second subset of bits 440-*b* using the encoder 415-*b*. That is, the second subset of bits 440-*b* may remain unencoded.

The encoders 415-*a* and 415-*b* may each output a respective encoded subset of bits 445-*a* and 445-*b* having respective quantities of bits $k_1$ and $k_2$. The encoded subsets of bits 445-*a* and 445-*b* may be input to the polarizing transform 420. In some examples, the transmitting device may perform a CRC for each coding level. For example, the transmitting device may perform a first CRC using the first encoded subset of bits 445-*a* and may perform a second CRC using the second encoded subset of bits 445-*b*.

The encoded subsets of bits 445 may correspond to the set of polarization levels. That is, the polarization levels may represent inputs to the polarizing transform 420, where a quantity of polarization levels is equal to a quantity of encoded subsets of bits 445. Put another way, the polarization levels may correspond to channel instances of the polarizing transform 420 onto which encoded bits (e.g., encoded subsets of bits 445) may be loaded. As illustrated in FIG. 4, the polarizing transform 420 may receive two inputs of encoded bits 445, e.g., may have two polarization levels.

Example portion 455 of FIG. 4 illustrates an alternative bit allocation 410 and set of coding levels for encoders 415-*a* and 415-*b*. Here, the transmitting device may allocate the set of information bits 405 into a first subset of bits, a second subset of bits, and a third subset of bits. The first subset of bits and the second subset of bits may each have a quantity of information bits equal to $k_1$, and the third subset of bits may have a quantity of information bits equal to $k_2$. Additionally, the first, second and third subsets of bits may each correspond to a first, second, and third polarization level, respectively. The first and second polarization levels may be associated with a first channel reliability (e.g., a same channel reliability), while the third polarization level may be associated with a second channel reliability different than the first channel reliability.

In example portion 455, because the first and second subsets of bits are both associated with a same channel reliability, the transmitting device may jointly encode the first and second subsets of bits using the encoder 415-*a* and in accordance with a first channel coding scheme. The transmitting device may encode the third subset of bits separately from the first and second subsets of bits, e.g., using the encoder 415-*b* and in accordance with a second channel coding scheme. The encoder 415-*a* may output the encoded first subset of bits separately from the encoded second subset of bits, such that the polarizing transform 420 may receive three inputs (e.g., the encoded first subset of bits, the encoded second subset of bits, and the encoded third subset of bits).

The polarizing transform 420 may receive, as inputs, encoded subsets of bits 445 corresponding to polarization levels. That is, the transmitting device may apply the polarizing transform 420 across the encoded subsets of bits 445-*a* and 445-*b*. For example, as described with reference to FIG. 3, the transmitting device may assign a first encoded bit of the encoded subset of bits 445-*a* to a first bit location corresponding to the first polarization level. The transmitting device may assign a first encoded bit of the encoded subset of bits 445-*b* to a first bit location corresponding to the second polarization level, and so on.

In determining which bit location (e.g., and corresponding polarization level) to load a given encoded bit, the transmitting device may consider a coding rate of the channel coding scheme of the encoded bit and the reliability of the polarization level. For example, the transmitting device may assign an encoded bit to a polarization level having a relatively high reliability if the encoded bit was encoded using a relatively high coding rate (e.g., associated with relatively low redundancy). In doing so, the transmitting device may increase the likelihood that the encoded bit may be successfully decoded at a receiving device. Likewise, the transmitting device may assign an encoded bit that was encoded using a relatively low coding rate (e.g., associated with high redundancy) to a polarization level having a relatively low reliability. In this manner, the transmitting device may strategically adjust respective likelihoods of successful decoding of encoded bits.

In some examples, the polarizing transform 420 may be an example of a polar code and may be based on a polar kernel, e.g., as illustrated in FIG. 3. However, the techniques described herein may support other examples of transforms that polarize the channel. That is, the polarizing transform 420 may be an example of any general one-to-one polarizing transform, e.g., that transforms an input vector U of a length M to an output vector X having the same length M and provides uneven channel reliabilities for the polarization levels.

For a given quantity of polarization levels M, a general polarizing transform may be any arbitrary M×M matrix. Additionally, M may be any integer, provided that the matrix is a binary transform and is invertible. For example, for M=3, an example transform may be illustrated by Equation 5. An input vector U (e.g., corresponding to an encoded subset of bits 445) may be input to the example transform to obtain an output vector X.

$$[x_1 \ x_2 \ x_3] = [u_1 \ u_2 \ u_3] = \begin{bmatrix} 1 & 0 & 0 \\ 1 & 1 & 0 \\ 1 & 1 & 1 \end{bmatrix} \quad (5)$$

In the example of FIG. 4, example transforms 460, 465, and 470 illustrate various options for the polarizing transform 420. In each example transform 460, 465, and 470, the encoded subsets of bits 445 may be input to a polarizing transform. Example transform 460, for example, illustrates a polar code, in which an information rate may be used as a mutual information input (e.g., to polarization levels corresponding to $U_1$ and $U_2$). The mutual information output (e.g., $X_1$ and $X_2$) may polarize based on the functions associated with the example transform 460. For example, $X_1$ may correspond to an output after XOR operation (e.g., W⁻) and $X_2$ may correspond to an output after repetition (e.g., W⁺).

Put another way, in example transform 460, the encoded subset of bits 445-$a$ may be represented by a vector U including bits [$u_1$, $u_2$ . . . $u_i$] having a length equal to $k_1$. The vector U (e.g., a bit $u_1$ of the vector U) may be input to a first polarization level of the example transform 460. The encoded subset of bits 445-$b$ may be represented by a vector V including bits [$v_1$, $v_2$ . . . $v_i$] having a length equal to $k_2$. The vector V (e.g., a bit $v_1$ of the vector V) may be input to a second polarization level. The first polarization level may include the XOR operation as illustrated. A bit $X_1$ output from the first polarization level may be equal to $v_1+u_1$, while a bit $X_2$ output from the second polarization level may be equal to $v_1$.

In example transform 465, the polarizing transform may be an example of an (M, K) code, which may be an injective code that is not a one-to-one code. That is, M<K. Here, the encoding scheme 400 may be an example of a concatenated coding scheme in which the channel coding schemes of the encoders 415 may be understood as an "outer" error correction code and the (M, K) code may be understood as one or more inner error correction codes. The encoded subsets of bits 445-$a$ and 445-$b$ may be jointly encoded in accordance with the (M, K) code(s). More specifically, a first bit from the encoded subset of bits 445-$a$ may be jointly encoded with a second bit from the encoded subset of bits 445-$b$ using a first outer error correction code, and a third bit from the encoded subset of bits 445-$a$ may be jointly encoded with a fourth bit from the encoded subset of bits 445-$b$ using a second outer error correction code.

Example transform 470 illustrates a polarizing transform implemented by a (2, 3) simplex code, which may be represented by (u, u⊕v, v). In this example, the effective coding rate R may be given by Equation 6.

$$R = \frac{k_1 + k_2}{3N} \quad (6)$$

Additionally, the mutual information polarization function for the simplex code may be given by Equation 7.

$$R_1 = I(u; x_1, x_2, x_3) \text{ and } R_2 = I(v; x_1, x_2, x_3 | u) \quad (7)$$

The transmitting device may determine an information bit allocation for the simplex code based on Equations 6 and 7. For example, when the polarizing transform 420 is an example of a simplex code, the bit allocation 410 may be based on Equations 6 and 7, such that the subset of bits 440-$a$ may include a quantity of bits $k_1$ and the subset of bits 440-$b$ may include a quantity of bits $k_2$, e.g., in accordance with Equation 8.

$$\frac{k_1}{k_1} = \frac{R_1}{R_2} \text{ and } R_1 + R_2 = 3R = \frac{k_1 + k_2}{3N} \quad (8)$$

The vector U (e.g., a bit $u_1$ of the vector U) may be input to a first polarization level of the example transform 470. The vector V (e.g., a bit $v_1$ of the vector V) may be input to a second polarization level. Output bits $X_1$, $X_2$, and $X_3$ may be output based on operations associated with the example transform 470. For example, a bit $X_1$ output from the first polarization level may be equal to $u_1$, while a bit $X_3$ output from the third polarization level may be equal to $v_1$. A bit $X_2$ may also be output and may be equal to $u_1 \oplus v_1$. The output vector X may therefore have a length greater than the length of the input vectors U and V. That is, the example transform 470 may be an example of an injective code and may add redundancy to the encoded subsets of bits 445.

Additionally, although a simplex code is generally symmetric for u and v (e.g., the simplex code provides a same degree of reliability for the two information bits $u_1$ and $v_1$), the techniques described herein may support asymmetric application of the simplex code. For example, a receiving device may decode the encoded subsets of bits 445 in accordance with a simplex code by first decoding $u_1$. The receiving device may then perform successive cancellation to cancel $u_1$, and may subsequently decode $v_1$. Here, a reliability of an information bit mapped to $v_1$ may be higher than a reliability of an information bit mapped to $u_1$. Such asymmetric design may be beneficial from a complexity perspective, e.g., may reduce an overall complexity for decoding at the receiving devices.

An alternative approach may be implemented by treating the two polarization levels in example transform 470 as symmetric. In this case, a same number of information bits may be allocated to encoder 415-*a* and 415-*b*, and the two encoders 415 may use the same coding rate. The coding rate of each coding level in this example may be given by $R_1=R_2=R*3/2$, where R denotes an end-to-end effective coding rate of the concatenated system.

The polarizing transform 420 may output polarized encoded subsets of bits 450-*a* and 450-*b*. To transmit a message including a set of output bits 435 corresponding to the set of information bits 405, the transmitting device may concatenate the polarized encoded subsets of bits 450-*a* and 450-*b* at concatenation 425. The concatenated bits may be modulated at modulation 430. That is, the set of output bits 435 may include one or more subsets of polarized encoded bits output from the polarizing transform 420 which are then concatenated and modulated. The transmitting device may transmit the set of output bits 435 to a receiving device, which may depolarize, decode, and process the received set of output bits 435 to obtain a set of bits corresponding to the information bits 405.

Figure 5:
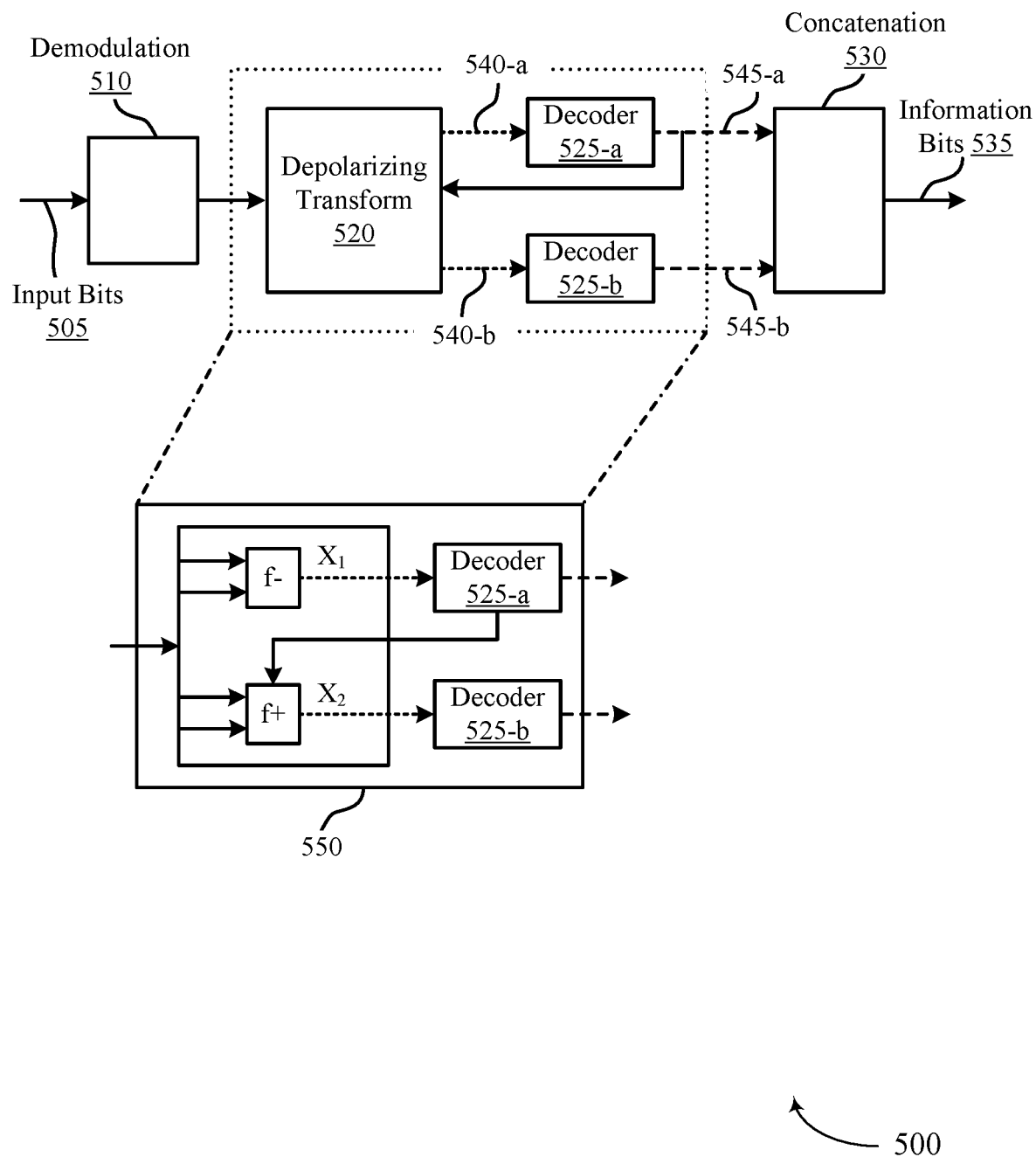
FIG. 5 illustrates an example of a decoding scheme that supports polarization adjusted channel coding design for complexity reduction in accordance with one or more aspects of the present disclosure.

FIG. 5 illustrates an example of a decoding scheme 500 that supports polarization adjusted channel coding design for complexity reduction in accordance with one or more aspects of the present disclosure. The decoding scheme 500 may be implemented by a receiving device, such as a network entity 105 or a UE 115 as described with reference to FIGS. 1 and 2, to decode a set of bits received (e.g., from a transmitting device) over a communication channel in accordance with the techniques described herein. For example, the decoding scheme 500 may be an example decoding scheme implemented by a receiving device to decode a set of bits encoded at a transmitting device as described with reference to FIG. 4. The decoding scheme 500 may implement the procedures and operations of the encoding scheme 400 in reverse. It should be noted that the principles described herein may be extended to any quantity and combination of decoders and components and are not limited to those illustrated by FIG. 5.

The receiving device may receive an encoded set of bits corresponding to a set of information bits. The decoding scheme 500 may include a series of components used by the receiving device to decode the encoded set of bits to obtain the set of information bits 535. As illustrated, the decoding scheme 500 includes demodulation 510, depolarizing transform 520, decoders 525, and concatenation 530. The receiving device may input the encoded set of bits to the decoding scheme 500 as a set of input bits 505. The receiving device may demodulate the set of input bits 505 at demodulation 510, and may input the demodulated bits to a depolarizing transform 520.

The depolarizing transform 520 may depolarize the demodulated bits based on a set of polarization levels. Additionally, the receiving device may perform interference cancellation using the depolarizing transform 520. The depolarizing transform 520 may output multiple subsets of bits 540 (e.g., multiple subsets of log-likelihood ratios (LLRs)) corresponding to the set of polarization levels. For example, as described with reference to FIG. 2, the depolarizing transform 520 may output a first subset of bits 540-*a* and a second subset of bits 540-*b*. In some examples, the quantity of the set of polarization levels may be equal to a quantity of the multiple subsets of bits 540, and each polarization level may correspond to a respective subset of bits 540.

Each subset of bits 540 may include a quantity of information bits $k_i$. During the depolarizing transform 520, the receiving device may determine the quantity of information bits $k_i$ included in each subset of bits 540 based on a total quantity of information bits k included in the set of information bits 535 and an effective coding rate R associated with one or more decoding procedures for the set of information bits, e.g., using Equation 2. Additionally, the receiving device may determine a respective coding rate $R_i$ and/or capacity of a corresponding polarization level $l_i$ for each subset of bits 540 based on the conditional mutual information function (e.g., a mutual information polarization function) given by Equation 3.

In some examples, the depolarizing transform 520 may be an example of a polar code and may be based on a polar kernel, e.g., as illustrated in FIG. 3. However, the techniques described herein may support other examples of transforms that depolarize the channel. That is, the depolarizing transform 520 may be an example of any general one-to-one depolarizing transform.

Alternatively, in some examples, the depolarizing transform 520 may include or be an example of an inner error correction code, e.g., the receiving device may apply the depolarizing transform 520 by decoding the subsets of bits 540-*a* and 540-*b* using an inner error correction code. For instance, the depolarizing transform 520 may be an example of an (M, K) code, which may be an injective code that is not a one-to-one code. That is, M<K. The depolarizing transform 520 may include jointly decoding the subsets of bits 540 in accordance with the (M, K) code(s). More specifically, a first bit from the subset of bits 540-*a* may be jointly decoded with a second bit from the subset of bits 540-*b* using a first inner error correction code, and a third bit from the subset of bits 540-*a* may be jointly encoded with a fourth bit from the subset of bits 540-*b* using a second inner error correction code. In some other examples, the inner error correction code of the depolarizing transform 520 may be an example of a simplex code, such as a (2, 3) simplex code.

After performing the depolarizing transform 520, the receiving device may input the first subset of bits 540-*a* to a decoder 525-*a* and the second subset of bits 540-*b* to a decoder 525-*b*. The decoders 525 may each implement a respective channel decoding scheme, coding rate, or a combination thereof. For example, the receiving device may select a first channel decoding scheme for the decoder 525-*a* based on a coding rate $R_1$ associated with the first subset of bits 540-*a*. The receiving device may select a second channel decoding scheme for the second decoder 525-*b* based on a coding rate $R_2$ associated with the second subset of bits 540-*b*, and so on.

Additionally, or alternatively, the receiving device may select a channel decoding scheme for a decoder 525 based on a coding level (or subset of coding levels) associated with a subset of bits 540. In some cases, a subset of coding levels may be associated with a channel decoding scheme based on a channel reliability of a corresponding polarization level. For example, the first subset of bits 540-*a* may be included in a first subset of coding levels that is associated with a first channel decoding scheme (e.g., LDPC). Accordingly, the decoder 525-*a* may decode the first subset of bits 540-*a* in accordance with the first channel decoding scheme.

Using the decoders 525, the receiving device may sequentially decode the multiple subsets of bits 540 in accordance with the selected decoding schemes and decoding rates and based on the depolarizing transform 520. For instance, the receiving device may implement multi-stage decoding. Here, the decoder 525-*a* may decode the first subset of bits 540-*a* (e.g., output from the depolarizing transform 520 and associated with a first polarization level) based on the first channel decoding scheme and using a first coding rate. The decoder 525-*a* may output a first decoded subset of bits 545-*a*. The receiving device may input the first decoded subset of bits 545-*a* into the depolarizing transform 520, such that the decoder 525-*b* may decode the second subset of bits 540-*b* based on the first decoded subset of bits 545-*a* (e.g., and using the second channel decoding scheme and a second coding rate).

In general, the receiving device may decode a subset of bits 540 associated with a polarization level using any previously-decoded subsets of bits 545 associated with prior polarization levels. That is, a decoder 525 may decode a subset of bits 540 associated with a polarization level $M_i$ (e.g., of a set of polarization levels M) based on one or more decoded subsets of bits 545 associated with polarization levels $M_i$ to $M_{M-1}$.

In some examples, the receiving device may perform a CRC for each decoded subset of bits. For example, the receiving device may perform a first CRC using a first decoded subset of bits 545-*a* and may perform a second CRC using a second decoded subset of bits 545-*b*.

Example transform 550 illustrates an alternative option for the depolarizing transform 520. Here, the depolarizing transform 520 may include a first depolarizing component $f^-$ and a second depolarizing component $f^+$. In this example, demodulation 510 may generate a set of LLR values corresponding to the set of input bits 505 (e.g., corresponding to the encoded set of information bits received from a transmitting device).

For example, the transmitting device may encode and polarize a first subset of bits corresponding to a vector U and a second subset of bits corresponding to a vector V' as described with reference to FIG. 4, e.g., using example transform 460. The set of input bits 505 received from the transmitting device may therefore include a first subset of encoded polarized bits corresponding to V+U and a second subset of encoded polarized bits corresponding to V. Demodulation 510 may generate the set of LLR values corresponding to V+U and V and may input the set of LLR values to the example transform 550. The set of LLR values may have a quantity of LLR values equal to twice the length of the set of input bits 505.

The receiving device may obtain a first subset of LLR values corresponding to the vector U based on the first depolarizing component $f^-$ of the example transform 550 and the set of LLR values. Based on the first subset of LLR values, the decoder 525-*a* may decode the first subset of bits 540-*a* to obtain a decoded first subset of bits 545-*a*. The decoded first subset of bits 545-*a* may correspond to the subset of bits included in the vector U. The decoder 525-*a* may input the decoded first subset of bits 545-*a* into the example transform 550, e.g., into the second depolarizing component $f^+$. The receiving device may obtain a second subset of LLR values corresponding to the vector V based on the decoded first subset of bits 545-*a*, the set of LLR values, and the second depolarizing component $f^-$. Based on the second subset of LLR values, the decoder 525-*b* may decode the second subset of bits 540-*b* to obtain a decoded second subset of bits 545-*b*. The receiving device may recursively perform this procedure for each subset of bits 540 until all subsets of bits 540 have been decoded.

The decoders 525 may output the decoded subsets of bits 545. At concatenation 530, the receiving device may process the decoded subsets of bits 545 by concatenating one or more decoded subsets of bits 545 including at least the first decoded subset of bits 545-*a* and the second decoded subset of bits 545-*b*. Concatenation 530 may output a set of information bits 535 corresponding to the set of information bits transmitted by the transmitting device.

Figure 6:
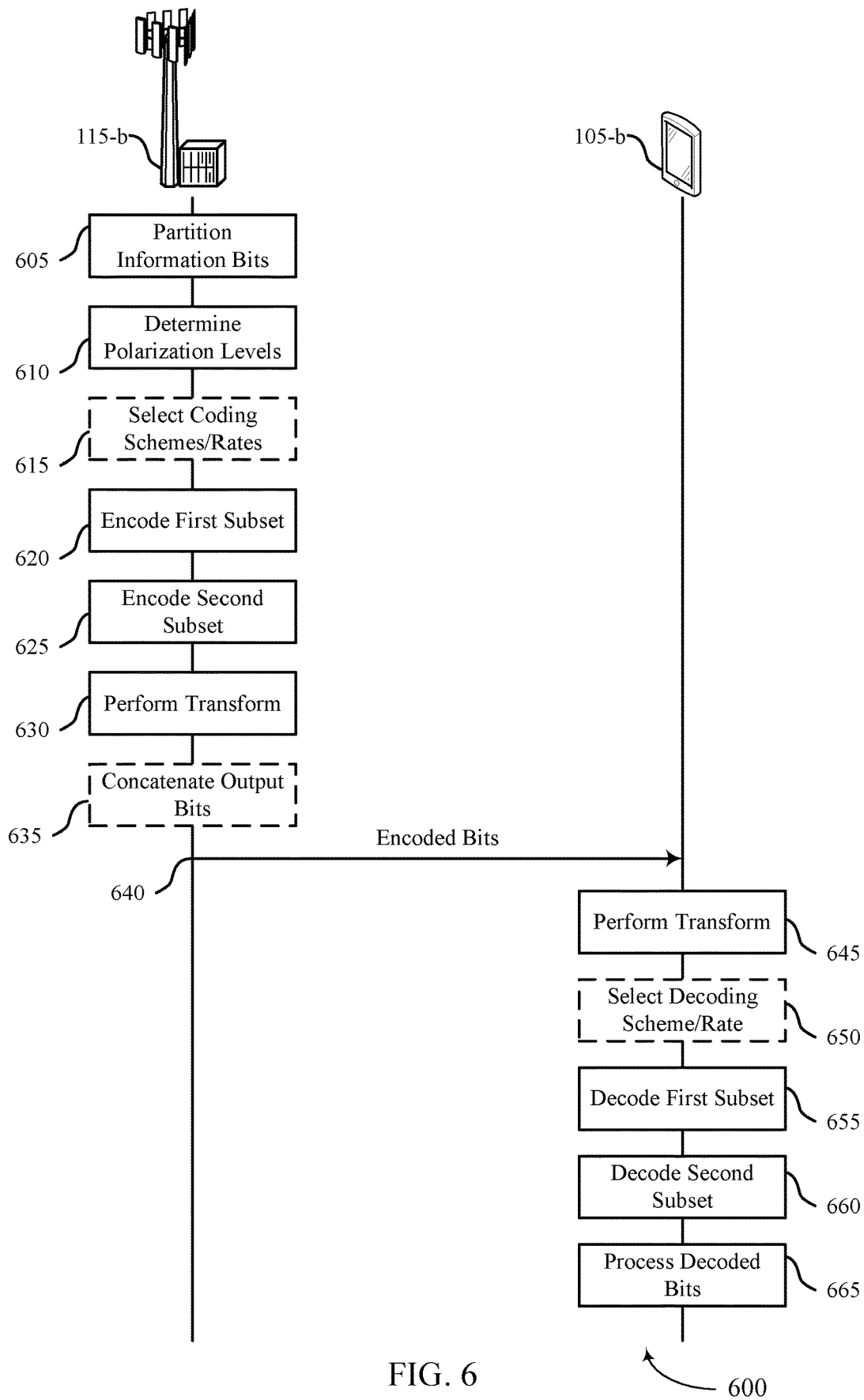
FIG. 6 illustrates an example of a process flow that supports polarization adjusted channel coding design for complexity reduction in accordance with one or more aspects of the present disclosure.

FIG. 6 illustrates an example of a process flow 600 that supports polarization adjusted channel coding design for complexity reduction in accordance with one or more aspects of the present disclosure. The process flow 600 may implement or be implemented to realize aspects of the wireless communications system 100, the wireless communications system 200, the encoder 300, the encoding scheme 400, or the decoding scheme 500. For example, the process flow 600 illustrates communication between a UE 115-*b* and a network entity 105-*b*, which may be examples of UEs 115 and network entities 105 as described herein. Additionally, the UE 115-*b* may be an example of a receiving device, and the network entity 105-*b* may be an example of a transmitting device.

In the following description of the process flow 600, the operations may be performed (e.g., reported or provided) in a different order than the order shown, or the operations performed by the example devices may be performed in different orders or at different times. Some operations also may be omitted from the process flow 600, or other operations may be added to the process flow 600. Further, although some operations or signaling may be shown to occur at different times for discussion purposes, these operations may actually occur at the same time or otherwise concurrently.

At 605, the network entity 105-*b* may partition a set of information bits (e.g., that are to be transmitted to the UE 115-*b*) into multiple subsets of bits corresponding to multiple polarization levels. The multiple subsets of bits may include at least a first subset of bits and a second subset of bits.

In some examples, the network entity 105-*b* may partition the set of information bits based on a quantity of coding levels, which may be associated with one or more encoding procedures for the set of information bits. In such examples, the network entity 105-*b* may partition the set of information bits into a quantity of subsets of bits that is equal to the quantity of coding levels. The network entity 105-*b* may additionally determine one or more subsets of coding levels. For example, the network entity 105-*b* may determine a first subset of coding levels and a second subset of coding levels.

The network entity 105-*b* may determine or otherwise identify a respective quantity of information bits of the set of information bits to be included in each subset of bits. For example, the network entity 105-*b* may determine a first quantity of information bits included in the first subset of bits and a second quantity of information bits included in the second subset of bits. In some cases, the network entity 105-*b* may determine the first quantity of information bits and the second quantity of information bits (e.g., and any additional quantities of information bits) based on a total quantity of information bits of the set of information bits and an effective coding rate associated with one or more encoding procedures for the set of information bits.

In some cases, the network entity 105-*b* may recursively determine one or more of the quantities of information bits. For example, at 625, the network entity 105-*b* may perform a polarizing transform, based on a polar code, on the subsets of bits. In such examples, at 605, the network entity 105-*b* may determine the first quantity of information bits based on the total quantity of information bits of the set of information bits and the effective coding rate. The network entity 105-*b* may determine the second quantity of bits based on the first quantity of information bits, a third quantity of bits based on the second quantity of information bits (e.g., and the total quantity of information bits and the effective coding rate), and so on.

At 610, the network entity **105-*b* may determine or otherwise identify a set of polarization levels for a polarizing transform (e.g., to be performed at 625). Each subset of bits (e.g., partitioned at 605) may correspond to a polarization level. For example, the first subset of bits may be associated with a first polarization level of the set of polarization levels and the second subset of bits may be associated with a second polarization level of the set of polarization levels. The set of polarization levels may include a quantity of polarization levels. In some cases, the quantity of polarization levels may be equal to a quantity of encoded subsets of bits (e.g., output after encoding at 620 and 625**).

In some examples, the network entity **105-*b* may determine the respective quantities of information bits at 605 based on one or more polarization levels of the set of polarization levels determined at 610. For example, the network entity 105-*b* may determine a first mutual information polarization function for the first polarization level. The first mutual information polarization function may be based on the effective coding rate and a capacity of the first polarization level. The network entity 105-*b* may determine the first quantity of information bits at 605 based on the first mutual information polarization function. The network entity 105-*b* may additionally determine a second mutual information polarization function for the second polarization level, where the second mutual information polarization function is based on the effective coding rate and a capacity of the second polarization level. The network entity 105-*b* may determine the second quantity of information bits at 605** based on the second mutual information polarization function.

At 615, the network entity **105-*b* may select one or more channel coding schemes and one or more corresponding coding rates to be used for encoding the subsets of bits (e.g., at 620 and 625). The one or more channel coding schemes may include, but are not limited to, an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or some combination thereof. For example, the network entity 105-*b*** may select a first channel coding scheme for encoding the first subset of bits and a second channel coding scheme for encoding the second subset of bits. In some cases, the first channel coding scheme may be different from the second channel coding scheme. For example, the first channel coding scheme may be an LDPC coding scheme, and the second channel coding scheme may be a Reed-Solomon coding scheme.

In some cases, the one or more coding schemes selected at 615 may be associated with one or more coding levels or one or more subsets of coding levels. For example, the network entity **105-*b*** may determine that a first subset of coding levels is associated with the first channel coding scheme and a second subset of coding levels is associated with the second channel coding scheme. In some examples, a subset of coding levels may be associated with a channel coding scheme based on a channel reliability (e.g., a reliability metric) of a corresponding polarization level. For instance, the first subset of coding levels may be associated with the first channel coding scheme based on a channel reliability of the first polarization level, the second subset of coding levels may be associated with the second channel coding scheme based on a channel reliability of the second polarization level, and so on.

The network entity **105-*b* may select a respective coding rate for each coding scheme. In some cases, the network entity 105-*b* may select a coding rate based on the effective coding rate (e.g., associated with one or more encoding procedures for the set of information bits) and a mutual information polarization function. The network entity 105-*b* may, for example, select a first coding rate for the first coding scheme and a second coding rate for the second coding scheme The network entity 105-*b* may thus select any combination of channel coding schemes and coding rates for the subsets of bits (e.g., partitioned at 605). That is, the network entity 105-*b* may select one or more channel coding schemes for one or more subsets of bits, and may select one or more coding rates for each channel coding scheme. For example, the network entity 105-*b* may select a single channel coding scheme and multiple coding rates, such that all subsets of bits are encoded (e.g., at 620 and 625**) in accordance with the single channel coding scheme, but some subsets of bits are encoded using a first coding rate and other subsets of bits are encoded using a second coding rate.

In some examples, the network entity **105-*b* may select a channel coding scheme based on a coding rate, such as the effective coding rate or a coding rate calculated for a corresponding coding level. For example, the network entity 105-*b* may calculate a respective coding rate for each coding level based on the mutual information polarization function and the effective coding rate. The network entity 105-*b* may select a channel coding scheme for a coding level (or subset of coding levels) based on the corresponding calculated coding rate. In some cases, the network entity 105-*b* may select a channel coding scheme for a coding level based on the calculated coding rate satisfying, or failing to satisfy, a threshold. For instance, the network entity 105-*b* may identify or otherwise determine a threshold coding rate and may compare a calculated coding rate (e.g., for a coding level) to the threshold coding rate. The network entity 105-*b*** may select a first channel coding scheme if the coding rate satisfies the threshold, and may select a second channel coding scheme if the coding rate fails to satisfy the threshold.

At 620, the network entity **105-*b* may encode the first subset of bits for the first polarization level according to the first channel coding scheme (e.g., selected at 615) and using the first coding rate. In some cases, the network entity 105-*b* may encode the first subset of bits based on the first subset of coding levels associated with the first channel coding rate. In some examples, at 620, the network entity 105-*b*** may perform a first CRC procedure using the first subset of bits.

At 625, the network entity **105-*b* may encode the second subset of bits for the second polarization level according to the second channel coding scheme (e.g., selected at 615) and using the second coding rate. In some cases, the network entity 105-*b* may encode the second subset of bits based on the second subset of coding levels associated with the second channel coding rate. In some examples, at 625, the network entity 105-*b*** may perform a second CRC procedure using the second subset of bits.

In some examples, at 625, the network entity **105-*b*** may jointly encode a third subset of bits of the multiple subsets of bits with the second subset of bits for a third polarization level of the plurality of polarization levels, e.g., in accordance with the second channel coding scheme and using the second coding rate.

At 630, the network entity 105-b may perform a polarizing transform using at least the encoded first subset of bits for the first polarization level and the encoded second subset of bits for the second polarization level to obtain a set of output bits corresponding to the set of information bits. The polarizing transform may be based on a polar code. In some examples, the network entity 105-b may perform the polarizing transform for multiple encoded subsets of bits corresponding to multiple channels, e.g., based on the quantity of polarization levels (e.g., determined at 610). In such examples, the quantity of polarization levels may be equal to a quantity of the multiple encoded subsets of bits. Additionally, in some examples (e.g., if the network entity 105-b jointly encoded a third subset of bits with the second subset of bits at 625), the network entity 105-b may perform the polarizing transform using the encoded third subset of bits.

In some cases, the network entity 105-b may perform the polarizing transform by encoding the first subset of bits and the second subset of bits using an inner error correction code, such as a simplex code. For example, the network entity 105-b may jointly encode a first bit from the first subset of bits and a second bit from the second subset of bits using a first inner error correction code, and may jointly encode a third bit from the first subset of bits and a fourth bit from the second subset of bits using a second inner error correction code.

At 635, the network entity 105-b may concatenate one or more sets of polarized bits output after performing the polarizing transform (e.g., at 630). The set of output bits may include the concatenated one or more sets of polarized bits.

At 640, the network entity 105-b may transmit the set of output bits. The UE 115-b may receive the set of output bits as an encoded set of bits corresponding to the set of information bits.

At 645, the UE 115-b may perform a depolarizing transform using the encoded set of bits (e.g., corresponding to the set of information bits) to obtain multiple subsets of bits corresponding to multiple polarization levels. The multiple subsets of bits may include at least a first subset of bits and a second subset of bits, and may, in some cases, be based on a quantity of coding levels associated with one or more decoding procedures for the set of information bits. In such cases, a quantity of the multiple subsets of bits may be equal to the quantity of coding levels. Additionally, in some examples, the UE 115-b may determine one or more subsets of coding levels, e.g., correspond to one or more channel decoding schemes.

In some cases, while performing the depolarizing transform, the UE 115-b may determine a respective quantity of bits included in each subset of bits. For example, the UE 115-b may determine a first quantity of bits included in the first subset of bits based on a total quantity of information bits of the set of information bits and an effective coding rate associated with one or more decoding procedures for the set of information bits. The UE 115-b may determine a second quantity of information bits included in the second subset of bits of the plurality of subsets based on the total quantity of information bits of the set of information bits and the effective coding rate.

In some examples, the UE 115-b may receive (e.g., from the network entity 105-b) a signal indicating the total quantity of information bits and the effective coding rate, and may determine the respective quantities of bits based on receiving the signal.

In some examples, the UE 115-b may determine the respective quantities of bits based on a mutual information polarization function. For example, the UE 115-b may determine a first mutual information polarization function for the first polarization level based on the effective coding rate and a capacity of the first polarization level. The UE 115-b may determine a second mutual information polarization function for the second polarization level based on the effective coding rate and a capacity of the second polarization level. The UE 115-b may determine the first quantity of information bits based on the first mutual information polarization function and may determine the second quantity of information bits based on the second mutual information polarization function.

Additionally, or alternatively, the depolarizing transform may be based on a polar code. Here, the UE 115-b may recursively determine the respective quantities of bits. For example, the UE 115-b may determine the second quantity of information bits based on the first quantity of information bits. The UE 115-b may determine a third quantity of information bits included in a third subset of the plurality of subsets based on the total quantity of information bits of the set of information bits, the effective coding rate, and the second quantity of information bits.

In some examples, the UE 115-b may perform the depolarizing transform for multiple encoded subsets of bits corresponding to multiple channels based on a quantity of polarization levels for the depolarizing transform. In such examples, the quantity of polarization levels may be equal to a quantity of the multiple encoded subsets of bits.

In some cases, the UE 115-b may perform the depolarizing transform by decoding the first subset of bits and the second subset of bits using an inner error correction code, such as a simplex code. For example, the UE 115-b may jointly decode a first bit from the first subset of bits and a second bit from the second subset of bits using a first inner error correction code, and may jointly decode a third bit from the first subset of bits and a fourth bit from the second subset of bits using a second inner error correction code.

At 650, the UE 115-b may select one or more channel decoding schemes and one or more corresponding coding rates to be used for decoding the multiple subsets of bits (e.g., at 655 and 660). The one or more channel decoding schemes may include, but are not limited to, an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or some combination thereof. For example, the UE 115-b may select a first channel decoding scheme for decoding the first subset of bits and a second channel decoding scheme for decoding the second subset of bits. In some cases, the first channel decoding scheme may be different from the second channel decoding scheme. For example, the first channel coding scheme may be an LDPC coding scheme, and the second channel coding scheme may be a Reed-Solomon coding scheme.

In some cases, the one or more decoding schemes selected at 650 may be associated with one or more coding levels or one or more subsets of coding levels. For example, the UE 115-b may determine that a first subset of coding levels is associated with the first channel decoding scheme and a second subset of coding levels is associated with the second channel decoding scheme. In some examples, a subset of coding levels may be associated with a channel decoding scheme based on a channel reliability (e.g., a reliability metric) of a corresponding polarization level. For instance, the first subset of decoding levels may be associated with the first channel decoding scheme based on a channel reliability of the first polarization level, the second subset of coding levels may be associated with the second channel decoding scheme based on a channel reliability of the second polarization level, and so on.

The UE 115-b may select a respective coding rate for each channel decoding scheme. In some cases, the UE 115-b may select a coding rate based on the effective coding rate (e.g., associated with one or more decoding procedures for the set of information bits) and a mutual information polarization function. The UE 115-b may, for example, select a first coding rate for the first channel decoding scheme and a second coding rate for the second channel decoding scheme.

In some examples, the UE 115-b may select a channel decoding scheme based on a coding rate, such as the effective coding rate or a coding rate calculated for a corresponding coding level. For example, the UE 115-b may calculate a respective coding rate for each coding level based on the mutual information polarization function and the effective coding rate. The UE 115-b may select a channel decoding scheme for a coding level (or subset of coding levels) based on the corresponding calculated coding rate. In some cases, the UE 115-b may select a channel decoding scheme for a coding level based on the calculated coding rate satisfying, or failing to satisfy, a threshold. For instance, the UE 115-b may identify or otherwise determine a threshold coding rate and may compare a calculated coding rate (e.g., for a coding level) to the threshold coding rate. The UE 115-b may select a first channel decoding scheme if the coding rate satisfies the threshold, and may select a second channel decoding scheme if the coding rate fails to satisfy the threshold.

At 655, the UE 115-b may decode the first subset of bits for the first polarization level according to the first channel decoding scheme (e.g., selected at 650) and using the first coding rate. In some cases, the UE 115-b may decode the first subset of bits based on the first subset of coding levels associated with the first channel coding rate. In some examples, at 655, the UE 115-b may perform a first CRC procedure using the first subset of bits.

At 660, the UE 115-b may decode the second subset of bits for the second polarization level according to the second channel decoding scheme (e.g., selected at 650) and using the second coding rate. In some cases, the UE 115-b may decode the second subset of bits based on the second subset of coding levels associated with the second channel coding rate. In some examples, at 660, the UE 115-b may perform a second CRC procedure using the second subset of bits.

In some examples, at 660, the UE 115-b may jointly decode a third subset of bits of the multiple subsets of bits with the second subset of bits for a third polarization level of the plurality of polarization levels, e.g., in accordance with the second channel decoding scheme and using the second coding rate.

At 665, the UE 115-b may process the decoded first subset of bits and the decoded second subset of bits to obtain a set of decoded bits corresponding to the set of information bits. For example, the UE 115-b may concatenate one or more subsets of decoded bits output from channel decoding schemes; the one or more subsets of bits may include at least the decoded first subset of bits and the decoded second subset of bits. The set of decoded bits may include the concatenated one or more subsets of decoded bits.

Figure 7:
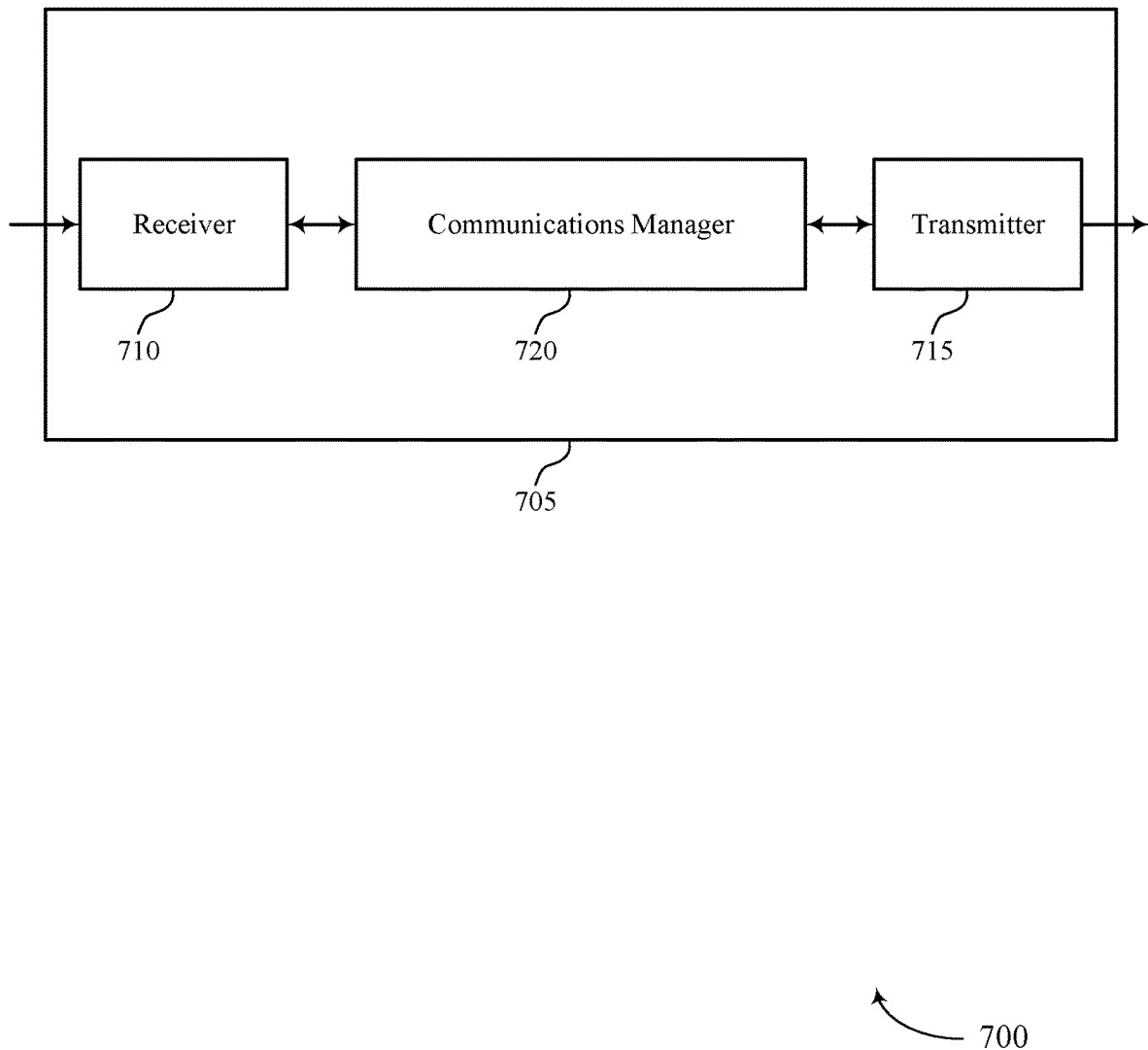
FIGS. 7 and 8 show block diagrams of devices that support polarization adjusted channel coding design for complexity reduction in accordance with one or more aspects of the present disclosure.

FIG. 7 shows a block diagram 700 of a device 705 that supports polarization adjusted channel coding design for complexity reduction in accordance with one or more aspects of the present disclosure. The device 705 may be an example of aspects of a network entity 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 705. In some examples, the receiver 710 may support obtaining information by receiving signals via one or more antennas. Additionally, or alternatively, the receiver 710 may support obtaining information by receiving signals via one or more wired (e.g., electrical, fiber optic) interfaces, wireless interfaces, or any combination thereof.

The transmitter 715 may provide a means for outputting (e.g., transmitting, providing, conveying, sending) information generated by other components of the device 705. For example, the transmitter 715 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 715 may support outputting information by transmitting signals via one or more antennas. Additionally, or alternatively, the transmitter 715 may support outputting information by transmitting signals via one or more wired (e.g., electrical, fiber optic) interfaces, wireless interfaces, or any combination thereof. In some examples, the transmitter 715 and the receiver 710 may be co-located in a transceiver, which may include or be coupled with a modem.

The communications manager 720, the receiver 710, the transmitter 715, or various combinations thereof or various components thereof may be examples of means for performing various aspects of polarization adjusted channel coding design for complexity reduction as described herein. For example, the communications manager 720, the receiver 710, the transmitter 715, or various combinations or components thereof may support a method for performing one or more of the functions described herein.

In some examples, the communications manager 720, the receiver 710, the transmitter 715, or various combinations or components thereof may be implemented in hardware (e.g., in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, the communications manager 720 may comprise a general processor, a modem processor, a DSP, or other dedicated hardware, or a combination thereof. In some examples, a processor and memory coupled with the processor may be configured to perform one or more of the functions described herein (e.g., by executing, by the processor, instructions stored in the memory).

Additionally, or alternatively, in some examples, the communications manager 720, the receiver 710, the transmitter 715, or various combinations or components thereof may be implemented in code (e.g., as communications management software or firmware) executed by a processor. If implemented in code executed by a processor, the functions of the communications manager 720, the receiver 710, the transmitter 715, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 720 may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications at a first wireless device in accordance with examples as disclosed herein. For example, the communications manager 720 may be configured as or otherwise support a means for partitioning a set of information bits into a set of multiple subsets of bits corresponding to a set of multiple polarization levels. The communications manager 720 may be configured as or otherwise support a means for encoding a first subset of bits of the set of multiple subsets for a first polarization level of the set of multiple polarization levels according to a first channel coding scheme. The communications manager 720 may be configured as or otherwise support a means for encoding a second subset of bits of the set of multiple subsets for a second polarization level of the set of multiple polarization levels according to a second channel coding scheme. The communications manager 720 may be configured as or otherwise support a means for performing a polarizing transform using the encoded first subset of bits for the first polarization level and the encoded second subset of bits for the second polarization level to obtain a set of output bits corresponding to the set of information bits. The communications manager 720 may be configured as or otherwise support a means for transmitting the set of output bits to a second wireless device.

By including or configuring the communications manager 720 in accordance with examples as described herein, the device 705 (e.g., a processor controlling or otherwise coupled with the receiver 710, the transmitter 715, the communications manager 720, or a combination thereof) may support techniques for reduced complexity in channel coding schemes. For example, the device 705 may combine polarization techniques (e.g., polarizing transforms) with channel coding schemes and coding rates associated with reduced complexity, such that the device 705 may transmit encoded bits without reducing the likelihood that a receiving device successfully receives the encoded bits. Additionally, reducing complexity of the channel coding schemes may correspond to reduced processing, decreased power consumption, and improved efficiency.

Figure 8:
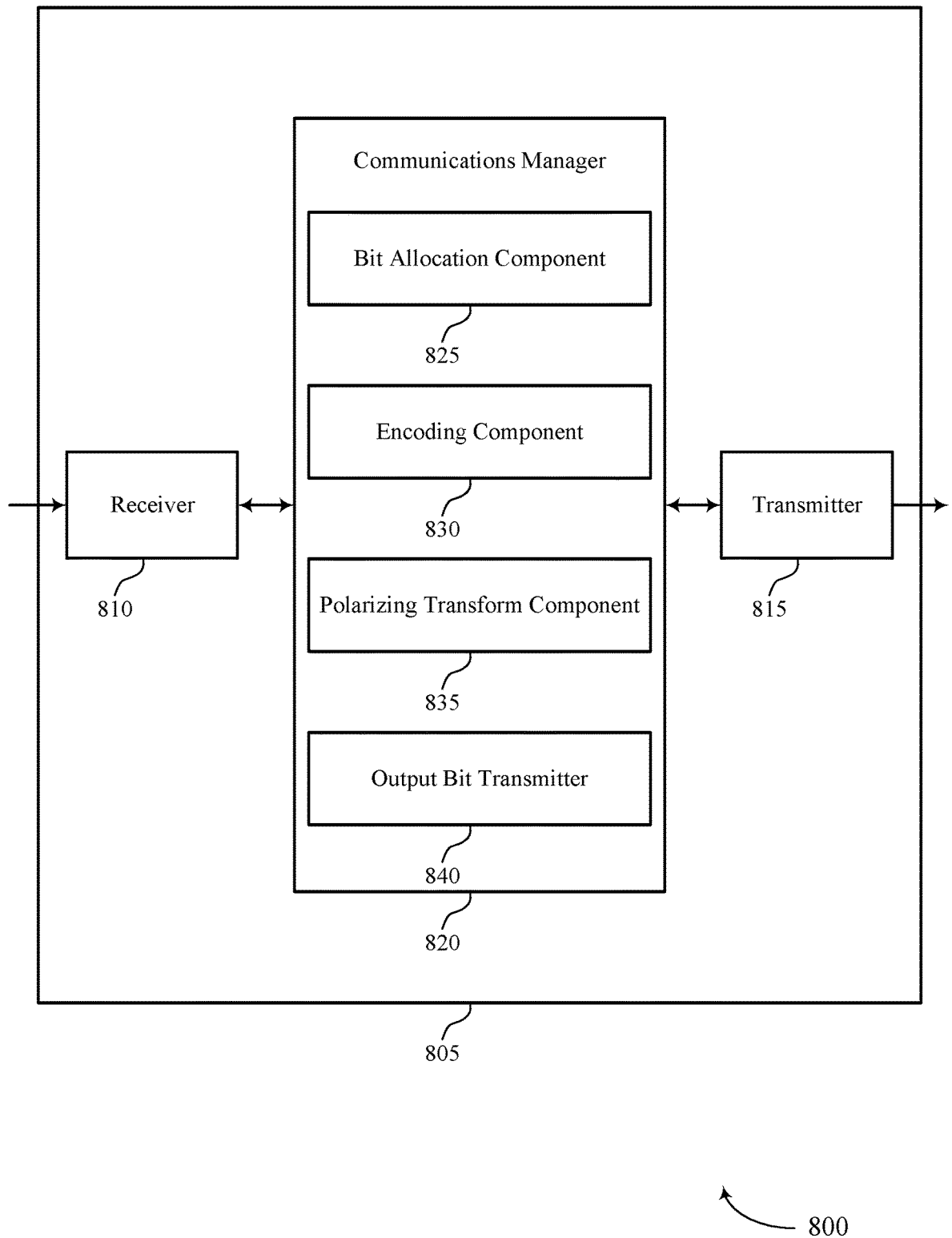

FIG. 8 shows a block diagram 800 of a device 805 that supports polarization adjusted channel coding design for complexity reduction in accordance with one or more aspects of the present disclosure. The device 805 may be an example of aspects of a device 705 or a network entity 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 805. In some examples, the receiver 810 may support obtaining information by receiving signals via one or more antennas. Additionally, or alternatively, the receiver 810 may support obtaining information by receiving signals via one or more wired (e.g., electrical, fiber optic) interfaces, wireless interfaces, or any combination thereof.

The transmitter 815 may provide a means for outputting (e.g., transmitting, providing, conveying, sending) information generated by other components of the device 805. For example, the transmitter 815 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 815 may support outputting information by transmitting signals via one or more antennas. Additionally, or alternatively, the transmitter 815 may support outputting information by transmitting signals via one or more wired (e.g., electrical, fiber optic) interfaces, wireless interfaces, or any combination thereof. In some examples, the transmitter 815 and the receiver 810 may be co-located in a transceiver, which may include or be coupled with a modem.

The device 805, or various components thereof, may be an example of means for performing various aspects of polarization adjusted channel coding design for complexity reduction as described herein. For example, the communications manager 820 may include a bit allocation component 825, an encoding component 830, a polarizing transform component 835, an output bit transmitter 840, or any combination thereof. The communications manager 820 may be an example of aspects of a communications manager 720 as described herein. In some examples, the communications manager 820, or various components thereof, may be configured to perform various operations (e.g., receiving, obtaining, monitoring, outputting, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to obtain information, output information, or perform various other operations as described herein.

The communications manager 820 may support wireless communications at a first wireless device in accordance with examples as disclosed herein. The bit allocation component 825 may be configured as or otherwise support a means for partitioning a set of information bits into a set of multiple subsets of bits corresponding to a set of multiple polarization levels. The encoding component 830 may be configured as or otherwise support a means for encoding a first subset of bits of the set of multiple subsets for a first polarization level of the set of multiple polarization levels according to a first channel coding scheme. The encoding component 830 may be configured as or otherwise support a means for encoding a second subset of bits of the set of multiple subsets for a second polarization level of the set of multiple polarization levels according to a second channel coding scheme. The polarizing transform component 835 may be configured as or otherwise support a means for performing a polarizing transform using the encoded first subset of bits for the first polarization level and the encoded second subset of bits for the second polarization level to obtain a set of output bits corresponding to the set of information bits. The output bit transmitter 840 may be configured as or otherwise support a means for transmitting the set of output bits to a second wireless device.

Figure 9:
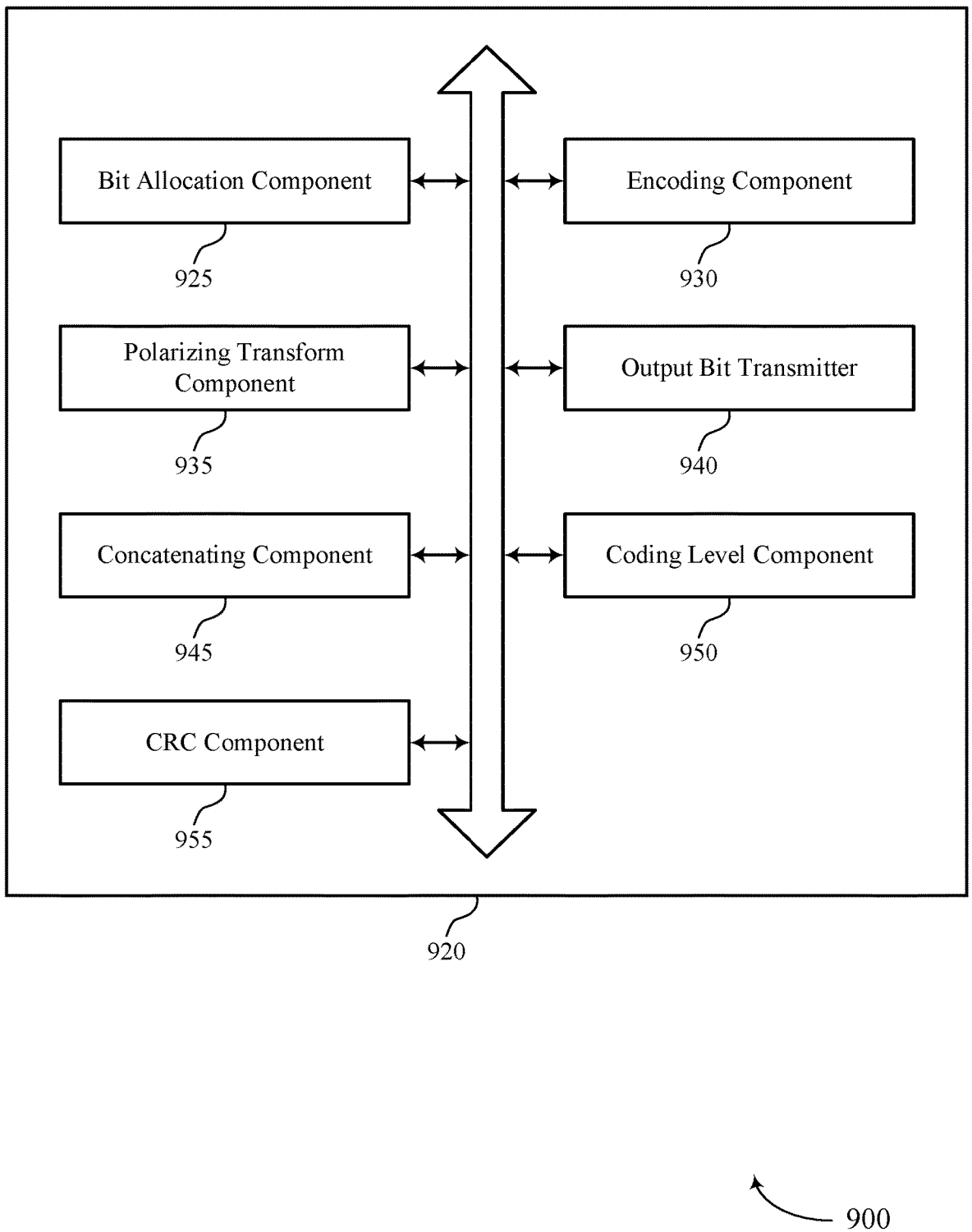
FIG. 9 shows a block diagram of a communications manager that supports polarization adjusted channel coding design for complexity reduction in accordance with one or more aspects of the present disclosure.

FIG. 9 shows a block diagram 900 of a communications manager 920 that supports polarization adjusted channel coding design for complexity reduction in accordance with one or more aspects of the present disclosure. The communications manager 920 may be an example of aspects of a communications manager 720, a communications manager 820, or both, as described herein. The communications manager 920, or various components thereof, may be an example of means for performing various aspects of polarization adjusted channel coding design for complexity reduction as described herein. For example, the communications manager 920 may include a bit allocation component 925, an encoding component 930, a polarizing transform component 935, an output bit transmitter 940, a concatenating component 945, a coding level component 950, an CRC component 955, or any combination thereof. Each of these components may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 920 may support wireless communications at a first wireless device in accordance with examples as disclosed herein. The bit allocation component 925 may be configured as or otherwise support a means for partitioning a set of information bits into a set of multiple subsets of bits corresponding to a set of multiple polarization levels. The encoding component 930 may be configured as or otherwise support a means for encoding a first subset of bits of the set of multiple subsets for a first polarization level of the set of multiple polarization levels according to a first channel coding scheme. In some examples, the encoding component 930 may be configured as or otherwise support a means for encoding a second subset of bits of the set of multiple subsets for a second polarization level of the set of multiple polarization levels according to a second channel coding scheme. The polarizing transform component 935 may be configured as or otherwise support a means for performing a polarizing transform using the encoded first subset of bits for the first polarization level and the encoded second subset of bits for the second polarization level to obtain a set of output bits corresponding to the set of information bits. The output bit transmitter 940 may be configured as or otherwise support a means for transmitting the set of output bits to a second wireless device.

In some examples, the encoding component 930 may be configured as or otherwise support a means for jointly encoding a third subset of bits of the set of multiple subsets with the second subset of bits for a third polarization level of the set of multiple polarization levels according to the second channel coding scheme, where the polarizing transform is performed using the encoded first subset of bits for the first polarization level, the encoded second subset of bits for the second polarization level, and the encoded third subset of bits for the third polarization level.

In some examples, to support partitioning the set of information bits, the bit allocation component 925 may be configured as or otherwise support a means for partitioning the set of information bits into the set of multiple subsets of bits based on a quantity of coding levels associated with one or more encoding procedures for the set of information bits, where a quantity of the set of multiple subsets of bits is equal to the quantity of coding levels.

In some examples, to support performing the polarizing transform, the polarizing transform component 935 may be configured as or otherwise support a means for performing the polarizing transform for a set of multiple encoded subsets of bits corresponding to a set of multiple channels based on a quantity of polarization levels for the polarizing transform, where a quantity of the set of multiple encoded subsets of bits is equal to the quantity of polarization levels for the polarizing transform.

In some examples, the coding level component 950 may be configured as or otherwise support a means for determining a first subset of coding levels associated with the first channel coding scheme. In some examples, the coding level component 950 may be configured as or otherwise support a means for determining a second subset of coding levels associated with the second channel coding scheme, where the first subset of bits and the second subset of bits are encoded based on the first subset of coding levels and the second subset of coding levels.

In some examples, the first subset of coding levels is associated with the first channel coding scheme based on a channel reliability of the first polarization level. In some examples, the second subset of coding levels is associated with the second channel coding scheme based on a channel reliability of the second polarization level.

In some examples, the first channel coding scheme is different from the second channel coding scheme. In some examples, the first channel coding scheme includes an LDPC coding scheme.

In some examples, the CRC component 955 may be configured as or otherwise support a means for performing a first CRC procedure using the first subset of bits. In some examples, the CRC component 955 may be configured as or otherwise support a means for performing a second CRC procedure using the second subset of bits.

In some examples, the encoding component 930 may be configured as or otherwise support a means for selecting a first coding rate for the first channel coding scheme based on an effective coding rate associated with one or more encoding procedures for the set of information bits and a mutual information polarization function. In some examples, the encoding component 930 may be configured as or otherwise support a means for selecting a second coding rate for the second channel coding scheme based on the effective coding rate and the mutual information polarization function, where the first coding rate is different from the second coding rate.

In some examples, the encoding component 930 may be configured as or otherwise support a means for selecting the first channel coding scheme based on the first coding rate satisfying a threshold. In some examples, the encoding component 930 may be configured as or otherwise support a means for selecting the second channel coding scheme based on the second coding rate failing to satisfy the threshold.

In some examples, the concatenating component 945 may be configured as or otherwise support a means for concatenating one or more sets of polarized bits output after performing the polarizing transform, where the set of output bits includes the concatenated one or more sets of polarized bits.

In some examples, to support partitioning the set of information bits, the bit allocation component 925 may be configured as or otherwise support a means for determining a first quantity of information bits included in the first subset of bits of the set of multiple subsets based on a total quantity of information bits of the set of information bits and an effective coding rate associated with one or more encoding procedures for the set of information bits. In some examples, to support partitioning the set of information bits, the bit allocation component 925 may be configured as or otherwise support a means for determining a second quantity of information bits included in the second subset of bits of the set of multiple subsets based on the total quantity of information bits of the set of information bits and the effective coding rate.

In some examples, the bit allocation component 925 may be configured as or otherwise support a means for determining a first mutual information polarization function for the first polarization level of the set of multiple polarization levels based on the effective coding rate and a capacity of the first polarization level, where the first quantity of information bits is determined based on the first mutual information polarization function. In some examples, the bit allocation component 925 may be configured as or otherwise support a means for determining a second mutual information polarization function for the second polarization level of the set of multiple polarization levels based on the effective coding rate and a capacity of the second polarization level, where the second quantity of information bits is determined based on the second mutual information polarization function.

In some examples, the polarizing transform is based on a polar code, and the bit allocation component 925 may be configured as or otherwise support a means for determining the second quantity of information bits based on the first quantity of information bits. In some examples, the polarizing transform is based on a polar code, and the bit allocation component 925 may be configured as or otherwise support a means for determining a third quantity of information bits included in a third subset of the set of multiple subsets based on the total quantity of information bits of the set of information bits, the effective coding rate, and the second quantity of information bits.

In some examples, the bit allocation component 925 may be configured as or otherwise support a means for receiving, from the second wireless device, a signal indicating the total quantity of information bits of the set of information bits and the effective coding rate.

In some examples, the first channel coding scheme and the second channel coding scheme include at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof.

In some examples, to support performing the polarizing transform, the encoding component 930 may be configured as or otherwise support a means for encoding the first subset of bits and the second subset of bits using an inner error correction code.

In some examples, to support encoding the first subset of bits and the second subset of bits using an inner error correction code, the encoding component 930 may be configured as or otherwise support a means for jointly encoding a first bit from the first subset of bits and a second bit from the second subset of bits using a first inner error correction code. In some examples, to support encoding the first subset of bits and the second subset of bits using the inner error correction code, the encoding component 930 may be configured as or otherwise support a means for jointly encoding a third bit from the first subset of bits and a fourth bit from the second subset of bits using a second inner error correction code. In some examples, the inner error correction code includes a simplex code.

Figure 10:
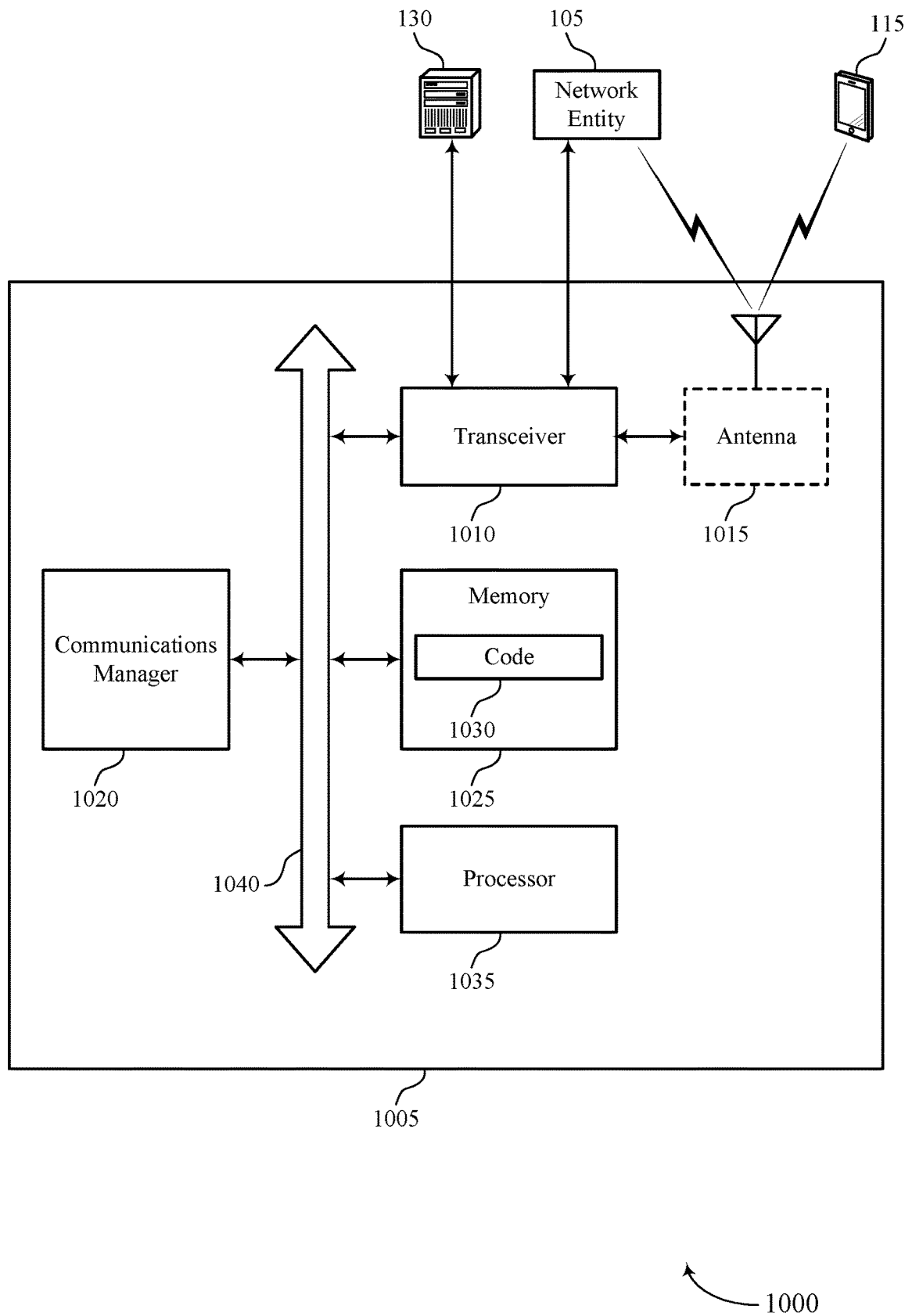
FIG. 10 shows a diagram of a system including a device that supports polarization adjusted channel coding design for complexity reduction in accordance with one or more aspects of the present disclosure.

FIG. 10 shows a diagram of a system 1000 including a device 1005 that supports polarization adjusted channel coding design for complexity reduction in accordance with one or more aspects of the present disclosure. The device 1005 may be an example of or include the components of a device 705, a device 805, or a network entity 105 as described herein. The device 1005 may communicate with one or more network entities 105, one or more UEs 115, or any combination thereof, which may include communications over one or more wired interfaces, over one or more wireless interfaces, or any combination thereof. The device 1005 may include components that support outputting and obtaining communications, such as a communications manager 1020, a transceiver 1010, an antenna 1015, a memory 1025, code 1030, and a processor 1035. These components may be in electronic communication or otherwise coupled (e.g., operatively, communicatively, functionally, electronically, electrically) via one or more buses (e.g., a bus 1040).

The transceiver 1010 may support bi-directional communications via wired links, wireless links, or both as described herein. In some examples, the transceiver 1010 may include a wired transceiver and may communicate bi-directionally with another wired transceiver. Additionally, or alternatively, in some examples, the transceiver 1010 may include a wireless transceiver and may communicate bi-directionally with another wireless transceiver. In some examples, the device 1005 may include one or more antennas 1015, which may be capable of transmitting or receiving wireless transmissions (e.g., concurrently). The transceiver 1010 may also include a modem to modulate signals, to provide the modulated signals for transmission (e.g., by one or more antennas 1015, by a wired transmitter), to receive modulated signals (e.g., from one or more antennas 1015, from a wired receiver), and to demodulate signals. The transceiver 1010, or the transceiver 1010 and one or more antennas 1015 or wired interfaces, where applicable, may be an example of a transmitter 715, a transmitter 815, a receiver 710, a receiver 810, or any combination thereof or component thereof, as described herein. In some examples, the transceiver may be operable to support communications via one or more communications links (e.g., a communication link 125, a backhaul communication link 120, a midhaul communication link 162, a fronthaul communication link 168).

The memory 1025 may include RAM and ROM. The memory 1025 may store computer-readable, computer-executable code 1030 including instructions that, when executed by the processor 1035, cause the device 1005 to perform various functions described herein. The code 1030 may be stored in a non-transitory computer-readable medium such as system memory or another type of memory. In some cases, the code 1030 may not be directly executable by the processor 1035 but may cause a computer (e.g., when compiled and executed) to perform functions described herein. In some cases, the memory 1025 may contain, among other things, a BIOS which may control basic hardware or software operation such as the interaction with peripheral components or devices.

The processor 1035 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the processor 1035 may be configured to operate a memory array using a memory controller. In some other cases, a memory controller may be integrated into the processor 1035. The processor 1035 may be configured to execute computer-readable instructions stored in a memory (e.g., the memory 1025) to cause the device 1005 to perform various functions (e.g., functions or tasks supporting polarization adjusted channel coding design for complexity reduction). For example, the device 1005 or a component of the device 1005 may include a processor 1035 and memory 1025 coupled with the processor 1035, the processor 1035 and memory 1025 configured to perform various functions described herein. The processor 1035 may be an example of a cloud-computing platform (e.g., one or more physical nodes and supporting software such as operating systems, virtual machines, or container instances) that may host the functions (e.g., by executing code 1030) to perform the functions of the device 1005.

In some examples, a bus 1040 may support communications of (e.g., within) a protocol layer of a protocol stack. In some examples, a bus 1040 may support communications associated with a logical channel of a protocol stack (e.g., between protocol layers of a protocol stack), which may include communications performed within a component of the device 1005, or between different components of the device 1005 that may be co-located or located in different locations (e.g., where the device 1005 may refer to a system in which one or more of the communications manager 1020, the transceiver 1010, the memory 1025, the code 1030, and the processor 1035 may be located in one of the different components or divided between different components).

In some examples, the communications manager 1020 may manage aspects of communications with a core network 130 (e.g., via one or more wired or wireless backhaul links). For example, the communications manager 1020 may manage the transfer of data communications for client devices, such as one or more UEs 115. In some examples, the communications manager 1020 may manage communications with other network entities 105, and may include a controller or scheduler for controlling communications with UEs 115 in cooperation with other network entities 105. In some examples, the communications manager 1020 may support an X2 interface within an LTE/LTE-A wireless communications network technology to provide communication between network entities 105.

The communications manager 1020 may support wireless communications at a first wireless device in accordance with examples as disclosed herein. For example, the communications manager 1020 may be configured as or otherwise support a means for partitioning a set of information bits into a set of multiple subsets of bits corresponding to a set of multiple polarization levels. The communications manager 1020 may be configured as or otherwise support a means for encoding a first subset of bits of the set of multiple subsets for a first polarization level of the set of multiple polarization levels according to a first channel coding scheme. The communications manager 1020 may be configured as or otherwise support a means for encoding a second subset of bits of the set of multiple subsets for a second polarization level of the set of multiple polarization levels according to a second channel coding scheme. The communications manager 1020 may be configured as or otherwise support a means for performing a polarizing transform using the encoded first subset of bits for the first polarization level and the encoded second subset of bits for the second polarization level to obtain a set of output bits corresponding to the set of information bits. The communications manager 1020 may be configured as or otherwise support a means for transmitting the set of output bits to a second wireless device.

By including or configuring the communications manager 1020 in accordance with examples as described herein, the device 1005 may support techniques for reduced complexity in channel coding schemes. For example, the device 705 may combine polarization techniques (e.g., polarizing transforms) with channel coding schemes and coding rates associated with reduced complexity, such that the device 705 may transmit encoded bits without reducing the likelihood that a receiving device successfully receives the encoded bits. Additionally, reducing complexity of the channel coding schemes may provide reduced latency and processing without adversely affecting performance, and may support improved utilization of processing capabilities and communication resources.

In some examples, the communications manager 1020 may be configured to perform various operations (e.g., receiving, obtaining, monitoring, outputting, transmitting) using or otherwise in cooperation with the transceiver 1010, the one or more antennas 1015 (e.g., where applicable), or any combination thereof. Although the communications manager 1020 is illustrated as a separate component, in some examples, one or more functions described with reference to the communications manager 1020 may be supported by or performed by the processor 1035, the memory 1025, the code 1030, the transceiver 1010, or any combination thereof. For example, the code 1030 may include instructions executable by the processor 1035 to cause the device 1005 to perform various aspects of polarization adjusted channel coding design for complexity reduction as described herein, or the processor 1035 and the memory 1025 may be otherwise configured to perform or support such operations.

Figure 11:
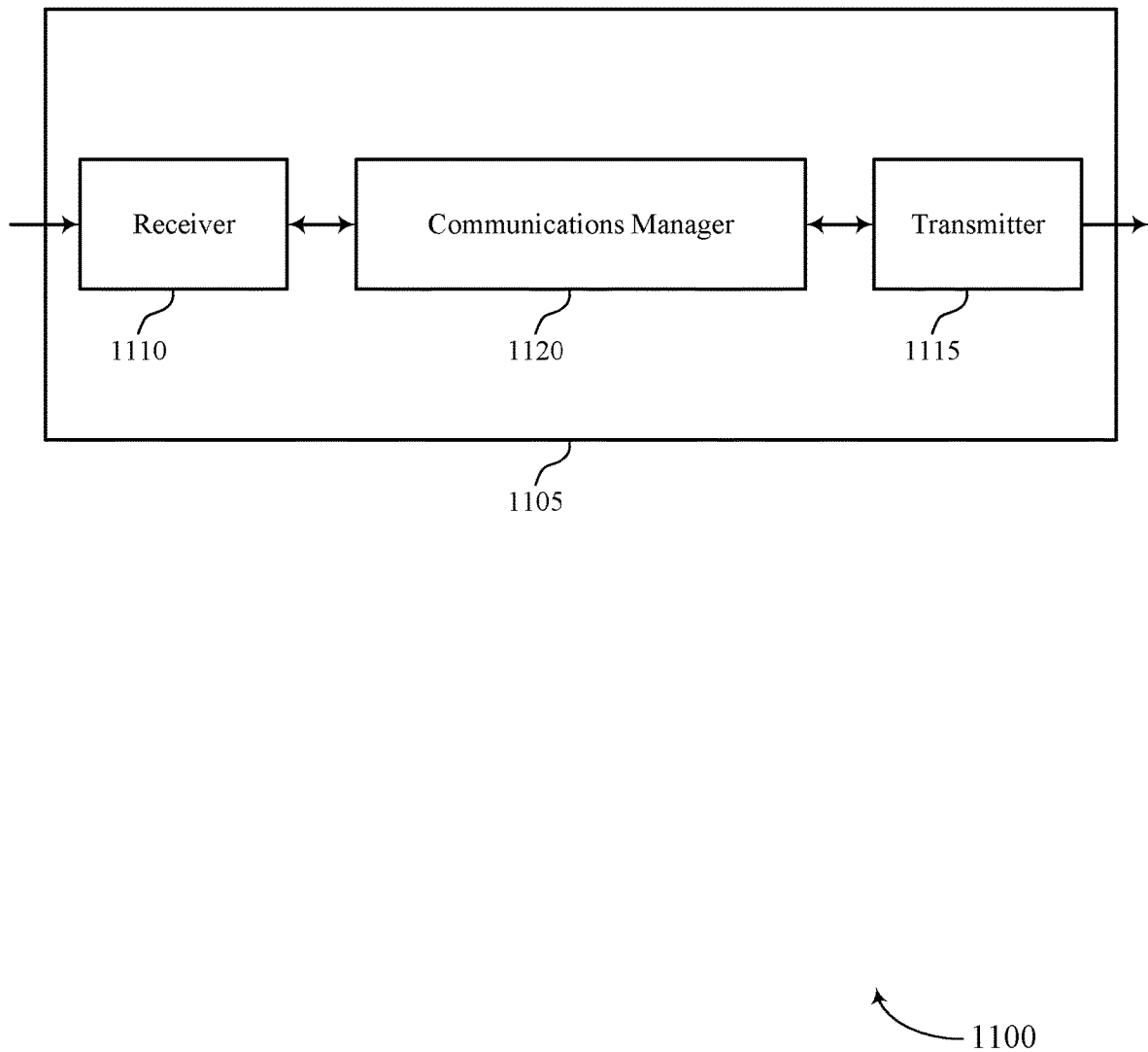
FIGS. 11 and 12 show block diagrams of devices that support polarization adjusted channel coding design for complexity reduction in accordance with one or more aspects of the present disclosure.

FIG. 11 shows a block diagram 1100 of a device 1105 that supports polarization adjusted channel coding design for complexity reduction in accordance with one or more aspects of the present disclosure. The device 1105 may be an example of aspects of a UE 115 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for receiving information such as packets, user data, control information, or any combination thereof associated with various information channels (e.g., control channels, data channels, information channels related to polarization adjusted channel coding design for complexity reduction). Information may be passed on to other components of the device 1105. The receiver 1110 may utilize a single antenna or a set of multiple antennas.

The transmitter 1115 may provide a means for transmitting signals generated by other components of the device 1105. For example, the transmitter 1115 may transmit information such as packets, user data, control information, or any combination thereof associated with various information channels (e.g., control channels, data channels, information channels related to polarization adjusted channel coding design for complexity reduction). In some examples, the transmitter 1115 may be co-located with a receiver 1110 in a transceiver module. The transmitter 1115 may utilize a single antenna or a set of multiple antennas.

The communications manager 1120, the receiver 1110, the transmitter 1115, or various combinations thereof or various components thereof may be examples of means for performing various aspects of polarization adjusted channel coding design for complexity reduction as described herein. For example, the communications manager 1120, the receiver 1110, the transmitter 1115, or various combinations or components thereof may support a method for performing one or more of the functions described herein.

In some examples, the communications manager 1120, the receiver 1110, the transmitter 1115, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, the communications manager 1120 may comprise a general processor, a modem processor, a DSP, or other dedicated hardware, or a combination thereof. In some examples, a processor and memory coupled with the processor may be configured to perform one or more of the functions described herein (e.g., by executing, by the processor, instructions stored in the memory).

Additionally, or alternatively, in some examples, the communications manager 1120, the receiver 1110, the transmitter 1115, or various combinations or components thereof may be implemented in code (e.g., as communications management software or firmware) executed by a processor. If implemented in code executed by a processor, the functions of the communications manager 1120, the receiver 1110, the transmitter 1115, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 1120 may be configured to perform various operations (e.g., receiving, obtaining, monitoring, outputting, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to obtain information, output information, or perform various other operations as described herein.

The communications manager 1120 may support wireless communications at a first wireless device in accordance with examples as disclosed herein. For example, the communications manager 1120 may be configured as or otherwise support a means for receiving an encoded set of bits corresponding to a set of information bits. The communications manager 1120 may be configured as or otherwise support a means for performing a depolarizing transform using the encoded set of bits to obtain a set of multiple subsets of bits corresponding to a set of multiple polarization levels, the set of multiple subsets of bits including at least a first subset of bits and a second subset of bits. The communications manager 1120 may be configured as or otherwise support a means for decoding the first subset of bits of the set of multiple subsets for a first polarization level of the set of multiple polarization levels according to a first channel decoding scheme. The communications manager 1120 may be configured as or otherwise support a means for decoding the second subset of bits of the set of multiple subsets for a second polarization level of the set of multiple polarization levels according to a second channel decoding scheme. The communications manager 1120 may be configured as or otherwise support a means for processing the decoded first subset of bits and the decoded second subset of bits to obtain a set of decoded bits corresponding to the set of information bits.

By including or configuring the communications manager 1120 in accordance with examples as described herein, the device 1105 (e.g., a processor controlling or otherwise coupled with the receiver 1110, the transmitter 1115, the communications manager 1120, or a combination thereof) may support techniques for reduced complexity in channel coding schemes. For example, the device 1105 may combine polarization techniques (e.g., polarizing transforms) with channel decoding schemes and coding rates associated with reduced complexity, such that the device 1105 may receive and decode encoded bits without sacrificing performance. Additionally, reducing complexity of the channel coding schemes may correspond to reduced processing, decreased power consumption, and improved efficiency.

Figure 12:
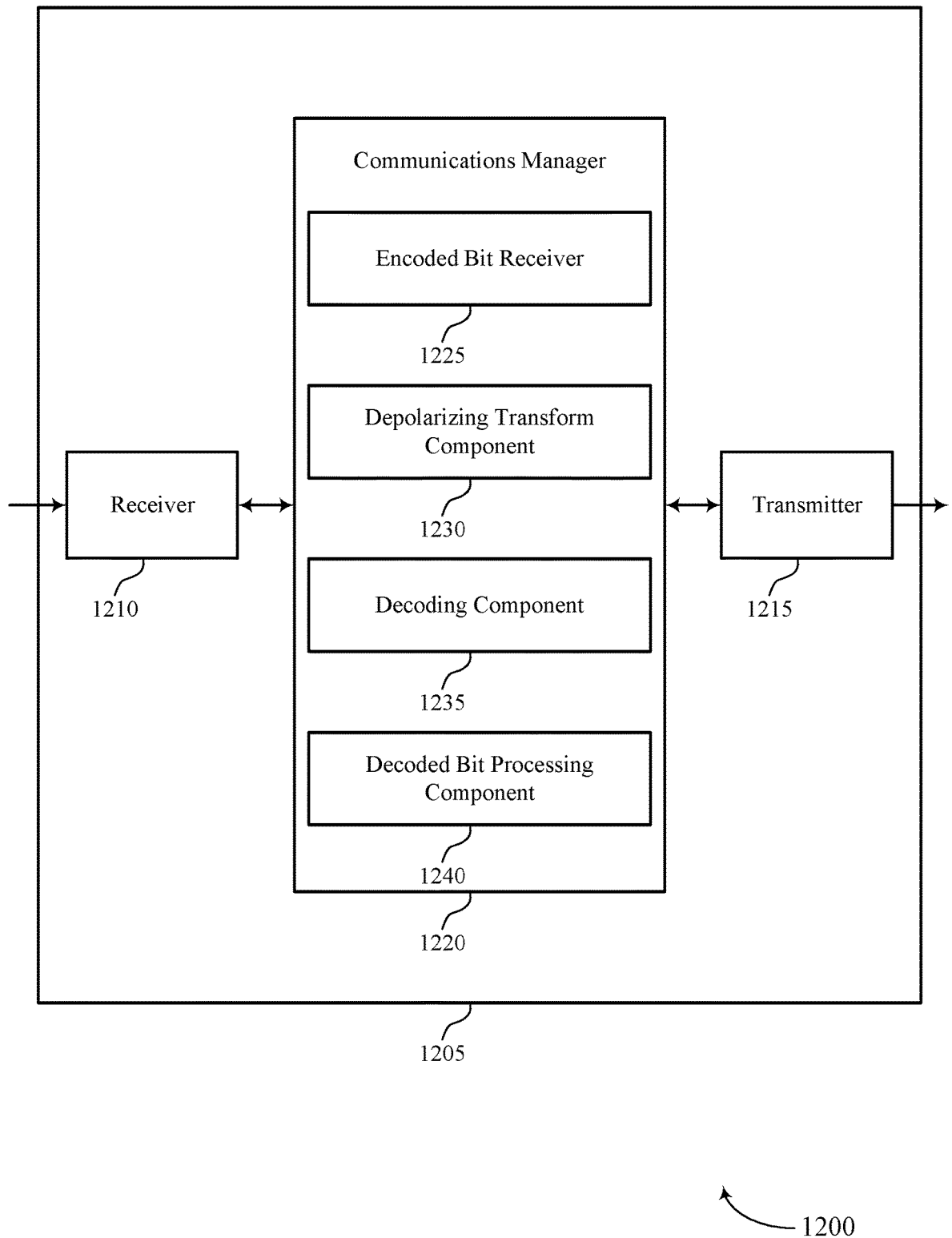

FIG. 12 shows a block diagram 1200 of a device 1205 that supports polarization adjusted channel coding design for complexity reduction in accordance with one or more aspects of the present disclosure. The device 1205 may be an example of aspects of a device 1105 or a UE 115 as described herein. The device 1205 may include a receiver 1210, a transmitter 1215, and a communications manager 1220. The device 1205 may also include a processor. Each of these components may be in communication with one another (e.g., via one or more buses).

The receiver 1210 may provide a means for receiving information such as packets, user data, control information, or any combination thereof associated with various information channels (e.g., control channels, data channels, information channels related to polarization adjusted channel coding design for complexity reduction). Information may be passed on to other components of the device 1205. The receiver 1210 may utilize a single antenna or a set of multiple antennas.

The transmitter 1215 may provide a means for transmitting signals generated by other components of the device 1205. For example, the transmitter 1215 may transmit information such as packets, user data, control information, or any combination thereof associated with various information channels (e.g., control channels, data channels, information channels related to polarization adjusted channel coding design for complexity reduction). In some examples, the transmitter 1215 may be co-located with a receiver 1210 in a transceiver module. The transmitter 1215 may utilize a single antenna or a set of multiple antennas.

The device 1205, or various components thereof, may be an example of means for performing various aspects of polarization adjusted channel coding design for complexity reduction as described herein. For example, the communications manager 1220 may include an encoded bit receiver 1225, a depolarizing transform component 1230, a decoding component 1235, a decoded bit processing component 1240, or any combination thereof. The communications manager 1220 may be an example of aspects of a communications manager 1120 as described herein. In some examples, the communications manager 1220, or various components thereof, may be configured to perform various operations (e.g., receiving, obtaining, monitoring, outputting, transmitting) using or otherwise in cooperation with the receiver 1210, the transmitter 1215, or both. For example, the communications manager 1220 may receive information from the receiver 1210, send information to the transmitter 1215, or be integrated in combination with the receiver 1210, the transmitter 1215, or both to obtain information, output information, or perform various other operations as described herein.

The communications manager 1220 may support wireless communications at a first wireless device in accordance with examples as disclosed herein. The encoded bit receiver 1225 may be configured as or otherwise support a means for receiving an encoded set of bits corresponding to a set of information bits. The depolarizing transform component 1230 may be configured as or otherwise support a means for performing a depolarizing transform using the encoded set of bits to obtain a set of multiple subsets of bits corresponding to a set of multiple polarization levels, the set of multiple subsets of bits including at least a first subset of bits and a second subset of bits. The decoding component 1235 may be configured as or otherwise support a means for decoding the first subset of bits of the set of multiple subsets for a first polarization level of the set of multiple polarization levels according to a first channel decoding scheme. The decoding component 1235 may be configured as or otherwise support a means for decoding the second subset of bits of the set of multiple subsets for a second polarization level of the set of multiple polarization levels according to a second channel decoding scheme. The decoded bit processing component 1240 may be configured as or otherwise support a means for processing the decoded first subset of bits and the decoded second subset of bits to obtain a set of decoded bits corresponding to the set of information bits.

Figure 13:
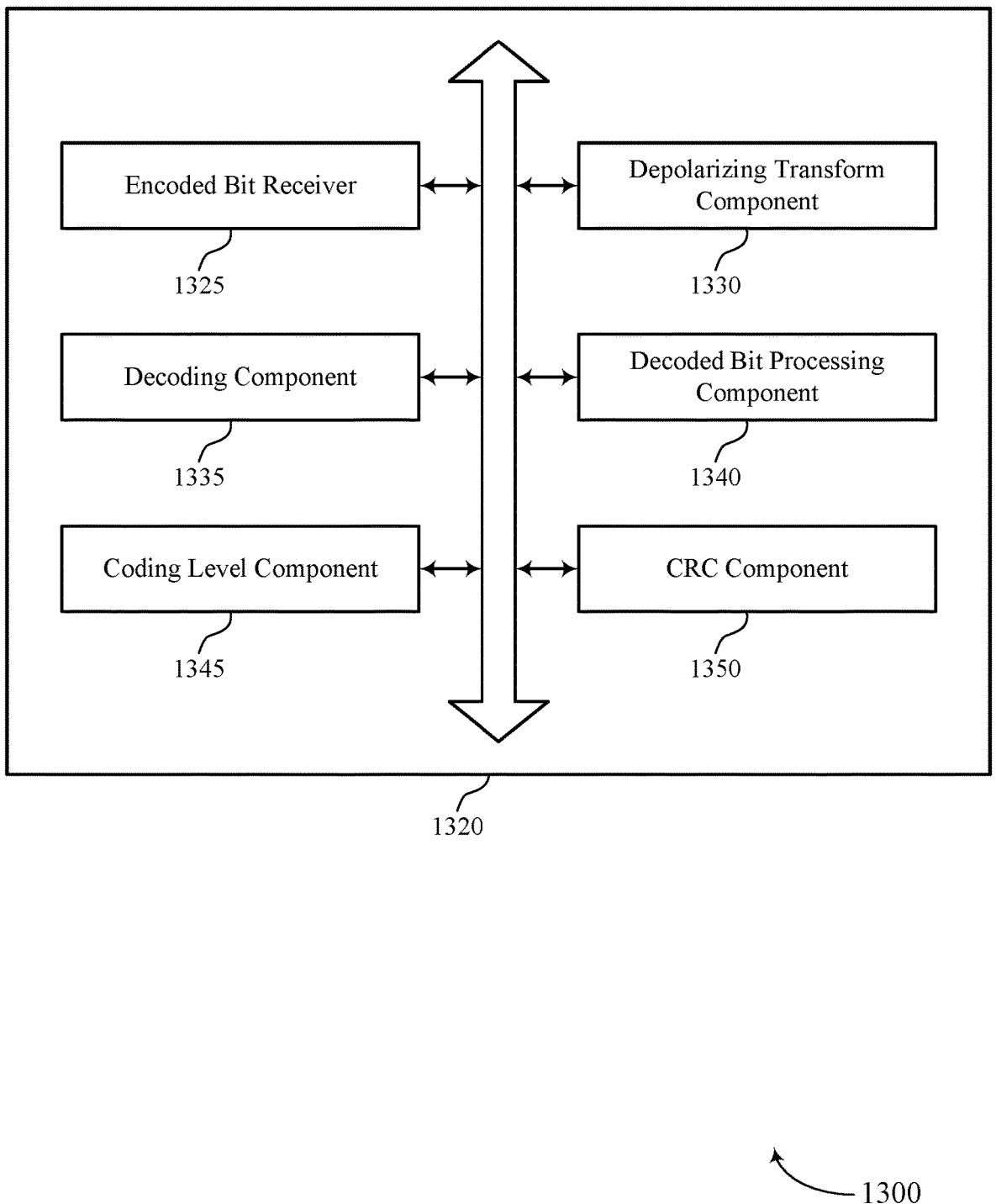
FIG. 13 shows a block diagram of a communications manager that supports polarization adjusted channel coding design for complexity reduction in accordance with one or more aspects of the present disclosure.

FIG. 13 shows a block diagram 1300 of a communications manager 1320 that supports polarization adjusted channel coding design for complexity reduction in accordance with one or more aspects of the present disclosure. The communications manager 1320 may be an example of aspects of a communications manager 1120, a communications manager 1220, or both, as described herein. The communications manager 1320, or various components thereof, may be an example of means for performing various aspects of polarization adjusted channel coding design for complexity reduction as described herein. For example, the communications manager 1320 may include an encoded bit receiver 1325, a depolarizing transform component 1330, a decoding component 1335, a decoded bit processing component 1340, a coding level component 1345, an CRC component 1350, or any combination thereof. Each of these components may communicate, directly or indirectly, with one another (e.g., via one or more buses).

The communications manager 1320 may support wireless communications at a first wireless device in accordance with examples as disclosed herein. The encoded bit receiver 1325 may be configured as or otherwise support a means for receiving an encoded set of bits corresponding to a set of information bits. The depolarizing transform component 1330 may be configured as or otherwise support a means for performing a depolarizing transform using the encoded set of bits to obtain a set of multiple subsets of bits corresponding to a set of multiple polarization levels, the set of multiple subsets of bits including at least a first subset of bits and a second subset of bits. The decoding component 1335 may be configured as or otherwise support a means for decoding the first subset of bits of the set of multiple subsets for a first polarization level of the set of multiple polarization levels according to a first channel decoding scheme. In some examples, the decoding component 1335 may be configured as or otherwise support a means for decoding the second subset of bits of the set of multiple subsets for a second polarization level of the set of multiple polarization levels according to a second channel decoding scheme. The decoded bit processing component 1340 may be configured as or otherwise support a means for processing the decoded first subset of bits and the decoded second subset of bits to obtain a set of decoded bits corresponding to the set of information bits.

In some examples, the decoding component 1335 may be configured as or otherwise support a means for jointly decoding a third subset of bits of the set of multiple subsets with the second subset of bits for a third polarization level of the set of multiple polarization levels according to the second channel decoding scheme.

In some examples, the set of multiple subsets of bits is based on a quantity of coding levels associated with one or more decoding procedures for the set of information bits. In some examples, a quantity of the set of multiple subsets of bits is equal to the quantity of coding levels.

In some examples, to support performing the depolarizing transform, the depolarizing transform component 1330 may be configured as or otherwise support a means for performing the depolarizing transform for a set of multiple encoded subsets of bits corresponding to a set of multiple channels based on a quantity of polarization levels for the depolarizing transform, where a quantity of the set of multiple encoded subsets of bits is equal to the quantity of polarization levels for the depolarizing transform.

In some examples, the coding level component 1345 may be configured as or otherwise support a means for determining a first subset of coding levels associated with the first channel decoding scheme. In some examples, the coding level component 1345 may be configured as or otherwise support a means for determining a second subset of coding levels associated with the second channel decoding scheme, where the first subset of bits and the second subset of bits are decoded based on the first subset of coding levels and the second subset of coding levels.

In some examples, the first subset of coding levels is associated with the first channel decoding scheme based on a channel reliability of the first polarization level. In some examples, the second subset of coding levels is associated with the second channel decoding scheme based on a channel reliability of the second polarization level.

In some examples, the first channel decoding scheme is different from the second channel decoding scheme. In some examples, the first channel decoding scheme includes an LDPC coding scheme.

In some examples, the CRC component 1350 may be configured as or otherwise support a means for performing a first CRC procedure using the first subset of bits. In some examples, the CRC component 1350 may be configured as or otherwise support a means for performing a second CRC procedure using the second subset of bits.

In some examples, the decoding component 1335 may be configured as or otherwise support a means for selecting a first coding rate for the first channel decoding scheme based on an effective coding rate associated with one or more encoding procedures for the set of information bits and a mutual information polarization function. In some examples, the decoding component 1335 may be configured as or otherwise support a means for selecting a second coding rate for the second channel decoding scheme based on the effective coding rate and the mutual information polarization function, where the first coding rate is different from the second coding rate.

In some examples, the decoding component 1335 may be configured as or otherwise support a means for selecting the first channel decoding scheme based on the first coding rate satisfying a threshold. In some examples, the decoding component 1335 may be configured as or otherwise support a means for selecting the second channel decoding scheme based on the second coding rate failing to satisfy the threshold.

In some examples, the decoded bit processing component 1340 may be configured as or otherwise support a means for concatenating one or more sets of decoded bits including at least the decoded first subset of bits and the decoded second subset of bits, where the set of decoded bits comprises the concatenated one or more subsets of decoded bits.

In some examples, to support performing the depolarizing transform, the depolarizing transform component 1330 may be configured as or otherwise support a means for determining a first quantity of information bits included in the first subset of bits of the set of multiple subsets based on a total quantity of information bits of the set of information bits and an effective coding rate associated with one or more decoding procedures for the set of information bits. In some examples, to support performing the depolarizing transform, the depolarizing transform component 1330 may be configured as or otherwise support a means for determining a second quantity of information bits included in the second subset of bits of the set of multiple subsets based on the total quantity of information bits of the set of information bits and the effective coding rate.

In some examples, the depolarizing transform component 1330 may be configured as or otherwise support a means for determining a first mutual information polarization function for the first polarization level of the set of multiple polarization levels based on the effective coding rate and a capacity of the first polarization level, where the first quantity of information bits is determined based on the first mutual information polarization function. In some examples, the depolarizing transform component 1330 may be configured as or otherwise support a means for determining a second mutual information polarization function for the second polarization level of the set of multiple polarization levels based on the effective coding rate and a capacity of the second polarization level, where the second quantity of information bits is determined based on the second mutual information polarization function.

In some examples, the depolarizing transform is based on a polar code, and the depolarizing transform component 1330 may be configured as or otherwise support a means for determining the second quantity of information bits based on the first quantity of information bits. In some examples, the depolarizing transform is based on a polar code, and the depolarizing transform component 1330 may be configured as or otherwise support a means for determining a third quantity of information bits included in a third subset of the set of multiple subsets based on the total quantity of information bits of the set of information bits, the effective coding rate, and the second quantity of information bits.

In some examples, the depolarizing transform component 1330 may be configured as or otherwise support a means for receiving a signal indicating the total quantity of information bits of the set of information bits and the effective coding rate.

In some examples, the first channel decoding scheme and the second channel decoding scheme include at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof.

In some examples, to support performing the depolarizing transform, the depolarizing transform component 1330 may be configured as or otherwise support a means for decoding the first subset of bits and the second subset of bits using an inner error correction code.

In some examples, to support decoding the first subset of bits and the second subset of bits using an inner error correction code, the depolarizing transform component 1330 may be configured as or otherwise support a means for jointly decoding a first bit from the first subset of bits and a second bit from the second subset of bits using a first inner error correction code. In some examples, to support decoding the first subset of bits and the second subset of bits using an inner error correction code, the depolarizing transform component 1330 may be configured as or otherwise support a means for jointly decoding a third bit from the first subset of bits and a fourth bit from the second subset of bits using a second inner error correction code. In some examples, the inner error correction code includes a simplex code.

Figure 14:
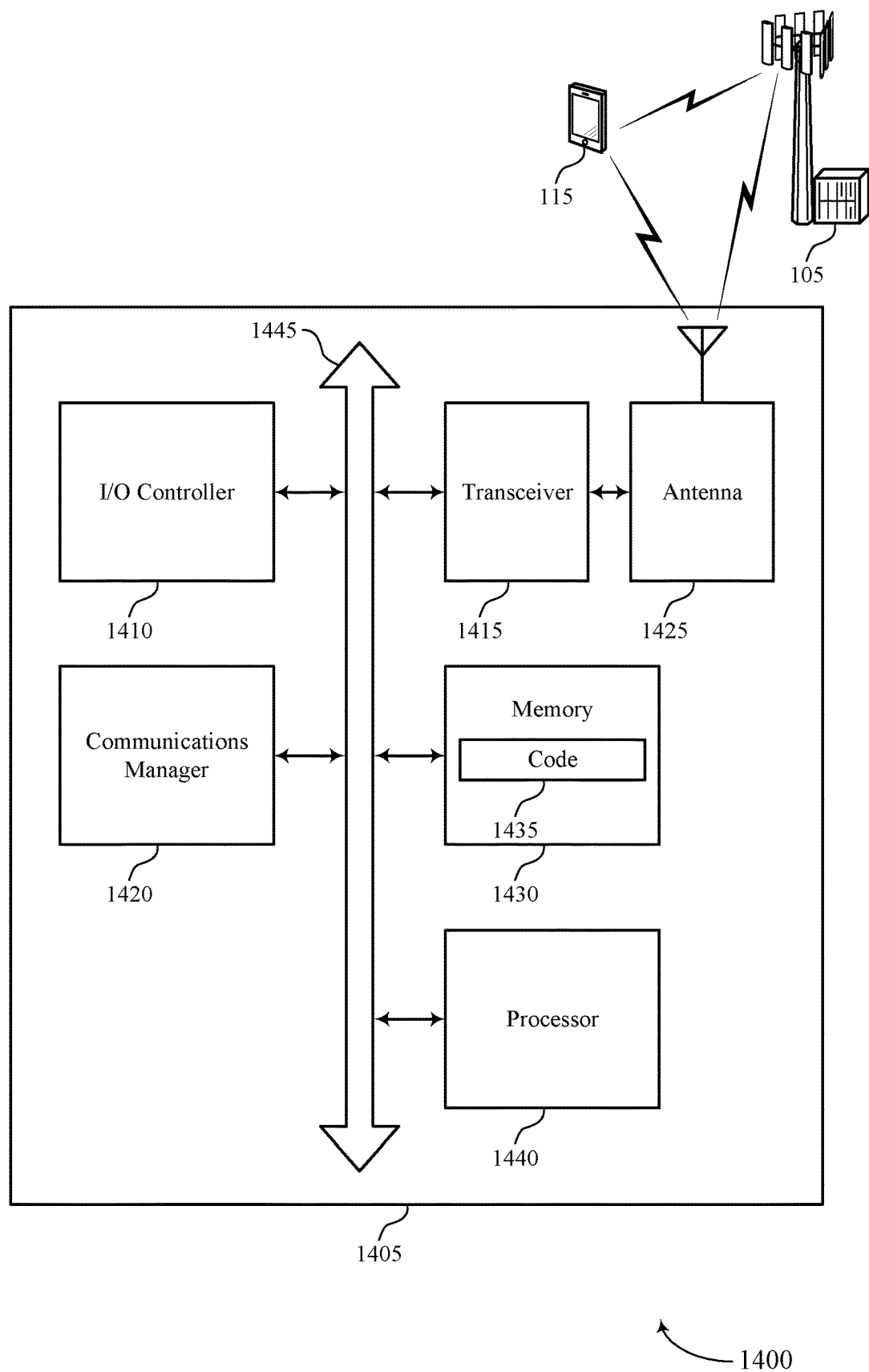
FIG. 14 shows a diagram of a system including a device that supports polarization adjusted channel coding design for complexity reduction in accordance with one or more aspects of the present disclosure.

FIG. 14 shows a diagram of a system 1400 including a device 1405 that supports polarization adjusted channel coding design for complexity reduction in accordance with one or more aspects of the present disclosure. The device 1405 may be an example of or include the components of a device 1105, a device 1205, or a UE 115 as described herein. The device 1405 may communicate (e.g., wirelessly) with one or more network entities 105, one or more UEs 115, or any combination thereof. The device 1405 may include components for bi-directional voice and data communications including components for transmitting and receiving communications, such as a communications manager 1420, an input/output (I/O) controller 1410, a transceiver 1415, an antenna 1425, a memory 1430, code 1435, and a processor 1440. These components may be in electronic communication or otherwise coupled (e.g., operatively, communicatively, functionally, electronically, electrically) via one or more buses (e.g., a bus 1445).

The I/O controller 1410 may manage input and output signals for the device 1405. The I/O controller 1410 may also manage peripherals not integrated into the device 1405. In some cases, the I/O controller 1410 may represent a physical connection or port to an external peripheral. In some cases, the I/O controller 1410 may utilize an operating system such as iOS®, ANDROID®, MS-DOS®, MS-WINDOWS®, OS/2®, UNIX®, LINUX®, or another known operating system. Additionally or alternatively, the I/O controller 1410 may represent or interact with a modem, a keyboard, a mouse, a touchscreen, or a similar device. In some cases, the I/O controller 1410 may be implemented as part of a processor, such as the processor 1440. In some cases, a user may interact with the device 1405 via the I/O controller 1410 or via hardware components controlled by the I/O controller 1410.

In some cases, the device 1405 may include a single antenna 1425. However, in some other cases, the device 1405 may have more than one antenna 1425, which may be capable of concurrently transmitting or receiving multiple wireless transmissions. The transceiver 1415 may communicate bi-directionally, via the one or more antennas 1425, wired, or wireless links as described herein. For example, the transceiver 1415 may represent a wireless transceiver and may communicate bi-directionally with another wireless transceiver. The transceiver 1415 may also include a modem to modulate the packets, to provide the modulated packets to one or more antennas 1425 for transmission, and to demodulate packets received from the one or more antennas 1425. The transceiver 1415, or the transceiver 1415 and one or more antennas 1425, may be an example of a transmitter 1115, a transmitter 1215, a receiver 1110, a receiver 1210, or any combination thereof or component thereof, as described herein.

The memory 1430 may include random access memory (RAM) and read-only memory (ROM). The memory 1430 may store computer-readable, computer-executable code 1435 including instructions that, when executed by the processor 1440, cause the device 1405 to perform various functions described herein. The code 1435 may be stored in a non-transitory computer-readable medium such as system memory or another type of memory. In some cases, the code 1435 may not be directly executable by the processor 1440 but may cause a computer (e.g., when compiled and executed) to perform functions described herein. In some cases, the memory 1430 may contain, among other things, a basic I/O system (BIOS) which may control basic hardware or software operation such as the interaction with peripheral components or devices.

The processor 1440 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1440 may be configured to operate a memory array using a memory controller. In some other cases, a memory controller may be integrated into the processor 1440. The processor 1440 may be configured to execute computer-readable instructions stored in a memory (e.g., the memory 1430) to cause the device 1405 to perform various functions (e.g., functions or tasks supporting polarization adjusted channel coding design for complexity reduction). For example, the device 1405 or a component of the device 1405 may include a processor 1440 and memory 1430 coupled with or to the processor 1440, the processor 1440 and memory 1430 configured to perform various functions described herein.

The communications manager 1420 may support wireless communications at a first wireless device in accordance with examples as disclosed herein. For example, the communications manager 1420 may be configured as or otherwise support a means for receiving an encoded set of bits corresponding to a set of information bits. The communications manager 1420 may be configured as or otherwise support a means for performing a depolarizing transform using the encoded set of bits to obtain a set of multiple subsets of bits corresponding to a set of multiple polarization levels, the set of multiple subsets of bits including at least a first subset of bits and a second subset of bits. The communications manager 1420 may be configured as or otherwise support a means for decoding the first subset of bits of the set of multiple subsets for a first polarization level of the set of multiple polarization levels according to a first channel decoding scheme. The communications manager 1420 may be configured as or otherwise support a means for decoding the second subset of bits of the set of multiple subsets for a second polarization level of the set of multiple polarization levels according to a second channel decoding scheme. The communications manager 1420 may be configured as or otherwise support a means for processing the decoded first subset of bits and the decoded second subset of bits to obtain a set of decoded bits corresponding to the set of information bits.

By including or configuring the communications manager 1420 in accordance with examples as described herein, the device 1405 may support techniques for reduced complexity in channel coding schemes. For example, the device 1405 may combine polarization techniques (e.g., polarizing transforms) with channel decoding schemes and coding rates associated with reduced complexity, such that the device 1405 may successfully receive and decode a set of encoded bits. Additionally, reducing complexity of the channel coding schemes may provide reduced latency and processing without adversely affecting performance, and may support improved utilization of processing capabilities and communication resources.

In some examples, the communications manager 1420 may be configured to perform various operations (e.g., receiving, monitoring, transmitting) using or otherwise in cooperation with the transceiver 1415, the one or more antennas 1425, or any combination thereof. Although the communications manager 1420 is illustrated as a separate component, in some examples, one or more functions described with reference to the communications manager 1420 may be supported by or performed by the processor 1440, the memory 1430, the code 1435, or any combination thereof. For example, the code 1435 may include instructions executable by the processor 1440 to cause the device 1405 to perform various aspects of polarization adjusted channel coding design for complexity reduction as described herein, or the processor 1440 and the memory 1430 may be otherwise configured to perform or support such operations.

Figure 15:
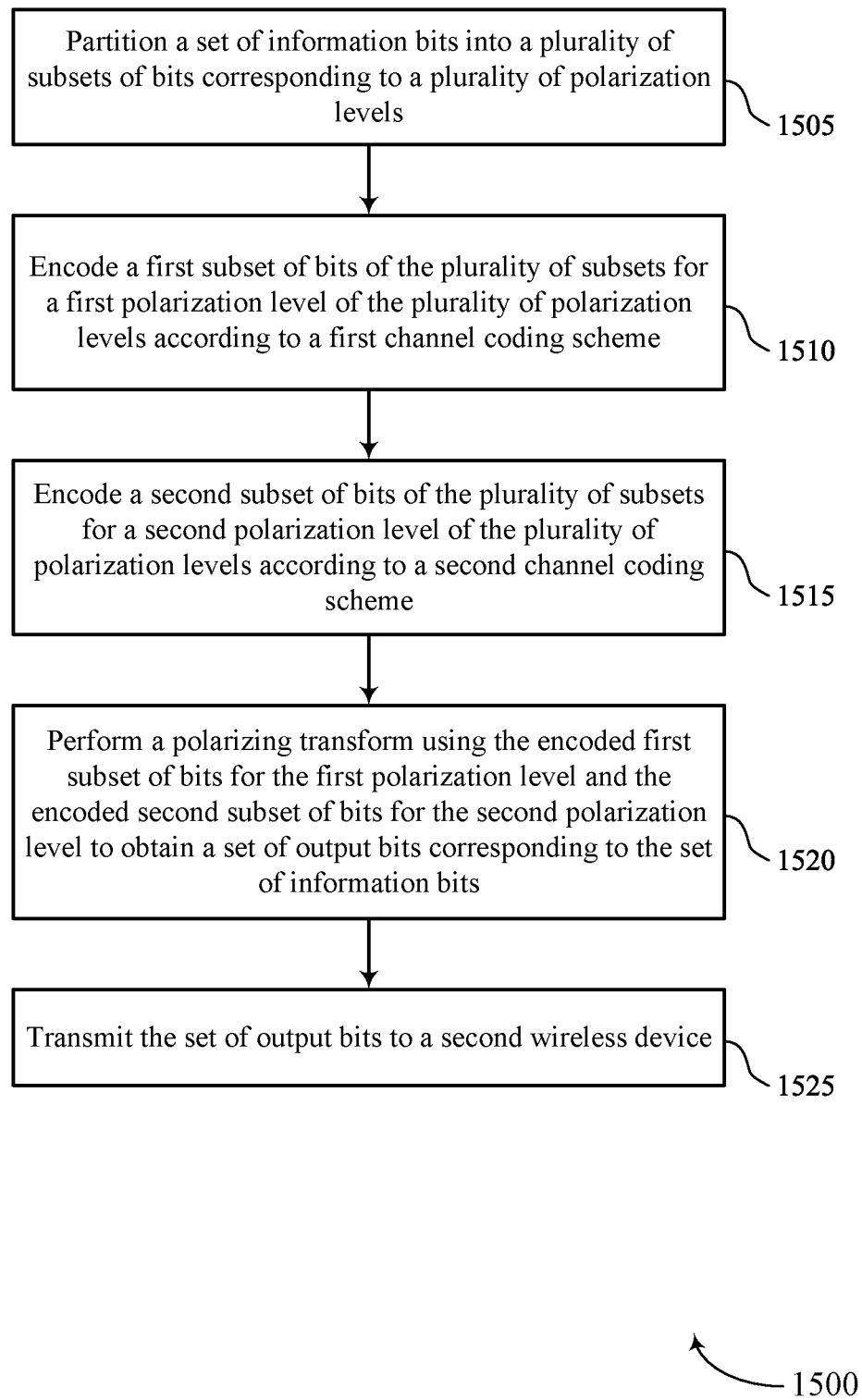
FIGS. 15 through 18 show flowcharts illustrating methods that support polarization adjusted channel coding design for complexity reduction in accordance with one or more aspects of the present disclosure.

FIG. 15 shows a flowchart illustrating a method 1500 that supports polarization adjusted channel coding design for complexity reduction in accordance with one or more aspects of the present disclosure. The operations of the method 1500 may be implemented by a network entity or its components as described herein. For example, the operations of the method 1500 may be performed by a network entity as described with reference to FIGS. 1 through 10. In some examples, a network entity may execute a set of instructions to control the functional elements of the network entity to perform the described functions. Additionally, or alternatively, the network entity may perform aspects of the described functions using special-purpose hardware.

At 1505, the method may include partitioning a set of information bits into a set of multiple subsets of bits corresponding to a set of multiple polarization levels. The operations of 1505 may be performed in accordance with examples as disclosed herein. In some examples, aspects of the operations of 1505 may be performed by a bit allocation component 925 as described with reference to FIG. 9.

At 1510, the method may include encoding a first subset of bits of the set of multiple subsets for a first polarization level of the set of multiple polarization levels according to a first channel coding scheme. The operations of 1510 may be performed in accordance with examples as disclosed herein. In some examples, aspects of the operations of 1510 may be performed by an encoding component 930 as described with reference to FIG. 9.

At 1515, the method may include encoding a second subset of bits of the set of multiple subsets for a second polarization level of the set of multiple polarization levels according to a second channel coding scheme. The operations of 1515 may be performed in accordance with examples as disclosed herein. In some examples, aspects of the operations of 1515 may be performed by an encoding component 930 as described with reference to FIG. 9.

At 1520, the method may include performing a polarizing transform using the encoded first subset of bits for the first polarization level and the encoded second subset of bits for the second polarization level to obtain a set of output bits corresponding to the set of information bits. The operations of 1520 may be performed in accordance with examples as disclosed herein. In some examples, aspects of the operations of 1520 may be performed by a polarizing transform component 935 as described with reference to FIG. 9.

At 1525, the method may include transmitting the set of output bits to a second wireless device. The operations of 1525 may be performed in accordance with examples as disclosed herein. In some examples, aspects of the operations of 1525 may be performed by an output bit transmitter 940 as described with reference to FIG. 9.

Figure 16:
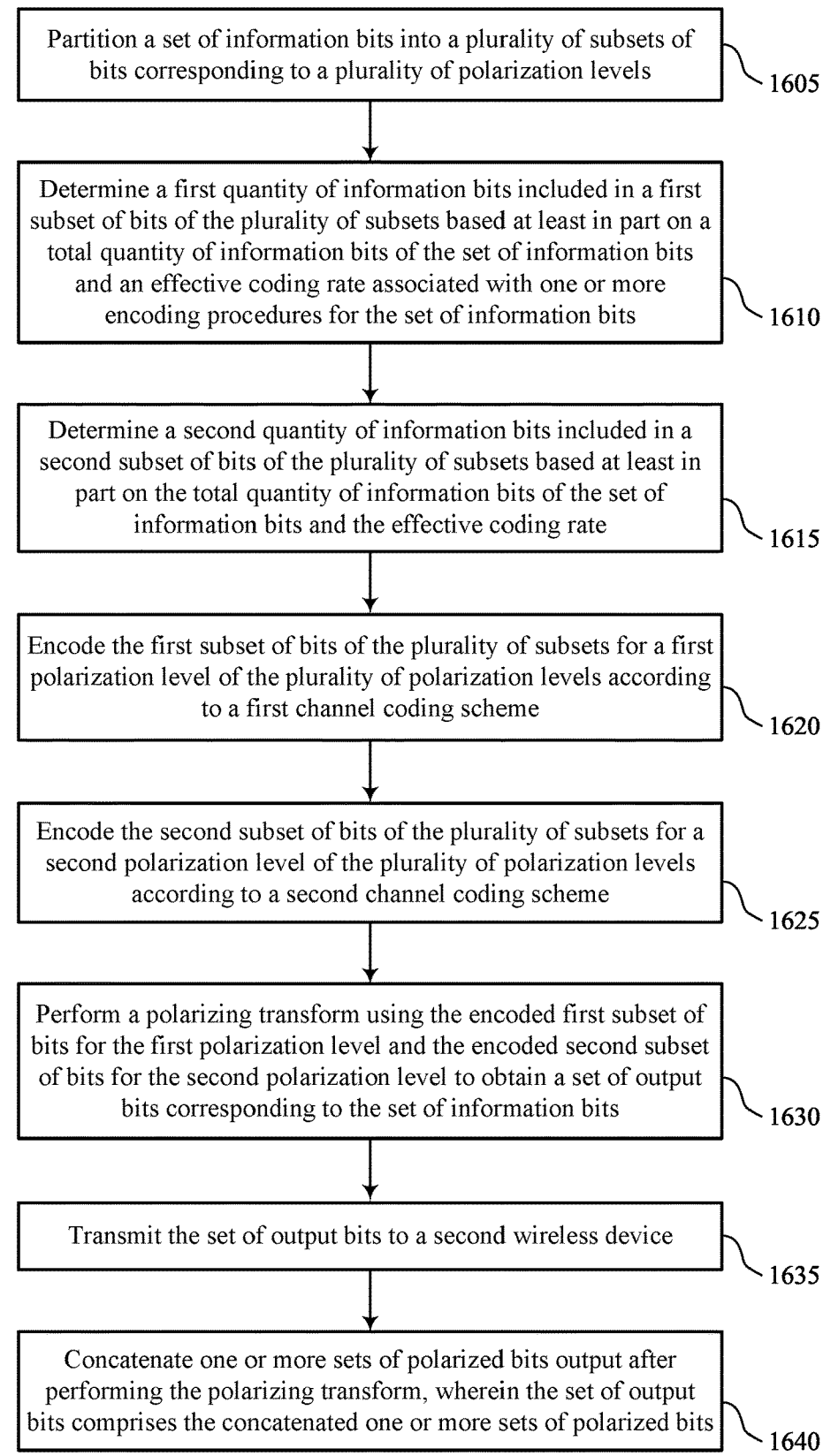

FIG. 16 shows a flowchart illustrating a method 1600 that supports polarization adjusted channel coding design for complexity reduction in accordance with one or more aspects of the present disclosure. The operations of the method 1600 may be implemented by a network entity or its components as described herein. For example, the operations of the method 1600 may be performed by a network entity as described with reference to FIGS. 1 through 10. In some examples, a network entity may execute a set of instructions to control the functional elements of the network entity to perform the described functions. Additionally, or alternatively, the network entity may perform aspects of the described functions using special-purpose hardware.

At 1605, the method may include partitioning a set of information bits into a set of multiple subsets of bits corresponding to a set of multiple polarization levels. The operations of 1605 may be performed in accordance with examples as disclosed herein. In some examples, aspects of the operations of 1605 may be performed by a bit allocation component 925 as described with reference to FIG. 9.

At 1610, the method may include determining a first quantity of information bits included in a first subset of bits of the set of multiple subsets based on a total quantity of information bits of the set of information bits and an effective coding rate associated with one or more encoding procedures for the set of information bits. The operations of 1610 may be performed in accordance with examples as disclosed herein. In some examples, aspects of the operations of 1610 may be performed by a bit allocation component 925 as described with reference to FIG. 9.

At 1615, the method may include determining a second quantity of information bits included in a second subset of bits of the set of multiple subsets based on the total quantity of information bits of the set of information bits and the effective coding rate. The operations of 1615 may be performed in accordance with examples as disclosed herein. In some examples, aspects of the operations of 1615 may be performed by a bit allocation component 925 as described with reference to FIG. 9.

At 1620, the method may include encoding the first subset of bits of the set of multiple subsets for a first polarization level of the set of multiple polarization levels according to a first channel coding scheme. The operations of 1620 may be performed in accordance with examples as disclosed herein. In some examples, aspects of the operations of 1620 may be performed by an encoding component 930 as described with reference to FIG. 9.

At 1625, the method may include encoding the second subset of bits of the set of multiple subsets for a second polarization level of the set of multiple polarization levels according to a second channel coding scheme. The operations of 1625 may be performed in accordance with examples as disclosed herein. In some examples, aspects of the operations of 1625 may be performed by an encoding component 930 as described with reference to FIG. 9.

At 1630, the method may include performing a polarizing transform using the encoded first subset of bits for the first polarization level and the encoded second subset of bits for the second polarization level to obtain a set of output bits corresponding to the set of information bits. The operations of 1630 may be performed in accordance with examples as disclosed herein. In some examples, aspects of the operations of 1630 may be performed by a polarizing transform component 935 as described with reference to FIG. 9.

At 1635, the method may include concatenating one or more sets of polarized bits output after performing the polarizing transform, where the set of output bits includes the concatenated one or more sets of polarized bits. The operations of 1635 may be performed in accordance with examples as disclosed herein. In some examples, aspects of the operations of 1635 may be performed by a concatenating component 945 as described with reference to FIG. 9.

At 1640, the method may include transmitting the set of output bits to a second wireless device. The operations of 1640 may be performed in accordance with examples as disclosed herein. In some examples, aspects of the operations of 1640 may be performed by an output bit transmitter 940 as described with reference to FIG. 9.

Figure 17:
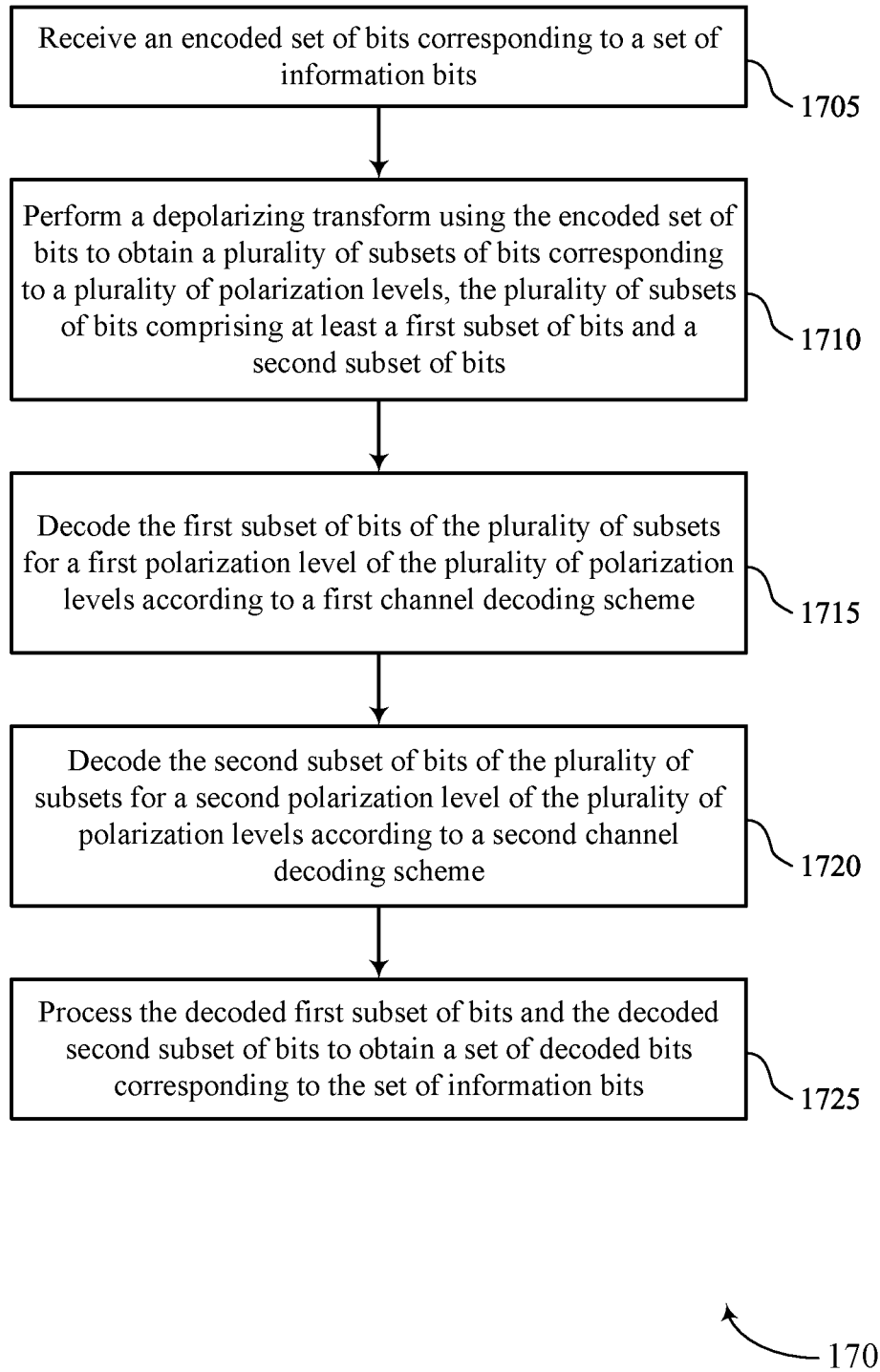

FIG. 17 shows a flowchart illustrating a method 1700 that supports polarization adjusted channel coding design for complexity reduction in accordance with one or more aspects of the present disclosure. The operations of the method 1700 may be implemented by a UE or its components as described herein. For example, the operations of the method 1700 may be performed by a UE 115 as described with reference to FIGS. 1 through 6 and 11 through 14. In some examples, a UE may execute a set of instructions to control the functional elements of the UE to perform the described functions. Additionally, or alternatively, the UE may perform aspects of the described functions using special-purpose hardware.

At 1705, the method may include receiving an encoded set of bits corresponding to a set of information bits. The operations of 1705 may be performed in accordance with examples as disclosed herein. In some examples, aspects of the operations of 1705 may be performed by an encoded bit receiver 1325 as described with reference to FIG. 13.

At 1710, the method may include performing a depolarizing transform using the encoded set of bits to obtain a set of multiple subsets of bits corresponding to a set of multiple polarization levels, the set of multiple subsets of bits including at least a first subset of bits and a second subset of bits. The operations of 1710 may be performed in accordance with examples as disclosed herein. In some examples, aspects of the operations of 1710 may be performed by a depolarizing transform component 1330 as described with reference to FIG. 13.

At 1715, the method may include decoding the first subset of bits of the set of multiple subsets for a first polarization level of the set of multiple polarization levels according to a first channel decoding scheme. The operations of 1715 may be performed in accordance with examples as disclosed herein. In some examples, aspects of the operations of 1715 may be performed by a decoding component 1335 as described with reference to FIG. 13.

At 1720, the method may include decoding the second subset of bits of the set of multiple subsets for a second polarization level of the set of multiple polarization levels according to a second channel decoding scheme. The operations of 1720 may be performed in accordance with examples as disclosed herein. In some examples, aspects of the operations of 1720 may be performed by a decoding component 1335 as described with reference to FIG. 13.

At 1725, the method may include processing the decoded first subset of bits and the decoded second subset of bits to obtain a set of decoded bits corresponding to the set of information bits. The operations of 1725 may be performed in accordance with examples as disclosed herein. In some examples, aspects of the operations of 1725 may be performed by a decoded bit processing component 1340 as described with reference to FIG. 13.

Figure 18:
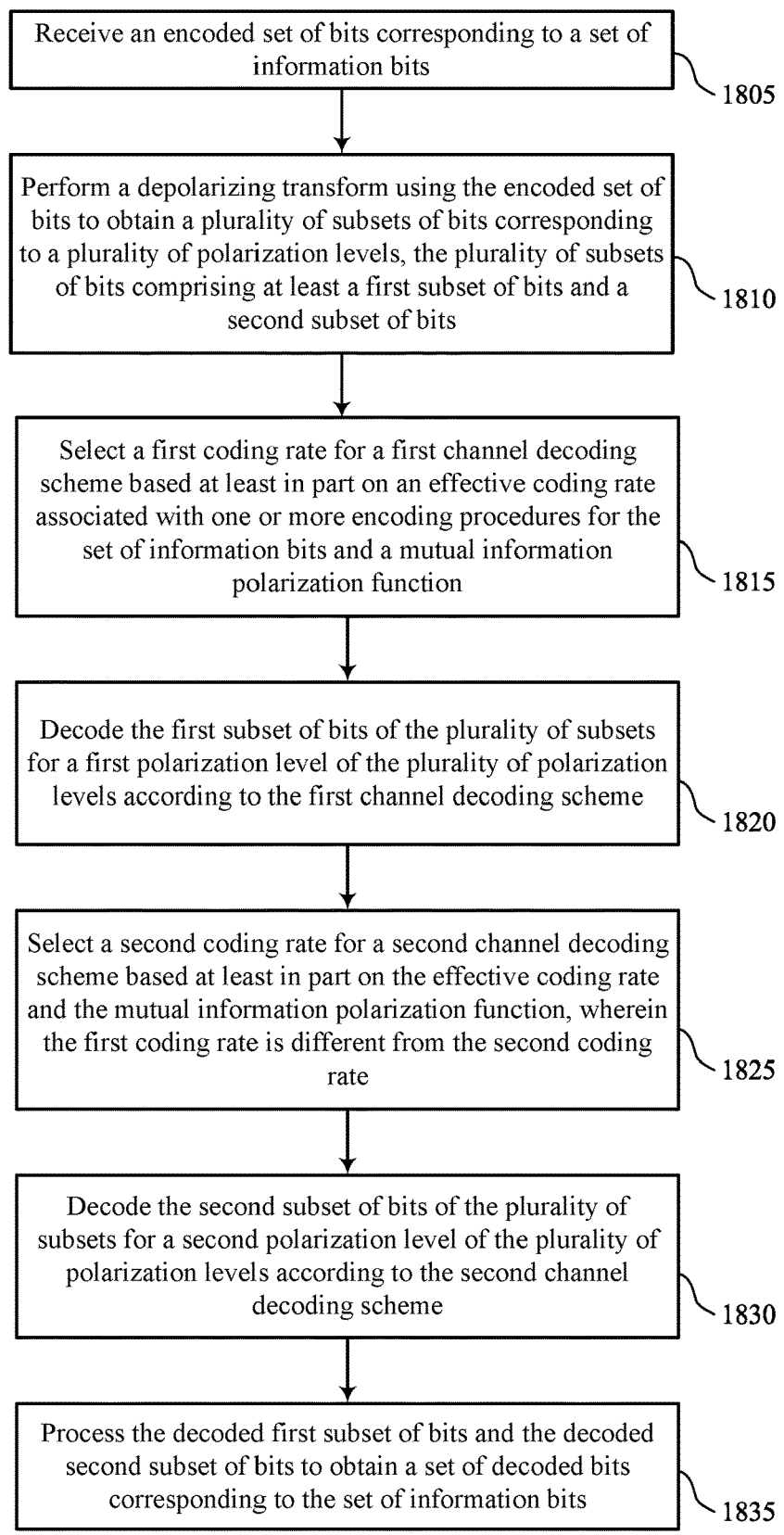

FIG. 18 shows a flowchart illustrating a method 1800 that supports polarization adjusted channel coding design for complexity reduction in accordance with one or more aspects of the present disclosure. The operations of the method 1800 may be implemented by a UE or its components as described herein. For example, the operations of the method 1800 may be performed by a UE 115 as described with reference to FIGS. 1 through 6 and 11 through 14. In some examples, a UE may execute a set of instructions to control the functional elements of the UE to perform the described functions. Additionally, or alternatively, the UE may perform aspects of the described functions using special-purpose hardware.

At 1805, the method may include receiving an encoded set of bits corresponding to a set of information bits. The operations of 1805 may be performed in accordance with examples as disclosed herein. In some examples, aspects of the operations of 1805 may be performed by an encoded bit receiver 1325 as described with reference to FIG. 13.

At 1810, the method may include performing a depolarizing transform using the encoded set of bits to obtain a set of multiple subsets of bits corresponding to a set of multiple polarization levels, the set of multiple subsets of bits including at least a first subset of bits and a second subset of bits. The operations of 1810 may be performed in accordance with examples as disclosed herein. In some examples, aspects of the operations of 1810 may be performed by a depolarizing transform component 1330 as described with reference to FIG. 13.

At 1815, the method may include selecting a first coding rate for a first channel decoding scheme based on an effective coding rate associated with one or more encoding procedures for the set of information bits and a mutual information polarization function. The operations of 1815 may be performed in accordance with examples as disclosed herein. In some examples, aspects of the operations of 1815 may be performed by a decoding component 1335 as described with reference to FIG. 13.

At 1820, the method may include decoding the first subset of bits of the set of multiple subsets for a first polarization level of the set of multiple polarization levels according to a first channel decoding scheme. The operations of 1820 may be performed in accordance with examples as disclosed herein. In some examples, aspects of the operations of 1820 may be performed by a decoding component 1335 as described with reference to FIG. 13.

At 1825, the method may include selecting a second coding rate for a second channel decoding scheme based on the effective coding rate and the mutual information polarization function, where the first coding rate is different from the second coding rate. The operations of 1825 may be performed in accordance with examples as disclosed herein.

In some examples, aspects of the operations of 1825 may be performed by a decoding component 1335 as described with reference to FIG. 13.

At 1830, the method may include decoding the second subset of bits of the set of multiple subsets for a second polarization level of the set of multiple polarization levels according to a second channel decoding scheme. The operations of 1830 may be performed in accordance with examples as disclosed herein. In some examples, aspects of the operations of 1830 may be performed by a decoding component 1335 as described with reference to FIG. 13.

At 1835, the method may include processing the decoded first subset of bits and the decoded second subset of bits to obtain a set of decoded bits corresponding to the set of information bits. The operations of 1835 may be performed in accordance with examples as disclosed herein. In some examples, aspects of the operations of 1835 may be performed by a decoded bit processing component 1340 as described with reference to FIG. 13.

The following provides an overview of aspects of the present disclosure:

Aspect 1: A method for wireless communications at a first wireless device, comprising: partitioning a set of information bits into a plurality of subsets of bits corresponding to a plurality of polarization levels; encoding a first subset of bits of the plurality of subsets for a first polarization level of the plurality of polarization levels according to a first channel coding scheme; encoding a second subset of bits of the plurality of subsets for a second polarization level of the plurality of polarization levels according to a second channel coding scheme; performing a polarizing transform using the encoded first subset of bits for the first polarization level and the encoded second subset of bits for the second polarization level to obtain a set of output bits corresponding to the set of information bits; and transmitting the set of output bits to a second wireless device.

Aspect 2: The method of aspect 1, further comprising: jointly encoding a third subset of bits of the plurality of subsets with the second subset of bits for a third polarization level of the plurality of polarization levels according to the second channel coding scheme, wherein the polarizing transform is performed using the encoded first subset of bits for the first polarization level, the encoded second subset of bits for the second polarization level, and the encoded third subset of bits for the third polarization level.

Aspect 3: The method of any of aspects 1 through 2, wherein partitioning the set of information bits comprises: partitioning the set of information bits into the plurality of subsets of bits based at least in part on a quantity of coding levels associated with one or more encoding procedures for the set of information bits, wherein a quantity of the plurality of subsets of bits is equal to the quantity of coding levels.

Aspect 4: The method of aspect 3, wherein performing the polarizing transform comprises: performing the polarizing transform for a plurality of encoded subsets of bits corresponding to a plurality of channels based at least in part on a quantity of polarization levels for the polarizing transform, wherein a quantity of the plurality of encoded subsets of bits is equal to the quantity of polarization levels for the polarizing transform.

Aspect 5: The method of any of aspects 3 through 4, further comprising: determining a first subset of coding levels associated with the first channel coding scheme; and determining a second subset of coding levels associated with the second channel coding scheme, wherein the first subset of bits and the second subset of bits are encoded based at least in part on the first subset of coding levels and the second subset of coding levels.

Aspect 6: The method of aspect 5, wherein the first subset of coding levels is associated with the first channel coding scheme based at least in part on a channel reliability of the first polarization level; and the second subset of coding levels is associated with the second channel coding scheme based at least in part on a channel reliability of the second polarization level.

Aspect 7: The method of aspect 6, wherein the first channel coding scheme is different from the second channel coding scheme.

Aspect 8: The method of aspect 7, wherein the first channel coding scheme comprises an LDPC coding scheme.

Aspect 9: The method of any of aspects 3 through 8, further comprising: performing a first CRC procedure using the first subset of bits; and performing a second CRC procedure using the second subset of bits.

Aspect 10: The method of any of aspects 1 through 9, further comprising: selecting a first coding rate for the first channel coding scheme based at least in part on an effective coding rate associated with one or more encoding procedures for the set of information bits and a mutual information polarization function; and selecting a second coding rate for the second channel coding scheme based at least in part on the effective coding rate and the mutual information polarization function, wherein the first coding rate is different from the second coding rate.

Aspect 11: The method of aspect 10, further comprising: selecting the first channel coding scheme based at least in part on the first coding rate satisfying a threshold; and selecting the second channel coding scheme based at least in part on the second coding rate failing to satisfy the threshold.

Aspect 12: The method of any of aspects 1 through 11, further comprising: concatenating one or more sets of polarized bits output after performing the polarizing transform, wherein the set of output bits comprises the concatenated one or more sets of polarized bits.

Aspect 13: The method of any of aspects 1 through 12, wherein partitioning the set of information bits further comprises: determining a first quantity of information bits included in the first subset of bits of the plurality of subsets based at least in part on a total quantity of information bits of the set of information bits and an effective coding rate associated with one or more encoding procedures for the set of information bits; and determining a second quantity of information bits included in the second subset of bits of the plurality of subsets based at least in part on the total quantity of information bits of the set of information bits and the effective coding rate.

Aspect 14: The method of aspect 13, further comprising: determining a first mutual information polarization function for the first polarization level of the plurality of polarization levels based at least in part on the effective coding rate and a capacity of the first polarization level, wherein the first quantity of information bits is determined based at least in part on the first mutual information polarization function; and determining a second mutual information polarization function for the second polarization level of the plurality of polarization levels based at least in part on the effective coding rate and a capacity of the second polarization level, wherein the second quantity of information bits is determined based at least in part on the second mutual information polarization function.

Aspect 15: The method of any of aspects 13 through 14, wherein the polarizing transform is based at least in part on a polar code, the method further comprising: determining the second quantity of information bits based at least in part on the first quantity of information bits; and determining a third quantity of information bits included in a third subset of the plurality of subsets based at least in part on the total quantity of information bits of the set of information bits, the effective coding rate, and the second quantity of information bits.

Aspect 16: The method of any of aspects 13 through 15, further comprising: receiving, from the second wireless device, a signal indicating the total quantity of information bits of the set of information bits and the effective coding rate.

Aspect 17: The method of any of aspects 1 through 7 and 9 through 16, wherein the first channel coding scheme and the second channel coding scheme comprise at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof.

Aspect 18: The method of any of aspects 1 through 17, wherein performing the polarizing transform comprises: encoding the first subset of bits and the second subset of bits using an inner error correction code.

Aspect 19: The method of aspect 18, wherein encoding the first subset of bits and the second subset of bits using an inner error correction code comprises: jointly encoding a first bit from the first subset of bits and a second bit from the second subset of bits using a first inner error correction code; and jointly encoding a third bit from the first subset of bits and a fourth bit from the second subset of bits using a second inner error correction code.

Aspect 20: The method of any of aspects 18 through 19, wherein the inner error correction code comprises a simplex code.

Aspect 21: A method for wireless communications at a first wireless device, comprising: receiving an encoded set of bits corresponding to a set of information bits; performing a depolarizing transform using the encoded set of bits to obtain a plurality of subsets of bits corresponding to a plurality of polarization levels, the plurality of subsets of bits comprising at least a first subset of bits and a second subset of bits; decoding the first subset of bits of the plurality of subsets for a first polarization level of the plurality of polarization levels according to a first channel decoding scheme; decoding the second subset of bits of the plurality of subsets for a second polarization level of the plurality of polarization levels according to a second channel decoding scheme; and processing the decoded first subset of bits and the decoded second subset of bits to obtain a set of decoded bits corresponding to the set of information bits.

Aspect 22: The method of aspect 21, further comprising: jointly decoding a third subset of bits of the plurality of subsets with the second subset of bits for a third polarization level of the plurality of polarization levels according to the second channel decoding scheme.

Aspect 23: The method of any of aspects 21 through 22, wherein the plurality of subsets of bits is based at least in part on a quantity of coding levels associated with one or more decoding procedures for the set of information bits, a quantity of the plurality of subsets of bits is equal to the quantity of coding levels.

Aspect 24: The method of aspect 23, wherein performing the depolarizing transform comprises: performing the depolarizing transform for a plurality of encoded subsets of bits corresponding to a plurality of channels based at least in part on a quantity of polarization levels for the depolarizing transform, wherein a quantity of the plurality of encoded subsets of bits is equal to the quantity of polarization levels for the depolarizing transform.

Aspect 25: The method of any of aspects 23 through 24, further comprising:

determining a first subset of coding levels associated with the first channel decoding scheme; and determining a second subset of coding levels associated with the second channel decoding scheme, wherein the first subset of bits and the second subset of bits are decoded based at least in part on the first subset of coding levels and the second subset of coding levels.

Aspect 26: The method of aspect 25, wherein the first subset of coding levels is associated with the first channel decoding scheme based at least in part on a channel reliability of the first polarization level; and the second subset of coding levels is associated with the second channel decoding scheme based at least in part on a channel reliability of the second polarization level.

Aspect 27: The method of aspect 26, wherein the first channel decoding scheme is different from the second channel decoding scheme.

Aspect 28: The method of aspect 27, wherein the first channel decoding scheme comprises an LDPC coding scheme.

Aspect 29: The method of any of aspects 23 through 28, further comprising: performing a first CRC procedure using the first subset of bits; and performing a second CRC procedure using the second subset of bits.

Aspect 30: The method of any of aspects 21 through 29, further comprising: selecting a first coding rate for the first channel decoding scheme based at least in part on an effective coding rate associated with one or more encoding procedures for the set of information bits and a mutual information polarization function; and selecting a second coding rate for the second channel decoding scheme based at least in part on the effective coding rate and the mutual information polarization function, wherein the first coding rate is different from the second coding rate.

Aspect 31: The method of aspect 30, further comprising: selecting the first channel decoding scheme based at least in part on the first coding rate satisfying a threshold; and selecting the second channel decoding scheme based at least in part on the second coding rate failing to satisfy the threshold.

Aspect 32: The method of any of aspects 21 through 31, wherein processing the decoded first subset of bits and the decoded second subset of bits further comprises: concatenating one or more subsets of decoded bits including at least the decoded first subset of bits and the decoded second subset of bits, wherein the set of decoded bits comprises the concatenated one or more subsets of decoded bits.

Aspect 33: The method of any of aspects 21 through 32, wherein performing the depolarizing transform further comprises: determining a first quantity of information bits included in the first subset of bits of the plurality of subsets based at least in part on a total quantity of information bits of the set of information bits and an effective coding rate associated with one or more decoding procedures for the set of information bits; and determining a second quantity of information bits included in the second subset of bits of the plurality of subsets based at least in part on the total quantity of information bits of the set of information bits and the effective coding rate.

Aspect 34: The method of aspect 33, further comprising: determining a first mutual information polarization function for the first polarization level of the plurality of polarization levels based at least in part on the effective coding rate and a capacity of the first polarization level, wherein the first quantity of information bits is determined based at least in part on the first mutual information polarization function; and determining a second mutual information polarization function for the second polarization level of the plurality of polarization levels based at least in part on the effective coding rate and a capacity of the second polarization level, wherein the second quantity of information bits is determined based at least in part on the second mutual information polarization function.

Aspect 35: The method of any of aspects 33 through 34, wherein the depolarizing transform is based at least in part on a polar code, the method further comprising: determining the second quantity of information bits based at least in part on the first quantity of information bits; and determining a third quantity of information bits included in a third subset of the plurality of subsets based at least in part on the total quantity of information bits of the set of information bits, the effective coding rate, and the second quantity of information bits.

Aspect 36: The method of any of aspects 33 through 35, further comprising: receiving a signal indicating the total quantity of information bits of the set of information bits and the effective coding rate.

Aspect 37: The method of any of aspects 21 through 27 and 29 through 36, wherein the first channel decoding scheme and the second channel decoding scheme comprise at least one of an LDPC coding scheme, a Reed-Solomon coding scheme, an FEC coding scheme, a polar coding scheme, a Reed Muller coding scheme, a staircase coding scheme, a product coding scheme, a convolutional coding scheme, a turbo coding scheme, or a combination thereof.

Aspect 38: The method of any of aspects 21 through 37, wherein performing the depolarizing transform further comprises: decoding the first subset of bits and the second subset of bits using an inner error correction code.

Aspect 39: The method of aspect 38, wherein decoding the first subset of bits and the second subset of bits using an inner error correction code comprises: jointly decoding a first bit from the first subset of bits and a second bit from the second subset of bits using a first inner error correction code; and jointly decoding a third bit from the first subset of bits and a fourth bit from the second subset of bits using a second inner error correction code.

Aspect 40: The method of any of aspects 38 through 39, wherein the inner error correction code comprises a simplex code.

Aspect 41: An apparatus for wireless communications at a first wireless device, comprising memory, a transmitter, and a communications manager, communicatively coupled to the memory and the transmitter, the communications manager configured to perform a method of any of aspects 1 through 20.

Aspect 42: An apparatus for wireless communications at a first wireless device, comprising at least one means for performing a method of any of aspects 1 through 20.

Aspect 43: A non-transitory computer-readable medium storing code for wireless communications at a first wireless device, the code comprising instructions executable by a processor to perform a method of any of aspects 1 through 20.

Aspect 44: An apparatus for wireless communications at a first wireless device, comprising memory, a receiver, and a communications manager, communicatively coupled to the memory and the transmitter, the communications manager configured to perform a method of any of aspects 21 through 40.

Aspect 45: An apparatus for wireless communications at a first wireless device, comprising at least one means for performing a method of any of aspects 21 through 40.

Aspect 46: A non-transitory computer-readable medium storing code for wireless communications at a first wireless device, the code comprising instructions executable by a processor to perform a method of any of aspects 21 through 40.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications at a first wireless device, comprising:
    partitioning a set of information bits into a plurality of subsets of bits corresponding to a plurality of polarization levels based at least in part on one or more mutual information polarization functions that are representative of respective relationships between a coding rate of a channel and respective coding rates of the plurality of polarization levels, wherein the partitioning comprises:
        allocating a first quantity of bits to a first subset of bits, wherein the first quantity of bits is determined based at least in part on a first coding rate determined using a first mutual information polarization function; and
        allocating a second quantity of bits to a second subset of bits, wherein the second quantity of bits is determined based at least in part on a second coding rate determined using a second mutual information polarization function;
    encoding the first subset of bits for a first polarization level of the plurality of polarization levels according to a first channel coding scheme having the first coding rate;
    encoding the second subset of bits for a second polarization level of the plurality of polarization levels according to a second channel coding scheme having the second coding rate;
    performing a polarizing transform using the encoded first subset of bits for the first polarization level and the encoded second subset of bits for the second polarization level to obtain a set of output bits corresponding to the set of information bits and
    transmitting the set of output bits to a second wireless device.

2. The method of claim 1, further comprising:
    jointly encoding a third subset of bits of the plurality of subsets with the second subset of bits for a third polarization level of the plurality of polarization levels according to the second channel coding scheme, wherein the polarizing transform is performed using the encoded first subset of bits for the first polarization level, the encoded second subset of bits for the second polarization level, and the encoded third subset of bits for the third polarization level.

3. The method of claim 1, wherein partitioning the set of information bits comprises:
    partitioning the set of information bits into the plurality of subsets of bits based at least in part on a quantity of coding levels associated with one or more encoding procedures for the set of information bits, wherein a quantity of the plurality of subsets of bits is equal to the quantity of coding levels.

4. The method of claim 3, wherein performing the polarizing transform comprises:
    performing the polarizing transform for a plurality of encoded subsets of bits corresponding to a plurality of channels based at least in part on a quantity of polarization levels for the polarizing transform, wherein a quantity of the plurality of encoded subsets of bits is equal to the quantity of polarization levels for the polarizing transform.

5. The method of claim 3, further comprising:
    determining a first subset of coding levels associated with the first channel coding scheme; and
    determining a second subset of coding levels associated with the second channel coding scheme, wherein the first subset of bits and the second subset of bits are encoded based at least in part on the first subset of coding levels and the second subset of coding levels.

6. The method of claim 5, wherein:
    the first subset of coding levels is associated with the first channel coding scheme based at least in part on a channel reliability of the first polarization level; and
    the second subset of coding levels is associated with the second channel coding scheme based at least in part on a channel reliability of the second polarization level.

7. The method of claim 6, wherein the first channel coding scheme is different from the second channel coding scheme.

8. The method of claim 7, wherein the first channel coding scheme comprises a low-density parity check coding scheme.

9. The method of claim 3, further comprising:
    performing a first cyclic redundancy check procedure using the first subset of bits; and
    performing a second cyclic redundancy check procedure using the second subset of bits.

10. The method of claim 1, further comprising:
    selecting the first coding rate for the first channel coding scheme based at least in part on an effective coding rate associated with one or more encoding procedures for the set of information bits and the first mutual information polarization function; and
    selecting the second coding rate for the second channel coding scheme based at least in part on the effective coding rate and the second mutual information polarization function, wherein the first coding rate is different from the second coding rate.

11. The method of claim 10, further comprising:
    selecting the first channel coding scheme based at least in part on the first coding rate satisfying a threshold; and
    selecting the second channel coding scheme based at least in part on the second coding rate failing to satisfy the threshold.

12. The method of claim 1, further comprising:
    concatenating one or more sets of polarized bits output after performing the polarizing transform, wherein the set of output bits comprises the concatenated one or more sets of polarized bits.

13. The method of claim 1, wherein partitioning the set of information bits further comprises:
    determining the first quantity of information bits included in the first subset of bits of the plurality of subsets based at least in part on a total quantity of information bits of the set of information bits and an effective coding rate associated with one or more encoding procedures for the set of information bits; and
    determining the second quantity of information bits included in the second subset of bits of the plurality of subsets based at least in part on the total quantity of information bits of the set of information bits and the effective coding rate.

14. The method of claim 13, further comprising:
determining the first mutual information polarization function for the first polarization level of the plurality of polarization levels based at least in part on the effective coding rate and a capacity of the first polarization level; and
determining the second mutual information polarization function for the second polarization level of the plurality of polarization levels based at least in part on the effective coding rate and a capacity of the second polarization level.

15. The method of claim 13, wherein the polarizing transform is based at least in part on a polar code, the method further comprising:
determining the second quantity of information bits based at least in part on the first quantity of information bits; and
determining a third quantity of information bits included in a third subset of the plurality of subsets based at least in part on the total quantity of information bits of the set of information bits, the effective coding rate, and the second quantity of information bits.

16. The method of claim 13, further comprising:
receiving, from the second wireless device, a signal indicating the total quantity of information bits of the set of information bits and the effective coding rate.

17. The method of claim 1, wherein the first channel coding scheme and the second channel coding scheme comprise at least one of a low-density parity check coding scheme, a Reed-Solomon coding scheme, a forward error correction coding scheme, a polar coding scheme, a Reed Muller coding scheme, a staircase coding scheme, a product coding scheme, a convolutional coding scheme, a turbo coding scheme, or a combination thereof.

18. The method of claim 1, wherein performing the polarizing transform comprises:
encoding the first subset of bits and the second subset of bits using an inner error correction code.

19. The method of claim 18, wherein encoding the first subset of bits and the second subset of bits using the inner error correction code comprises:
jointly encoding a first bit from the first subset of bits and a second bit from the second subset of bits using a first inner error correction code; and
jointly encoding a third bit from the first subset of bits and a fourth bit from the second subset of bits using a second inner error correction code.

20. The method of claim 18, wherein the inner error correction code comprises a simplex code.

21. A method for wireless communications at a first wireless device, comprising:
receiving an encoded set of bits corresponding to a set of information bits;
performing a depolarizing transform using the encoded set of bits to obtain a plurality of subsets of bits corresponding to a plurality of polarization levels, the plurality of subsets of bits comprising at least a first subset of bits and a second subset of bits,
wherein a first quantity of information bits allocated to the first subset of bits is determined based at least in part on a first coding rate determined using a first mutual information polarization function, wherein a second quantity of information bits allocated to the second subset of bits is determined based at least in part on a second coding rate determined using a second mutual information polarization function, and wherein the first mutual information polarization function and the second mutual information polarization function are representative of respective relationships between a coding rate of a channel and respective coding rates of a first polarization level and a second polarization level;
decoding the first subset of bits of the plurality of subsets for the first polarization level of the plurality of polarization levels according to a first channel decoding scheme having the first coding rate;
decoding the second subset of bits of the plurality of subsets for the second polarization level of the plurality of polarization levels according to a second channel decoding scheme having the second coding rate; and
processing the decoded first subset of bits and the decoded second subset of bits to obtain a set of decoded bits corresponding to the set of information bits.

22. The method of claim 21, further comprising:
jointly decoding a third subset of bits of the plurality of subsets with the second subset of bits for a third polarization level of the plurality of polarization levels according to the second channel decoding scheme.

23. The method of claim 21, wherein:
the plurality of subsets of bits is based at least in part on a quantity of coding levels associated with one or more decoding procedures for the set of information bits; and
a quantity of the plurality of subsets of bits is equal to the quantity of coding levels.

24. The method of claim 23, wherein performing the depolarizing transform comprises:
performing the depolarizing transform for a plurality of encoded subsets of bits corresponding to a plurality of channels based at least in part on a quantity of polarization levels for the depolarizing transform, wherein a quantity of the plurality of encoded subsets of bits is equal to the quantity of polarization levels for the depolarizing transform.

25. The method of claim 23, further comprising:
determining a first subset of coding levels associated with the first channel decoding scheme; and
determining a second subset of coding levels associated with the second channel decoding scheme, wherein the first subset of bits and the second subset of bits are decoded based at least in part on the first subset of coding levels and the second subset of coding levels.

26. The method of claim 25, wherein:
the first subset of coding levels is associated with the first channel decoding scheme based at least in part on a channel reliability of the first polarization level; and
the second subset of coding levels is associated with the second channel decoding scheme based at least in part on a channel reliability of the second polarization level.

27. The method of claim 26, wherein the first channel decoding scheme is different from the second channel decoding scheme.

28. The method of claim 27, wherein the first channel decoding scheme comprises a low-density parity check coding scheme.

29. The method of claim 23, further comprising:
performing a first cyclic redundancy check procedure using the first subset of bits; and
performing a second cyclic redundancy check procedure using the second subset of bits.

30. The method of claim 21, further comprising:
selecting the first coding rate for the first channel decoding scheme based at least in part on an effective coding rate associated with one or more encoding procedures for the set of information bits and the first mutual information polarization function; and selecting the second coding rate for the second channel decoding scheme based at least in part on the effective coding rate and the second mutual information polarization function, wherein the first coding rate is different from the second coding rate.

31. The method of claim 30, further comprising:
selecting the first channel decoding scheme based at least in part on the first coding rate satisfying a threshold; and
selecting the second channel decoding scheme based at least in part on the second coding rate failing to satisfy the threshold.

32. The method of claim 21, wherein processing the decoded first subset of bits and the decoded second subset of bits further comprises:
concatenating one or more subsets of decoded bits including at least the decoded first subset of bits and the decoded second subset of bits, wherein the set of decoded bits comprises the concatenated one or more subsets of decoded bits.

33. The method of claim 21, wherein performing the depolarizing transform further comprises:
determining the first quantity of information bits included in the first subset of bits of the plurality of subsets based at least in part on a total quantity of information bits of the set of information bits and an effective coding rate associated with one or more decoding procedures for the set of information bits; and
determining the second quantity of information bits included in the second subset of bits of the plurality of subsets based at least in part on the total quantity of information bits of the set of information bits and the effective coding rate.

34. The method of claim 33, further comprising:
determining the first mutual information polarization function for the first polarization level of the plurality of polarization levels based at least in part on the effective coding rate and a capacity of the first polarization level; and
determining the second mutual information polarization function for the second polarization level of the plurality of polarization levels based at least in part on the effective coding rate and a capacity of the second polarization level.

35. The method of claim 33, wherein the depolarizing transform is based at least in part on a polar code, the method further comprising:
determining the second quantity of information bits based at least in part on the first quantity of information bits; and
determining a third quantity of information bits included in a third subset of the plurality of subsets based at least in part on the total quantity of information bits of the set of information bits, the effective coding rate, and the second quantity of information bits.

36. The method of claim 33, further comprising:
receiving a signal indicating the total quantity of information bits of the set of information bits and the effective coding rate.

37. The method of claim 21, wherein the first channel decoding scheme and the second channel decoding scheme comprise at least one of a low-density parity check coding scheme, a Reed-Solomon coding scheme, a forward error correction coding scheme, a polar coding scheme, a Reed Muller coding scheme, a staircase coding scheme, a product coding scheme, a convolutional coding scheme, a turbo coding scheme, or a combination thereof.

38. The method of claim 21, wherein performing the depolarizing transform further comprises:
decoding the first subset of bits and the second subset of bits using an inner error correction code.

39. The method of claim 38, wherein decoding the first subset of bits and the second subset of bits using the inner error correction code comprises:
jointly decoding a first bit from the first subset of bits and a second bit from the second subset of bits using a first inner error correction code; and
jointly decoding a third bit from the first subset of bits and a fourth bit from the second subset of bits using a second inner error correction code.

40. The method of claim 38, wherein the inner error correction code comprises a simplex code.

41. An apparatus for wireless communications at a first wireless device, comprising:
memory;
a transmitter; and
a communications manager, communicatively coupled to the memory and the transmitter, the communications manager configured to:
partition a set of information bits into a plurality of subsets of bits corresponding to a plurality of polarization levels based at least in part on one or more mutual information polarization functions that are representative of respective relationships between a coding rate of a channel and respective coding rates of the plurality of polarization levels, wherein, to partition the set of information bits, the communications manager is configured to:
allocate a first quantity of bits to a first subset of bits, wherein the first quantity of bits is determined based at least in part on a first coding rate determined using a first mutual information polarization function; and
allocate a second quantity of bits to a second subset of bits, wherein the second quantity of bits is determined based at least in part on a second coding rate determined using a second mutual information polarization function;
encode the first subset of bits for a first polarization level of the plurality of polarization levels according to a first channel coding scheme having a first coding rate;
encode the second subset of bits for a second polarization level of the plurality of polarization levels according to a second channel coding scheme having a second coding rate;
perform a polarizing transform using the encoded first subset of bits for the first polarization level and the encoded second subset of bits for the second polarization level to obtain a set of output bits corresponding to the set of information bits; and
transmit the set of output bits to a second wireless device.

42. The apparatus of claim 41, wherein the communications manager is further configured to:
jointly encode a third subset of bits of the plurality of subsets with the second subset of bits for a third polarization level of the plurality of polarization levels according to the second channel coding scheme, wherein the polarizing transform is performed using the encoded first subset of bits for the first polarization level, the encoded second subset of bits for the second polarization level, and the encoded third subset of bits for the third polarization level.

43. The apparatus of claim 41, wherein the communications manager is further configured to:
partition the set of information bits into the plurality of subsets of bits based at least in part on a quantity of coding levels associated with one or more encoding procedures for the set of information bits, wherein a quantity of the plurality of subsets of bits is equal to the quantity of coding levels.

44. The apparatus of claim 43, wherein the communications manager configured to perform the polarizing transform comprises the communications manager configured to:
perform the polarizing transform for a plurality of encoded subsets of bits corresponding to a plurality of channels based at least in part on a quantity of polarization levels for the polarizing transform, wherein a quantity of the plurality of encoded subsets of bits is equal to the quantity of polarization levels for the polarizing transform.

45. The apparatus of claim 43, wherein the communications manager is further configured to:
determine a first subset of coding levels associated with the first channel coding scheme; and
determine a second subset of coding levels associated with the second channel coding scheme, wherein the first subset of bits and the second subset of bits are encoded based at least in part on the first subset of coding levels and the second subset of coding levels.

46. The apparatus of claim 45, wherein:
the first subset of coding levels is associated with the first channel coding scheme based at least in part on a channel reliability of the first polarization level; and
the second subset of coding levels is associated with the second channel coding scheme based at least in part on a channel reliability of the second polarization level.

47. The apparatus of claim 46, wherein the first channel coding scheme is different from the second channel coding scheme.

48. The apparatus of claim 47, wherein the first channel coding scheme comprises a low-density parity check coding scheme.

49. The apparatus of claim 43, wherein the communications manager is further configured to:
perform a first cyclic redundancy check procedure using the first subset of bits; and
perform a second cyclic redundancy check procedure using the second subset of bits.

50. The apparatus of claim 41, wherein the communications manager is further configured to:
select the first coding rate for the first channel coding scheme based at least in part on an effective coding rate associated with one or more encoding procedures for the set of information bits and the first mutual information polarization function; and
select the second coding rate for the second channel coding scheme based at least in part on the effective coding rate and the second mutual information polarization function, wherein the first coding rate is different from the second coding rate.

51. An apparatus for wireless communications at a first wireless device, comprising:
memory;
a receiver; and
a communications manager, communicatively coupled to the memory and the receiver, the communications manager configured to:
receive an encoded set of bits corresponding to a set of information bits;
perform a depolarizing transform using the encoded set of bits to obtain a plurality of subsets of bits corresponding to a plurality of polarization levels, the plurality of subsets of bits comprising at least a first subset of bits and a second subset of bits,
wherein a first quantity of information bits allocated to the first subset of bits is determined based at least in part on a first coding rate determined using a first mutual information polarization function, wherein a second quantity of information bits allocated to the second subset of bits is determined based at least in part on a second coding rate determined using a second mutual information polarization function, and wherein the first mutual information polarization function and the second mutual information polarization function are representative of respective relationships between a coding rate of a channel and respective coding rates of the plurality of polarization levels;
decode the first subset of bits of the plurality of subsets for a first polarization level of the plurality of polarization levels according to a first channel decoding scheme having a first coding rate;
decode the second subset of bits of the plurality of subsets for a second polarization level of the plurality of polarization levels according to a second channel decoding scheme having a second coding rate; and
process the decoded first subset of bits and the decoded second subset of bits to obtain a set of decoded bits corresponding to the set of information bits.

52. The apparatus of claim 51, wherein the communications manager is further configured to:
jointly decode a third subset of bits of the plurality of subsets with the second subset of bits for a third polarization level of the plurality of polarization levels according to the second channel decoding scheme.

53. The apparatus of claim 51, wherein:
the plurality of subsets of bits is based at least in part on a quantity of coding levels associated with one or more decoding procedures for the set of information bits; and
a quantity of the plurality of subsets of bits is equal to the quantity of coding levels.

54. The apparatus of claim 53, wherein the communications manager configured to perform the depolarizing transform comprises the communications manager configured to:
perform the depolarizing transform for a plurality of encoded subsets of bits corresponding to a plurality of channels based at least in part on a quantity of polarization levels for the depolarizing transform, wherein a quantity of the plurality of encoded subsets of bits is equal to the quantity of polarization levels for the depolarizing transform.

55. The apparatus of claim 53, wherein the communications manager is further configured to:
determine a first subset of coding levels associated with the first channel decoding scheme; and
determine a second subset of coding levels associated with the second channel decoding scheme, wherein the first subset of bits and the second subset of bits are decoded based at least in part on the first subset of coding levels and the second subset of coding levels.

56. The apparatus of claim 55, wherein:
the first subset of coding levels is associated with the first channel decoding scheme based at least in part on a channel reliability of the first polarization level; and the second subset of coding levels is associated with the second channel decoding scheme based at least in part on a channel reliability of the second polarization level.

57. The apparatus of claim 56, wherein the first channel decoding scheme is different from the second channel decoding scheme.

58. The apparatus of claim 57, wherein the first channel decoding scheme comprises a low-density parity check coding scheme.

59. The apparatus of claim 53, wherein the communications manager is further configured to:
perform a first cyclic redundancy check procedure using the first subset of bits; and
perform a second cyclic redundancy check procedure using the second subset of bits.

60. The apparatus of claim 51, wherein the communications manager is further configured to:
select the first coding rate for the first channel decoding scheme based at least in part on an effective coding rate associated with one or more encoding procedures for the set of information bits and the first mutual information polarization function; and
select the second coding rate for the second channel decoding scheme based at least in part on the effective coding rate and the second mutual information polarization function, wherein the first coding rate is different from the second coding rate.

* * * * *